United States Patent
Khatibzadeh et al.

(10) Patent No.: US 10,263,146 B2
(45) Date of Patent: *Apr. 16, 2019

(54) ULTRA-WIDEBAND, FREE SPACE OPTICAL COMMUNICATION APPARATUS

(71) Applicant: LUMEOVA, INC., Raleigh, NC (US)

(72) Inventors: Mohammad Ali Khatibzadeh, Raleigh, NC (US); Arunesh Goswami, Raleigh, NC (US)

(73) Assignee: LUMEOVA, INC., Raleigh, NC (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/862,959

(22) Filed: Jan. 5, 2018

(65) Prior Publication Data
US 2018/0227055 A1 Aug. 9, 2018

Related U.S. Application Data

(63) Continuation of application No. PCT/US2017/016916, filed on Feb. 8, 2017.
(Continued)

(51) Int. Cl.
*H04B 10/00* (2013.01)
*H01L 33/14* (2010.01)
(Continued)

(52) U.S. Cl.
CPC ............ *H01L 33/14* (2013.01); *H01L 31/167* (2013.01); *H01L 33/0025* (2013.01);
(Continued)

(58) Field of Classification Search
CPC .............. H04B 10/116; H04B 10/1143; H04B 10/1149; H04B 10/40; H01L 33/06;
(Continued)

(56) References Cited

U.S. PATENT DOCUMENTS 4,049,994 A * 9/1977 Ladany ............... H01L 33/0025
257/609
4,054,794 A 10/1977 Laughlin et al.
(Continued)

FOREIGN PATENT DOCUMENTS

KR 20020019796 A 3/2002
WO 2012153940 A1 11/2012

OTHER PUBLICATIONS

PCT, International Search Report and Written Opinion for International Patent Application No. PCT/US2017/016918 dated May 25, 2017.
(Continued)

*Primary Examiner* — Hanh Phan
(74) *Attorney, Agent, or Firm* — NK Patent Law

(57) ABSTRACT

Devices, systems, and methods for providing wireless personal area networks (PANs) and local area networks (LANs) using visible and near-visible optical spectrum. Various constructions and material selections are provided herein. According to one embodiment, a free space optical (FSO) communication apparatus includes a digital data port, an array of light-emitting diodes (LEDs) each configured to have a transient response time of less than 500 picoseconds (ps), and current drive circuitry coupled between the digital data port and the array of LEDs.

24 Claims, 69 Drawing Sheets

Related U.S. Application Data

(60) Provisional application No. 62/293,291, filed on Feb. 9, 2016.

(51) Int. Cl.

| | | |
|---|---|---|
| *H01L 33/04* | (2010.01) | |
| *H01L 33/30* | (2010.01) | |
| *H04B 10/11* | (2013.01) | |
| *H01L 33/06* | (2010.01) | |
| *H04B 10/114* | (2013.01) | |
| *H04B 10/116* | (2013.01) | |
| *H01L 33/00* | (2010.01) | |
| *H04B 10/40* | (2013.01) | |
| *H04B 10/50* | (2013.01) | |
| *H04B 10/60* | (2013.01) | |
| *H01L 31/167* | (2006.01) | |
| *H01L 25/16* | (2006.01) | |
| *H01L 33/28* | (2010.01) | |
| *H04H 20/71* | (2008.01) | |
| *H01L 27/15* | (2006.01) | |

(52) U.S. Cl.
CPC .............. *H01L 33/04* (2013.01); *H01L 33/06* (2013.01); *H01L 33/145* (2013.01); *H01L 33/30* (2013.01); *H04B 10/11* (2013.01); *H04B 10/116* (2013.01); *H04B 10/1143* (2013.01); *H04B 10/1149* (2013.01); *H04B 10/40* (2013.01); *H04B 10/502* (2013.01); *H04B 10/60* (2013.01); *H01L 25/167* (2013.01); *H01L 27/156* (2013.01); *H01L 33/28* (2013.01); *H04H 20/71* (2013.01)

(58) Field of Classification Search
CPC ....... H01L 33/28; H01L 33/30; H01L 33/145; H01L 33/04
USPC ......... 398/172, 11, 119, 127, 128, 130, 135, 398/136, 137, 138, 139, 158, 159, 192, 398/193, 194, 183, 140, 118; 257/96, 97, 257/98, 22, 18, 15
See application file for complete search history.

(56) References Cited

U.S. PATENT DOCUMENTS

| | | | |
|---|---|---|---|
| 4,512,022 A | 4/1985 | Tsang | |
| 5,274,584 A | 12/1993 | Henderson et al. | |
| 5,502,316 A | 3/1996 | Kish et al. | |
| 5,764,668 A | 6/1998 | Ishizaka et al. | |
| 6,046,464 A * | 4/2000 | Schetzina | H01L 29/205 257/190 |
| 6,476,411 B1 * | 11/2002 | Ohno | B82Y 20/00 257/15 |
| 6,525,335 B1 | 2/2003 | Krames et al. | |
| 7,277,644 B2 * | 10/2007 | Johnson | H03M 13/1515 398/118 |
| 7,860,398 B2 * | 12/2010 | Tatum | G02B 6/4201 398/139 |
| 2003/0085409 A1 | 5/2003 | Shen et al. | |
| 2007/0158659 A1 | 7/2007 | Bensce | |
| 2008/0192319 A1 | 8/2008 | Miyatake et al. | |
| 2009/0121250 A1 | 5/2009 | DenBaars et al. | |
| 2010/0026416 A1 * | 2/2010 | Ryou | H01P 5/16 333/125 |
| 2010/0176375 A1 | 7/2010 | Lochtefeld | |
| 2012/0122394 A1 | 5/2012 | Bratkovski et al. | |
| 2013/0134390 A1 | 5/2013 | Aihara | |
| 2013/0236183 A1 | 9/2013 | Chao et al. | |
| 2013/0243024 A1 | 9/2013 | Hara | |
| 2013/0248819 A1 | 9/2013 | Aihara | |
| 2015/0256261 A1 * | 9/2015 | Ho | G02B 6/43 398/139 |
| 2017/0200865 A1 | 7/2017 | Brummer et al. | |
| 2018/0122978 A1 * | 5/2018 | Khatibzadeh | H01L 33/14 |
| 2018/0145209 A1 * | 5/2018 | Khatibzadeh | H01L 33/06 |
| 2018/0151774 A1 * | 5/2018 | Khatibzadeh | H01L 33/06 |

OTHER PUBLICATIONS

USPTO, Non-Final Rejection in U.S. Appl. No. 15/858,944 dated Mar. 12, 2018.
USPTO, Non-Final Rejection in U.S. Appl. No. 15/858,925 dated Apr. 4, 2018.
PCT, International Preliminary Report on Patentability for PCT/US2017016916, dated Aug. 14, 2018.
USPTO, Final Rejection for U.S. Appl. No. 15/858,925, dated Aug. 9, 2018.
USPTO, Non-Final Rejection in U.S. Appl. No. 15/858,887 dated Aug. 23, 2018.
USPTO, Non-Final Rejection in U.S. Appl. No. 15/858,905 dated Jul. 27, 2018.

* cited by examiner

600

800

900

1900

2300

3200

3300

3500

4900

5000

6000

6300

6600

ULTRA-WIDEBAND, FREE SPACE OPTICAL COMMUNICATION APPARATUS

CROSS REFERENCE TO RELATED APPLICATION

This application is a continuation of PCT Patent Application No. PCT/US2017/016916 entitled "ULTRA-WIDEBAND, WIRELESS OPTICAL HIGH SPEED COMMUNICATION DEVICES AND SYSTEMS," which was filed on Feb. 8, 2017, which claims benefit of and priority to U.S. Provisional Patent Application No. 62/293,291 entitled "ULTRA-WIDEBAND, WIRELESS OPTICAL HIGH SPEED COMMUNICATION DEVICES AND SYSTEMS," which was filed on Feb. 9, 2016, the contents of both of which are incorporated by reference herein.

TECHNICAL FIELD

This disclosure relates to free-space optical (FSO) communication. More specifically, the disclosure relates to devices, systems, and methods for providing wireless high speed communication within personal area networks (PANs) and local area networks (LANs) using visible and near visible spectrum light emitting diodes (LEDs) and optical detectors.

BACKGROUND

Mobile devices equipped with high-resolution cameras and displays are capable of capturing large volumes of multimedia content that can be stored locally on the mobile device. However, transferring and sharing of such content real-time among devices and servers require short-range connectivity modems capable of delivering speeds of 20 gigabits per second (Gbps) or higher. The dilemma for the mobile industry is that the capability of radio technologies for wireless modems such as Wireless Local Area Network (WLAN) are not keeping up with the exponential growth of multimedia content capabilities of mobile devices.

Without compression of the multimedia content, wired connectivity via cables is the only way to transfer the large amount of data among devices or between a device and the cloud. Currently the wired cable High-Definition Multimedia Interface (HDMI) 2.0b specification provides up to 18 Gbps of bandwidth and will support 4K Ultra High Definition (UHD) at 3480×2160 pixels per frame and 60 frames per second (fps) of video content. The upcoming HDMI 2.1 specification will provide up to 48 Gbps of bandwidth and will support 8K UHD at 7680×4320 pixels and 60 fps of video content. The HDMI 2.1 specification will also provide support for 4K UHD at 120 fps.

High throughput WLAN IEEE standards, such as 802.11ac and 802.11ad, have been introduced to increase WLAN throughput. However, these standards are still no adequate to meet the throughput demands of uncompressed 4K and 8 k UHD. IEEE 802.11ac has a maximum theoretical transfer rate 1.3 Gbps. IEEE 802.11ac Wave 2 has a maximum theoretical transfer rate 2.34 Gbps. IEEE 802.11ad has a maximum theoretical transfer rate of 7 Gbps. These current standards will not support uncompressed 4K and 8K UHD video transfer. Lossy compression such as h.264 or h.265 is typically used to reduce the needed bit rate.

The data throughput of radio transceivers is inherently limited by the availability of commercial radio spectrum and their limited tuning range. For example, in IEEE802.11ac standard, the channel bandwidths are specified at either 80 MHz or 160 MHz in the 5 GHz ISM band. With channel bonding, WLAN 802.11ac transceivers have been operated at speeds of 866 Mbps. A single user operating at such speeds will use up the entire bandwidth of the local network! The next-generation of 802.11ac utilizes Mu-MIMO feature (Multi-user, Multi-Input, Multi-Output) using smart antenna technology to focus dedicated radio beams on individual users thereby increasing total bandwidth through spatial diversity. Mu-MIMO is expected to deliver up to 1.7 Gbps using a 4×4 MIMO configuration.

The IEEE802.11ad standard (WiGig™) takes advantage of higher spectrum availability in the 57-64 GHz band (V-band). With about 7 GHz spectrum available, speeds of 5 Gbps have been demonstrated and potential speeds of 7 Gbps using multi-carrier OFDM modulation are being pursued. Millimeter-wave radio transceivers have significant complexity and cost associated therewith and suffer from multi-path and other channel impairments in an indoor operation. Additionally, due to excessive atmospheric absorption at V-band, the transmission range of WLAN 802.11ad modems is limited between 2 and 3 meters even with complex antenna beam forming feature. While 802.11ad modems are being introduced to market, the industry is continuously looking for higher bandwidth wireless modems for next-generation devices.

Transmission in the optical region of the spectrum offers distinct advantages over radio waves for wireless communications. The much higher carrier frequency in the optical range enables much higher modulation bandwidth. Atmospheric absorption in the optical region between infrared (IR) and ultraviolet (UV) can be much lower than that in the mm-wave and Terahertz (THz) frequencies depending on the choice of optical wavelengths. This improves the communication range of optical wireless modem and reduces power consumption of the transmitter. Available transmit source power from microwave and mm-wave solid-state devices declines with increasing carrier frequency as $1/f^2$. Even with recent developments in GaN power transistor technology, achieving power level of 1 W at the Terahertz frequencies in high volume is not practical. Wireless 802.11ad modems are designed to operate at a range of 2 to 3 meters with 10 mW transmitted power level in the V-band using CMOS and SiGe BiCMOS power amplifiers. In the future, even if additional radio spectrum is made available at higher frequency bands (e.g. Terahertz bands), radio modems face increasing atmospheric attenuation and lower available transmit power. In contrast, due to recent developments in GaN and GaAs based LED and laser technologies, optical power levels have been steadily increasing. CREE has demonstrated GaN LEDs with 300 lumens optical output power per watt of dissipated power. Single-die LED arrays with 18,000 lumens are commercially available today. Unlike radio communication, optical wireless links do not require licenses to operate in the visible or nearly-visible spectrum enabling OEMs to get products faster to market.

While lasers can be used as optical sources for the transceiver module disclosed, lasers require precise line-of-sight alignment with the detector, which is not practical for mobile devices in typical consumer use-cases. Defocusing of lasers can increase projection angle for the transmitter, but it requires expensive optics, packaging and assembly processes. LEDs, on the other hand, can operate over a wide projection angles and can be operated in a point-to-multipoint network configuration (e.g. wireless optical network in a room).

Multi-color LEDs can be employed at relatively low cost to create wavelength diversity in the optical link, thereby multiplying the data throughput of the link. Disclosed herein are multi-wavelength LEDs to demonstrate full-duplex (simultaneous uplink and downlink) optical communication. Multi-wavelength LED transmitters also offer the option of wavelength modulation which provides more immunity to ambient interferences and a more robust link. TABLE 1 summarizes the commercially available LED technologies, their associated wavelength, built-in voltage and the semiconductor materials on which they are fabricated.

TABLE 1

| Color | Wavelength [nm] | Voltage [ΔV] | Semiconductor material |
|---|---|---|---|
| Infrared | $\lambda > 760$ | $\Delta V < 1.63$ | GaAs, AlGaAs |
| Red | $610 < \lambda < 760$ | $1.63 < \Delta V < 2.03$ | AlGaAs, GaAsP, AlGaInP, GaP |
| Orange | $590 < \lambda < 610$ | $2.03 < \Delta V < 2.10$ | GaAsP, AlGaInP, GaP |
| Yellow | $570 < \lambda < 590$ | $2.10 < \Delta V < 2.18$ | GaAsP, AlGaInP, GaP |
| Green | $500 < \lambda < 570$ | $1.9 < \Delta V < 4.0$ | GaP, AlGaInP, AlGaP, InGaN/GaN |
| Blue | $450 < \lambda < 500$ | $2.48 < \Delta V < 3.7$ | ZnSe, InGaN on SiC substrate |
| Violet | $400 < \lambda < 450$ | $2.76 < \Delta V < 4.0$ | InGaN on SiC substrate |
| Ultraviolet | $\lambda < 400$ | $3.1 < \Delta V < 4.4$ | Diamond (235 nm), AlGaN, AlN (210 nm) |
| White | Broad spectrum | $\Delta V = 3.5$ | Blue/UV diode with yellow phosphorous |

Another important design factor for achieving high speed optical transmitters and receivers is how individual LEDs and detectors are scaled to achieve the desired signal levels. Bright LEDs are manufactured today in the form of arrays of smaller LEDs on a single for thermal management reasons. A typical LED chip can consist of 8×8 or 16×16 LED arrays. In today's LED bulbs, these arrays of micro-LEDs are powered together to achieve the desired brightness. The individual micro-LEDs in the array can be independently driven as individual transmitters to form MIMO (multi-input, multi-output) spatial diversity for the link, which further increase data throughput. MIMO is often used in radio wireless transceivers to deal with multi-path interference and fading in the channel. However, MIMO technique requires much higher complexity at the transmitter and receiver (CCD or CMOS photo sensor) thereby considerably increasing the cost of the system.

The micro-LEDs in today's LED arrays are designed for static Direct Current (DC) operation and are not suitable for high-frequency operation. Typical dimensions of a micro-LED and detectors may be on the order of 50-100 μm on a side. At these dimensions, the resistive capacitive (RC) time constant of the device is too high and uniform AC operation of the entire diode active area cannot be achieved due to spreading resistance of the anode and cathode contacts.

The substrates of choice for most high-volume LEDs are either GaAs or SiC. Both material technologies lend themselves well for microwave and ultra high-speed circuit implementations due to their semi-insulating characteristics. In fact, GaAs and SiC/GaN materials today form the backbone of microwave and millimeter-wave IC's for commercial and military applications. Global Communications Semiconductor (GCS) Incorporated offers commercially available GaAs and SiC/GaN based LED processes for product implementations.

Ultra High-Speed, Short-Range Connectivity for Mobile Devices

According to International Data Corporation (IDC), Worldwide Quarterly Mobile Phone Tracker, worldwide smart phone shipments was estimated at 1.2 B units in 2014 and expected to reach 1.8 B units in 2018, resulting in a 12.3% compounded annual growth rate (CAGR) from 2013-2018. IDC also reports 245M units of tablet shipments in 2014. The majority of these phones and tablets will be equipped with high-resolution displays and cameras and can be potential candidates for ultra-high-speed, wireless optical links. In addition to smart phone and tablets, other mobile devices such as high-resolution digital cameras and camcorders, notebook computers and portable disk drives currently using USB (Universal Serial Bus) as well as fixed devices such digital TV's, projectors. Additional development of wireless optical dongles capable of replacing USB3 data and HDMI2.0 (4K) video cables may be provided. Wireless optical modules for embedded applications in a wide range of electronic devices such as but not limited to a smart watch, a smart phone, a tablet, a laptop, a digital camera, a digital camcorder, a computer monitor, a TV, a projector, and a wireless access point may be provided. The overall addressable market size for ultra-wideband wireless optical transceivers can be well in excess of 2 B units by 2018. The adoption and attach rate of wireless optical transceivers to mobile devices should follow similar trend as WLAN modems integration into mobile devices. Based on preliminary analysis, the cost of the wireless, optical transceiver will be less than 802.11ad mm-Wave radio modems while its performance will be significantly higher.

Indoor Wireless Networking for Home and Enterprise Applications

There is growing interest in using LEDs for in-building wireless networking and location-based services. The LiFi™ Consortium was established November 2011 to enable Giga-speed visible light communication (VLC) applications. The Infrared Data Association (IrDA) (www.irda.org) also announced in 2011 working groups for the standardization of 5 Gbps and 10 Gbps IrDA using IR sources while such products have not reached the market yet.

There is an active worldwide effort to develop standards for VLC. The IEEE802.15.7 WPAN (Wireless Personal Area Network) Task Group 7 has completed MAC and PHY layers specifications for VLC. The Japan Electronics and Information Technology Industries Association has released the JEITA CP-1221 standard for VLC systems. While the standardization activities have focused on the physical layer and application layer of VLC systems, the fundamental speed limitations of VLC transceivers remains the main, stumbling block to the realization of practical, ultra-speed VLC transceiver.

There is also growing interest in using VLC for indoor enterprise applications. Philips has announced the Shopping Assistant application using LED-based communication with mobile devices. In this application, the consumer can download information about each product as they browse the store.

Smart Lighting for Automotive Transportation

Another potential market for LED-based VLCs is the automotive transportation market. LED lighting due to their superior brightness and power consumption is becoming the technology of choice for automobile headlights, taillights, streetlights and traffic signaling. Smart LED array technology offers auto manufacturers the ability to incorporate new functionality in the external and internal lighting of next-generation automobiles. VLC offers auto manufacturers potential of auto-to-auto, and auto-to-streetlight and auto-to-traffic light communications. This generates enormous potential for new applications in auto transportation. For example, auto-to-street headlight VLC can enable in-car wireless hot spots that can be used to access the Internet. Also, traffic lights can warn incoming cars about cross-section traffic and improve safety. Cars facing obstacles can warn several cars behind them to slow down and avoid potential accidents.

Another arena for WOC is the application of ultra-high-speed LED transceivers for 100 Gbps Ethernet backplanes for data center applications. With the enormous growth of cloud-based services and computing driven by social multimedia, the cost and power consumption of 100 Gbpes Ethernet connections is becoming a major concern. Today's Ethernet cards employ copper connectivity using 10 Gbase-T transceivers, which incur significant power consumption to drive copper cables at 10 Gbps over distances of several meters. Ultra-high-speed LED transceivers combined with low-cost multi-mode fibers can significantly reduce the power consumption of Ethernet links in this application.

There are other applications of optical wireless applications such as secure communications for mobile financial transactions but there is growing adoption of Near Field Communications (NFC) technology in mobile devices. Ultra-high-speed, wireless optical communication has military applications as well. For examples, reconnaissance Unmanned Air Systems (UAS) (or drones) acquire large amounts of imagery data and sensor information, which are downloaded directly to ground or through satellite via radio links. The radio links have bandwidth limitations and subject to interference and eavesdropping. Optical wireless links can offer a more secure air-to-ground, ultra-high-speed link to down load UAS information to ground terminals. There has been demonstrated 1 Gbps video stream downlink from an aircraft moving at an altitude of 7 km and speed of 800 km/h. Lasers were used as the optical source with complex alignment mechanics for the laser and the ground-based terminal. The solutions disclosed herein can eliminate the need for complex line-of-sight alignment systems that are required for laser free-space optical systems. While this system is designed for specific military application, it has potential applications to the commercial UAS market and demonstrates the viability of ultra-wideband optical, wireless communication over large distances.

While the potential market for LED-based ultra-high-speed wireless communication is substantial, innovative approaches are required to develop and build ultra-high-speed LED transceivers. The "white" LED device design and optimization have been driven by the industry to achieve the lowest cost and power consumption for a target level of brightness. No considerations have been given to the switching speed of LEDs for communication applications. While attempts have been made to use off-the-shelf LEDs for wireless optical communications, such attempts have had little success due to intrinsic speed limitation of the micro-LEDs and detectors.

SUMMARY

Disclosed herein are devices, systems, and methods for providing wireless personal area networks (PANs) and local area networks (LANs) using visible and near-visible optical spectrum. Various constructions and material selections are provided herein.

According to one embodiment, a light-emitting diode (LED) includes a substrate, a carrier confinement (CC) region positioned over the substrate, and an active region position over the CC region. The CC region includes a first CC layer comprising indium gallium phosphide and a second CC layer position over the first CC layer. The second CC layer includes gallium arsenide phosphide. The active region is configured to have a transient response time of less than 500 picoseconds (ps)

The LED may have a quantum well structure or a multi quantum well structure. The active region may include indium gallium arsenide and may have an indium composition between 10% and 35%. The active region of the LED may have a thickness between 50 and 150 angstroms.

A first barrier layer may be positioned between the CC region and the active region. The first barrier layer may have a phosphorous composition between 25% and 80%. The first barrier layer may have a thickness between 25 and 75 angstroms A second barrier layer may be positioned over the active region. The second barrier layer may have a phosphorous composition between 40% and 50%. The second barrier layer may have a thickness between 30 and 40 angstroms.

The LED may include an n-type contact layer positioned between the substrate and the CC region; and a p-type contact layer positioned over the second barrier layer. The first CC layer may have an indium composition between 45% and 55%, and the second CC layer has a phosphorous composition between 25% and 80%. The first CC layer may have a thickness between 100 and 2000 angstroms and the second CC layer has a thickness between 25 and 75 angstroms.

The CC region may include a third CC layer positioned over the second CC layer. The third CC layer may include indium gallium phosphide. A fourth CC layer may be positioned over the third CC layer. The fourth CC layer may include gallium arsenide phosphide. The third CC layer may have an indium composition between 45% and 55%, and the fourth CC layer may have a phosphorous composition between 25% and 80

The CC region may include a fifth CC layer positioned over the fourth CC layer. The fifth CC layer may include indium gallium phosphide. A sixth CC layer may be positioned over the fifth CC layer. The sixth CC layer may include gallium arsenide phosphide.

In other embodiments, the third CC layer and the fifth CC layer may each have an indium composition between 45% and 55% and the fourth CC layer and the sixth CC layer each have a phosphorous composition between 25% and 80%.

In other embodiments the first CC layer, the second CC layer, the third CC layer, the fourth CC layer, the fifth CC layer, and the sixth CC layer each have a thickness between 25 and 150 angstroms.

The n-type contact layer and the p-type contact layer may each include gallium arsenide. The n-type contact layer may have a thickness between 5000 and 20000 angstroms and the p-type contact layer may have a thickness between 500 and 5000 angstroms.

According to another embodiment, a method of forming the LED includes providing an epitaxial structure on a substrate. The epitaxial structure includes a substrate, a carrier confinement (CC) region positioned over the substrate, and an active region position over the CC region. The CC region includes a first CC layer comprising indium gallium phosphide and a second CC layer position over the first CC layer. The second CC layer includes gallium arsenide phosphide. The active region is configured to have a transient response time of less than 500 picoseconds (ps).

According to another embodiment a free space optical (FSO) communication apparatus includes a digital data port and an array of LEDs. Each LED configured to have a transient response time of less than 500 ps, and current drive circuitry coupled between the digital data port and the array of LEDs.

The digital data port may include an audio/video interface. The audio/video interface may be configured for uncompressed video. The digital data port may be a High-Definition Multimedia Interface (HDMI) port, a DisplayPort interface port or a Digital Visual Interface (DVI) port. The digital data port may be a Universal Serial Bus (USB) port, a Serial ATA (SATA) interface port, or an Ethernet port. In other embodiments, the digital data port may be an optical data port. The digital data port may be a gigabit interface converter (GBIC) interface port, a small form-factor pluggable (SFP) interface port or a 10 Gigabit Small Form Factor Pluggable (XFP) interface port.

The FSO communication apparatus may include a Wilkinson power divider coupled between the digital data port and the current drive circuitry. In other embodiments, a traveling way array may be coupled between the digital data port and the current drive circuitry.

In other embodiments, each LED of the array of LEDs may include a substrate, a carrier confinement (CC) region positioned over the substrate, and an active region position over the CC region. The CC region may include a first CC layer comprising indium gallium phosphide and a second CC layer position over the first CC layer. The second CC layer may include gallium arsenide phosphide. Each LED may include an active region over the CC region;

In other embodiments, the FSO communication apparatus also includes an array of optical detectors, wherein each optical detector is configured to have a bandwidth of a least 10 gigahertz (GHz); and transimpedance amplifier circuitry coupled between the digital data port and the array of optical detectors.

The FSO communication apparatus may also include a Wilkinson power combiner coupled between the digital data port and the transimpedance amplifier circuitry. In other embodiments, the FSO communication apparatus may also include a travelling wave array coupled between the digital data port and the transimpedance amplifier circuitry.

The FSO communication apparatus may be implemented in at least one of a smart watch, a smart watch, a smart phone, a tablet, a laptop, a digital camera, a digital camcorder, a computer monitor, a TV, a projector, and a wireless access point.

According to another embodiment, an LED includes a substrate and a CC region positioned over the substrate. The CC region includes a first CC layer. The first CC layer includes aluminum gallium arsenide. The CC region includes a second CC layer positioned over the first CC layer. The second CC layer also includes aluminum gallium arsenide. The LED also includes an active region positioned over the CC region. The active region is configured to have a transient response time of less than 500 ps. The LED also includes an electron blocking layer (EBL) positioned over the active region. The EBL includes aluminum gallium arsenide.

The LED may have a quantum well structure or a multi quantum well structure. The active region may include gallium arsenide and may have a thickness between 50 and 150 angstroms. The LED may also include a first barrier layer positioned between the CC region and the active region; and a second barrier layer positioned over the active region. The first barrier layer has an aluminum composition between 25% and 45%. The first barrier layer may have a thickness between 25 and 75 angstroms. The LED may also include an n-type contact layer positioned between the substrate and the CC region, and a p-type contact layer positioned over the second barrier layer.

In other embodiments, the first and second CC layers may each have an aluminum composition between 25% and 45%. The first CC layer may have a thickness between 100 and 2000 angstroms, and the second CC layer may have a thickness between 25 and 75 angstroms. The EBL may have an aluminum composition between 25% and 45%, and may have a thickness between 100 and 2000 angstroms. The n-type contact layer and the p-type contact layer may each include gallium arsenide. The n-type contact layer may have a thickness between 5000 and 20000 angstroms, and the p-type contact layer may have a thickness between 500 and 5000 angstroms.

According to another embodiment, a method of forming an LED includes providing an epitaxial structure on a substrate. The epitaxial structure includes a CC region positioned over the substrate. The CC region includes a first CC layer comprising aluminum gallium arsenide and a second CC layer positioned over the first CC layer. The second CC layer also includes aluminum gallium arsenide. The epitaxial structure also includes an active region positioned over the CC region. The active region is configured to have a transient response time of less than 500 ps. The epitaxial structure also includes an electron blocking layer (EBL) positioned over the active region. The EBL includes aluminum gallium arsenide.

According to another embodiment, an LED includes a substrate and a CC region positioned over the substrate. The CC region includes a first CC layer. The first CC layer includes aluminum gallium nitride. The CC region includes a second CC layer positioned over the first CC layer. The second CC layer also includes aluminum gallium nitride. The LED includes an active region positioned over the CC region. The active region is configured to have a transient response time of less than 500 ps.

The active region may be configured as a quantum well structure or a multi quantum well structure. The active region may include indium gallium nitride and may have an indium composition between 0 and 45%. The active region may have a thickness between 50 and 150 angstroms. The LED may also include a first barrier layer positioned between the CC region and the active region; and a second barrier layer position over the active region. The first barrier layer may have aluminum composition between 0% and 45%, and may have a thickness between 25 and 75 angstroms. The LED may also include an n-type contact layer positioned between the substrate and the CC region, and a p-type contact layer positioned over the second barrier layer.

In other embodiments, the first and second CC layers may each have an aluminum composition between 10% and 45%. The first CC layer may have a thickness between 100 and 2000 angstroms and the second CC layer may have a thickness between 25 and 75 angstroms. The n-type contact layer and the p-type contact layer may each include gallium nitride. The n-type contact layer may have a thickness between 5000 and 20000 angstroms; and The p-type contact layer may have a thickness between 500 and 5000 angstroms.

According to another embodiment, a method of forming an LED includes providing an epitaxial structure on a substrate. The epitaxial structure includes a CC region positioned over the substrate. The CC region includes a first CC layer. The first CC layer includes aluminum gallium nitride. The CC region includes a second CC layer positioned over the first CC layer. The second CC layer also includes aluminum gallium nitride. The epitaxial structure includes an active region positioned over the CC region. The active region is configured to have a transient response time of less than 500 picoseconds (ps).

In another embodiment, an LED includes a substrate and a CC region positioned over the substrate. The CC region includes a first CC layer. The first CC layer includes aluminum gallium antimonide. The CC region also includes a second CC layer positioned over the first CC layer. The second CC layer also includes aluminum gallium antimonide. The LED includes an active region positioned over the CC region, the active region is configured to have a transient response time of less than 500 ps. The LED also includes an EBL positioned over the active region. The EBL includes aluminum gallium antimonide.

The active region may be configured as a quantum well structure or a multi quantum well structure. The active region comprises indium gallium antimonide and may have an indium composition between 10 and 45%. The active region may have a thickness between 50 and 150 angstroms. The LED may include a first barrier layer positioned between the CC region and the active region, and a second barrier layer positioned over the active region. The first barrier layer may have an aluminum composition between 20% and 45%, and may have a thickness between 25 and 75 angstroms. The LED may also include an n-type contact layer positioned between the substrate and the CC region, and a p-type contact layer positioned over the second barrier layer.

In other embodiments, the first and second CC layers may each have an aluminum composition between 10% and 45%. The first CC layer may have a thickness between 100 and 2000 angstroms and the second CC layer may have a thickness between 25 and 75 angstroms.

The EBL may have an aluminum composition between 10% and 45% and may have a thickness between 100 and 2000 angstroms. The n-type contact layer and the p-type contact layer each comprise gallium antimonide. The n-type contact layer may have a thickness between 5000 and 20000 angstroms, and the p-type contact layer may have a thickness between 500 and 5000 angstroms.

According to another embodiment, a method of forming a LED includes providing an epitaxial structure on a substrate. The epitaxial structure includes a CC region positioned over the substrate, the CC region defines a first CC layer comprising aluminum gallium antimonide; and a second CC layer positioned on the first CC layer. The second CC layer includes aluminum gallium antimonide. The epitaxial structure also includes an active region positioned over the CC region. The active region is configured to have a transient response time of less than 500 ps. The epitaxial structure also includes an EBL positioned over the active region. The EBL includes aluminum gallium antimonide.

BRIEF DESCRIPTION OF THE DRAWINGS

The present embodiments are illustrated by way of example and are not intended to be limited by the figures of the accompanying drawings. In the drawings.

DETAILED DESCRIPTION

Figure 1:
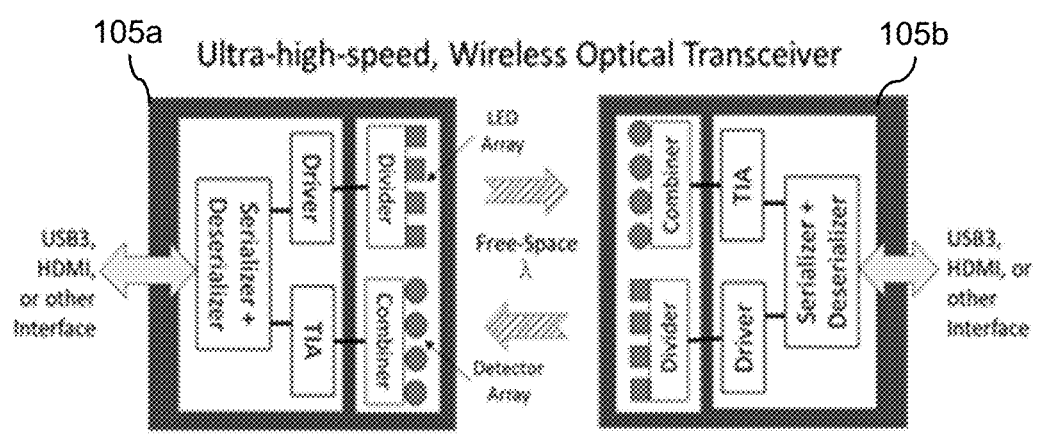
FIG. 1 depicts a block diagram illustrating an example of a communication link including two optical wireless transceiver modules.

The following description and drawings are illustrative and are not to be construed as limiting. Numerous specific details are described to provide a thorough understanding of the disclosure. However, in certain instances, well-known or conventional details are not described in order to avoid obscuring the description. References to "one embodiment" or "an embodiment" in the present disclosure can be, but not necessarily are, references to the same embodiment and such references mean at least one of the embodiments.

Reference in this specification to "one embodiment" or "an embodiment" means that a particular feature, structure, or characteristic described in connection with the embodiment is included in at least one embodiment of the disclosure. The appearances of the phrase "in one embodiment" in various places in the specification are not necessarily all referring to the same embodiment, nor are separate or alternative embodiments mutually exclusive of other embodiments. Moreover, various features are described which may be exhibited by some embodiments and not by others. Similarly, various requirements are described which may be requirements for some embodiments but not other embodiments.

The terms used in this specification generally have their ordinary meanings in the art, within the context of the disclosure, and in the specific context where each term is used. Certain terms that are used to describe the disclosure are discussed below, or elsewhere in the specification, to provide additional guidance to the practitioner regarding the description of the disclosure. For convenience, certain terms may be highlighted, for example using italics and/or quotation marks. The use of highlighting has no influence on the scope and meaning of a term; the scope and meaning of a term is the same, in the same context, whether or not it is highlighted. It will be appreciated that same thing can be said in more than one way.

Consequently, alternative language and synonyms may be used for any one or more of the terms discussed herein, nor is any special significance to be placed upon whether or not a term is elaborated or discussed herein. Synonyms for certain terms are provided. A recital of one or more synonyms does not exclude the use of other synonyms. The use of examples anywhere in this specification, including examples of any terms discussed herein, is illustrative only, and is not intended to further limit the scope and meaning of the disclosure or of any exemplified term. Likewise, the disclosure is not limited to various embodiments given in this specification.

Without intent to limit the scope of the disclosure, examples of instruments, apparatus, methods and their related results according to the embodiments of the present disclosure are given below. Note that titles or subtitles may be used in the examples for convenience of a reader, which in no way should limit the scope of the disclosure. Unless otherwise defined, all technical and scientific terms used herein have the same meaning as commonly understood by one of ordinary skill in the art to which this disclosure pertains. In the case of conflict, the present document, including definitions, will control.

Currently, LED devices on the market are developed for maximum brightness under static DC conditions. The actual device area or cell on the LEDs is optimized to conform to the thermal and reliability constraints under DC bias conditions. Once the cell has been optimized, then an array of such cells are connected in parallel to achieve target brightness. For example, each micro-LED element of an 8×8 LED array may have an active area of 100×100 micrometers ($\mu m^2$). At these dimensions, when a high-frequency signal is applied in conjunction with the DC bias to the micro-LED, the distributed RC effects (series contact resistance R, and shunt junction capacitance C) are too high causing a large inner portion of the diode area to remain inactive. In other words, while the entire diode area receives the DC bias voltage, the high-frequency AC signal is excessively attenuated as it travels to the center portion of the diode area. In effect, only the light from the peripheral region of LED is modulated at the desired signal frequency with large percentage of the diode not responding to modulation signal ("the blind spot"). As the frequency is increased, the modulated area of the LED becomes smaller thus reducing the high-frequency, utilization factor of the LED. For a 100×100 μm2 micro-LED, the high-frequency "blind spot" could reach 90% of the total LED area. Under these conditions, the "blind spot" acts as a large capacitor shunting the desired high frequency signal to ground without producing modulated light.

Another key factor limiting the switching speed of LEDs for communication applications are the intrinsic "spontaneous emission" and "recombination" rates. These rates determine how fast electron-hole pairs generate due to applied voltage can recombine in the LED to generate optical power. This limitation is a property of the material structure of the LED quantum well.

Embodiments of the present disclosure include devices, systems, and methods for providing personal area networks (PANs) and local area networks (LANs) using visible spectrum light emitting diodes (LEDs) and optical detectors.

Disclosed are novel LED/detector transceivers are described that are capable of transmitting and receiving data at greater than 20 Gbps. This may require: 1-Novel device layout and material structure for the micro-LED cell to achieve lowest RC time-constant without significant compromise in the conversion efficiency of the LED array. 2-Novel high-frequency splitting/combining circuits that can distribute the high-frequency signal among the micro-LED cells in an array to achieve in-phase operation of the entire LED array at the desired frequency.

Disclosed herein are ultra-wideband, wireless optical devices and transceivers capable of breaking wireless data barriers and delivering data speeds in excess of 20 Gbps for consumer electronics, communication infrastructure and defense electronics markets. Such speeds are far in excess of what is available on the market with radio modems and will significantly enhance communication among mobile devices. The disclosed transceivers incorporate novel Light-Emitting Diodes (LEDs) and photo-detectors driven by innovative high-frequency circuits to achieve the desired performance targets. Such structures may be implemented within a smart watch, a smart phone, a tablet, a laptop, a digital camera, a digital camcorder, a computer monitor, a TV, a projector, a wireless access point, or any device associated with the Internet of Things (IoT).

High Frequency Combining Circuits of Micro-LED and Detector Array

In order to achieve the total transmit power requirement for an optical wireless link, it is often necessary to combine several LEDs and operate them in unison. The same applies to the receiver side where the detector cells have to be combined to increase conversion gain required for the optical link budget. The electrical and optical combining of micro LED and detector cells at high frequencies pose unique challenges as signal traces interact with the internal device capacitances and resistances to cause phase shifts among micro LEDs in an array. This causes the micro LEDs (and detectors) to not operate in phase thereby distorting the transmitted signal. Therefore, circuit-level combining techniques have to be employed to ensure the combined LED transmitter or detector receiver arrays can operate at very high bandwidths (switching frequencies) while maintain signal integrity. Improper combining of the LED cells in an array can cause the electrical-to-optical conversion efficiency to drop rapidly at high frequencies limiting the operation bandwidth of the transmitter. Disclosed herein are novel combining circuits for the LED and detector arrays to scale the LED optical power and detector sensitivity while achieving ultra-wideband operation frequency. Special design considerations are given to the design of DC bias circuitry to ensure minimal impact on the high-frequency operation of LEDs. The combining and dividing circuit are implemented on the LED/detector semi-insulating substrate to achieve best performance and low assembly cost.

FIG. 1 illustrates a block diagram 100 of two optical transceivers 105a and 105b in a wireless link. In this configuration, both optical transceivers 105a and 105b operate on the same wavelength in a time-division, half-duplex mode (i.e. one side is in the transmit-only mode while the other side is in the receive-only mode). Full-duplex communication with this approach is very difficult due to the receiver being blinded by its own transmitter signal. Half-duplex links is sufficient for most consumer electronic communication applications as rarely, full-duplex (i.e. simultaneous and bi-directional) communication at high-speed is required. Most often, data is transferred at high speeds from one device to another.

While serial communication standards such as USB3 and HDMI have bi-directional modes, they can be mapped over a serial link in a time-division half-duplex mode similar to the IrDA (Infrared Data Association) standard. The primary transceiver controls the timing of the link while the secondary transceiver is in the receive mode. Bi-directional communication is achieved by switching the primary and secondary roles of the transceiver during the communication. In the implementation of FIG. 1, the LED and Detector devices can reside on the same chip (substrate) or two different chips depending on the level of receiver sensitivity required. For short-range communication where high level of detector sensitivity is not required, the LED and detector functions can be integrated on the same chip. For longer range communication and enhanced receiver sensitivity, the detector may be on a separate chip whose material structure is optimized for the detector.

Figure 2:
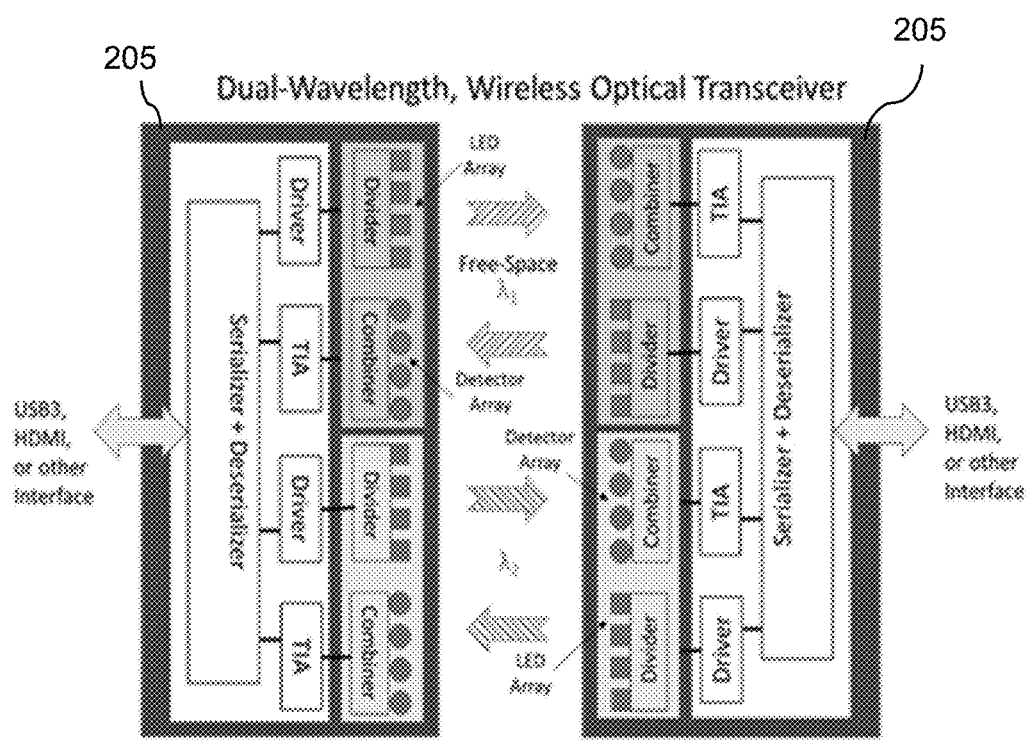
FIG. 2 depicts a block diagram of the communication link with two dual-wavelength, optical wireless transceiver modules.

The optical transceivers 105a and 105b of FIG. 1 can also employ wavelength diversity, (i.e. communication over multiple wavelengths). FIG. 2 illustrates a block diagram 200 of optical transceivers 205a and 205b employing a two-wavelength optical receiver implementation. In this implementation, two LED/detector pairs operate simultaneously at two different wavelengths. This configuration offers two distinct advantages: First, the effective communication data rate can be doubled relative to the single-wavelength case by transmitting two simultaneous data streams from the transmitting module to the receiving module at two separate wavelengths. Second, full-duplex, wireless communication can be achieved by having both modules simultaneously transmit on one channel and receive on the second channel. While this approach may require more components, it is a more robust solution which allows for full-duplex operation of the link effectively doubling the communication speed. Disclosed herein are innovative devices capable of transmitting and receiving multi-wavelength wireless optical signals at very high speeds.

Figure 3:
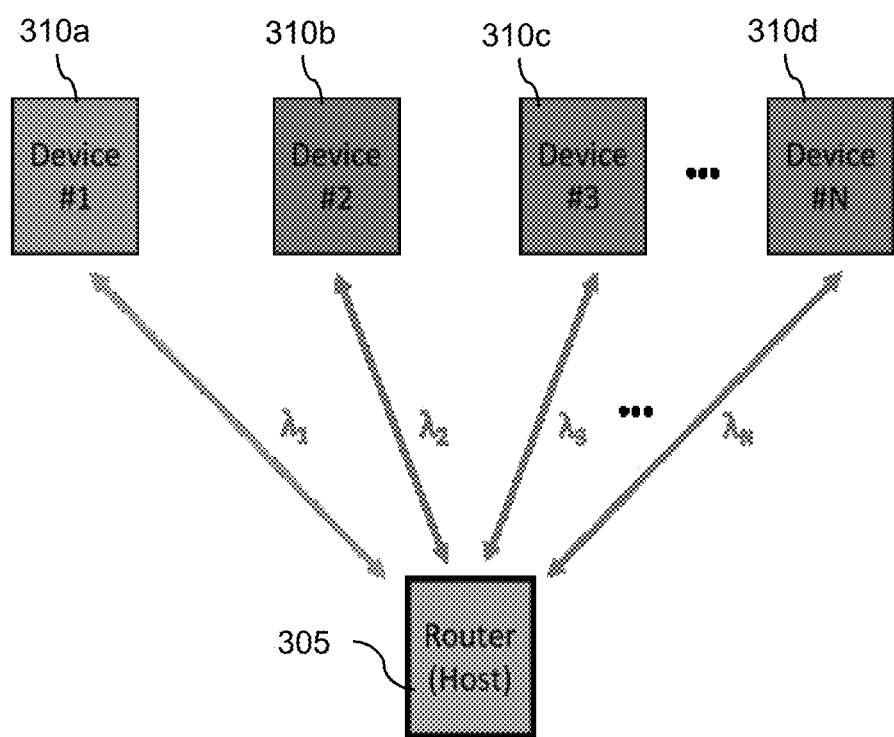
FIG. 3 depicts a Point-to-Multipoint, networked operation of wireless optical transceivers using multiple-wavelengths.

The wavelength diversity in this product implementation can be extended further to N wavelengths (i.e. one wavelength per channel). FIG. 3 depicts a point-to-multipoint, networked diagram 300 of wireless optical transceivers 310a-310d using multiple-wavelengths. Each channel can be utilized to communicate an independent data stream. This configuration enables point-to-multipoint and peer-to-peer communication among a number of devices. Such devices 310a-310d may each be one of a smart watch, a smart phone, a tablet, a laptop, a digital camera, a digital camcorder, a computer monitor, a TV, a projector, and/or a wireless access point.

In order to split and combine the signals from LEDs and detectors efficiently at very high frequencies, and in-phase approach and a travelling wave approach disclosed.

LED and Detector Arrays with in-Phase Signal Divider and Combiners

Figure 4:
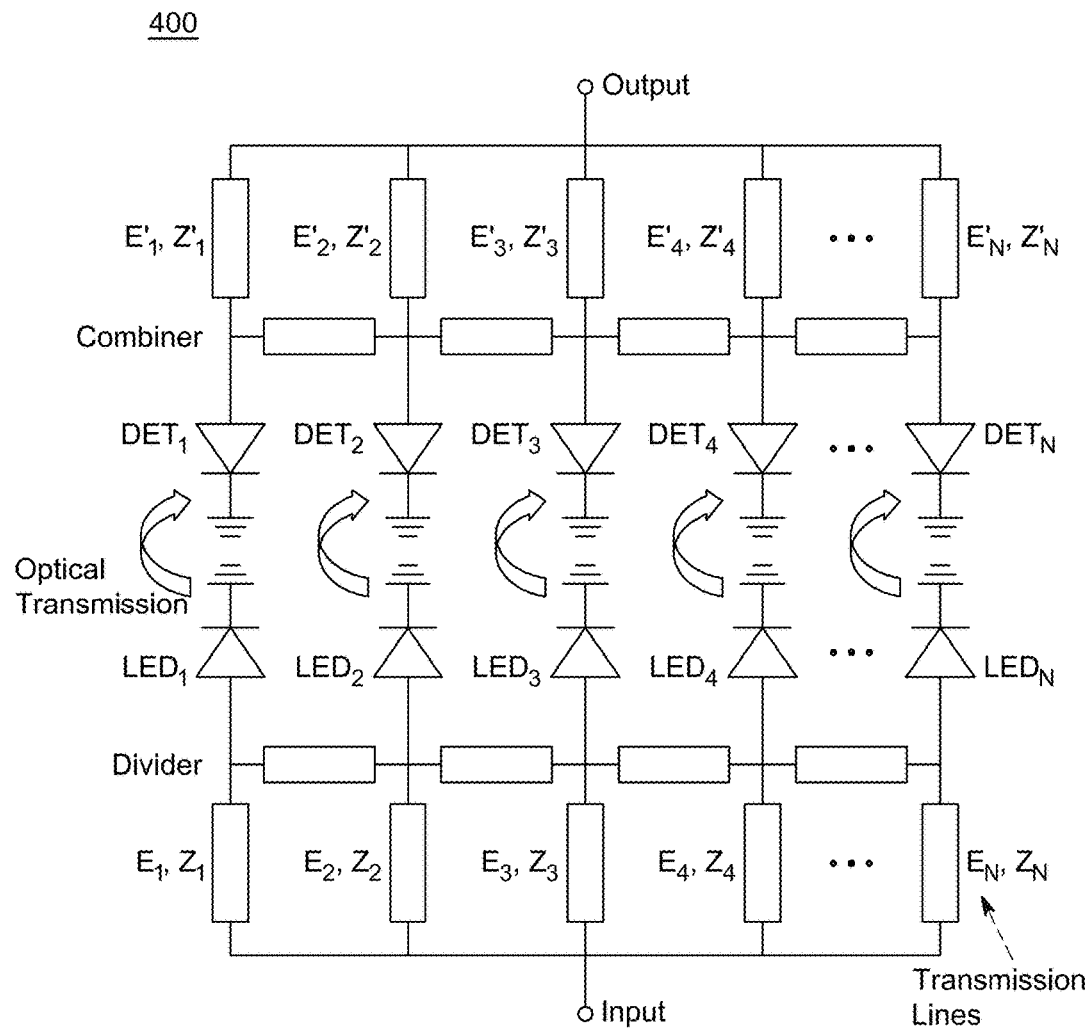
FIG. 4 depicts a schematic of the disclosed "In-Phase Optical LED & Detector Arrays" for ultra-wideband wireless optical applications.

FIG. 4 illustrates an electrical schematic 400 of a wireless optical transceiver where the transmitter consist of an array of micro-LEDs driven by a Wilkinson in-phase dividing circuit including segments of transmission lines of certain characteristic impedance and electrical lengths. The length and impedance of each transmission line segment depends on the number of micro-LEDs in the circuit and can be optimized to achieve in-phase operation of the micro-LEDs over wide bandwidth. This approach constitutes a "single-stage" dividing circuit where the input impedance is transformed to the individual input impedance of each micro-LED. So, the dividing circuit serves as both impedance matching as well as signal dividing circuit.

Similarly, on the receiver side, the photo current from individual micro-detector cells are combined using in-phase networks which also serve as impedance matching networks to transform the detector impedance to that required by a trans-impedance amplifier (TIA). This approach can be expanded to multi-stage divider and combining circuits to further increase the electrical bandwidth of the overall transceiver. In this approach, more than one divider network shown in FIG. 4 will be used in cascade to step down the input impedance to the LED impedance in multiple steps with the added benefit of increased bandwidth.

In addition to in-phase dividers and combiners, micro-LEDs can be combined out-phase in an array and then combined in a conjugate phase manner on the receiver side. Referring again to FIG. 4, consider a 4-element array in which the LED1, LED2, LED3, and LED4 are driven at 0, 90, 180, and 270 phase angles (relative to LED1) and the opposing detectors (DET1, DET2, DET3 and DET4) are combined at 270, 180, 90, and 0 degrees. In this configuration, even though the individual LEDs are driven orthogonally out of phase, the output combining will add the signals from individual detectors in an orthogonal fashion to reconstitute the desired signal at the output.

Travelling Wave LED and Detector Arrays

Figure 5:
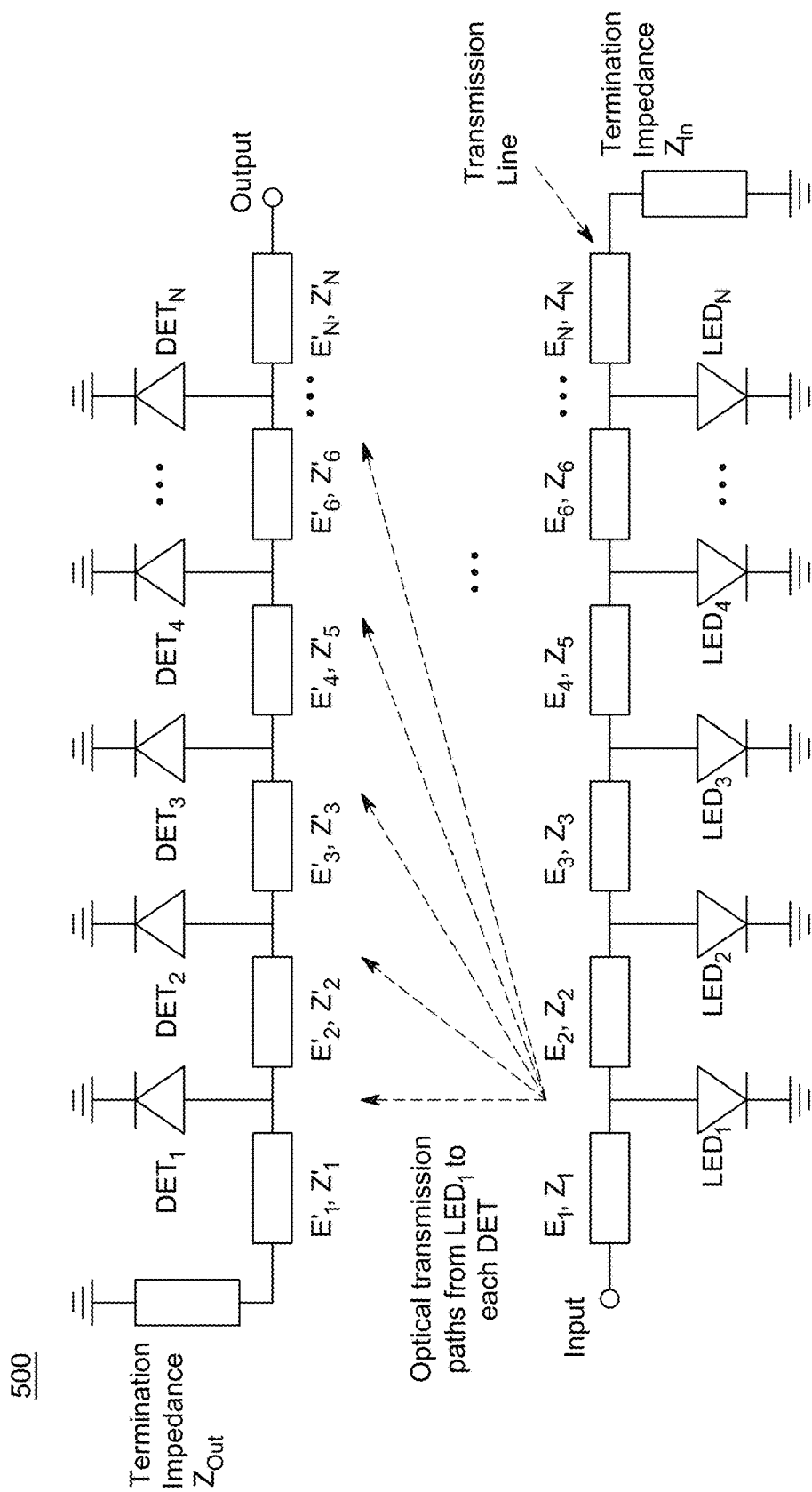
FIG. 5 depicts a schematic of a Travelling Wave LED and Detector Array, Wireless Optical Transceiver.

FIG. 5 illustrates a schematic 500 of a travelling wave LED and detector array, wireless optical transceiver. This approach discloses combining individual micro-LEDs (and micro-detectors) in a travelling wave circuit structure in which each micro-LED is driven by an electrical signal with progressive phase (or time delay).

Figure 6:
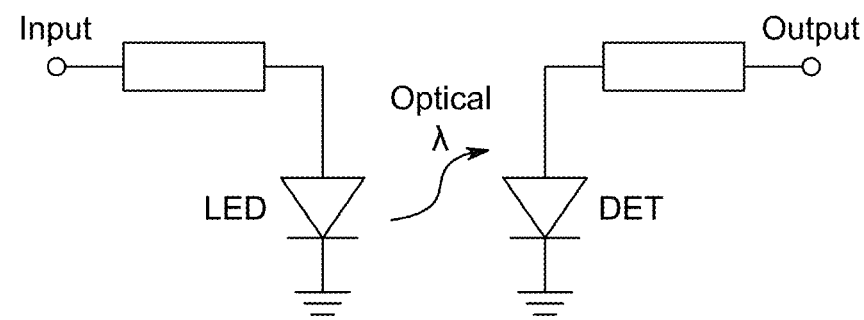
FIG. 6 depicts an equivalent circuit model of an LED/Detector pair in a wireless optical transceiver.
Figure 6:
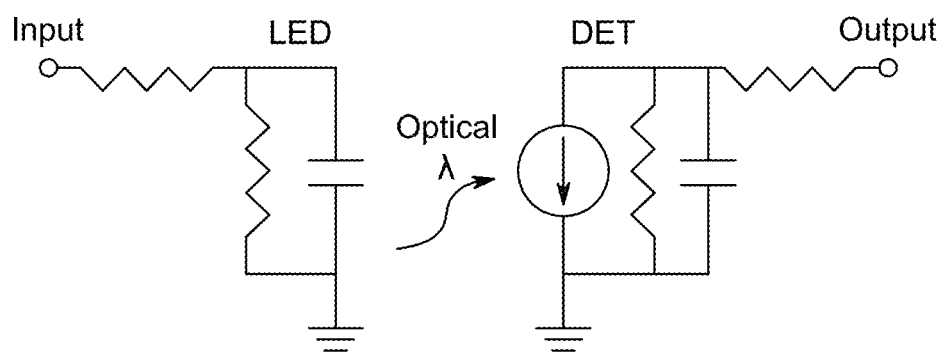

In this approach, the input transmission line segments combine with the individual capacitance of the micro-LEDs to form a "travelling wave" transmission line structure. By selecting appropriate values of each transmission line characteristic impedance (Z) and electrical length (E), as well as those of the input and termination impedances, the bandwidth of the input circuit can be dramatically increased. FIG. 6 illustrates schematics 600 of simplified electrical equivalent circuit models of an LED and photodetector in a wireless optical transceiver.

Figure 7:
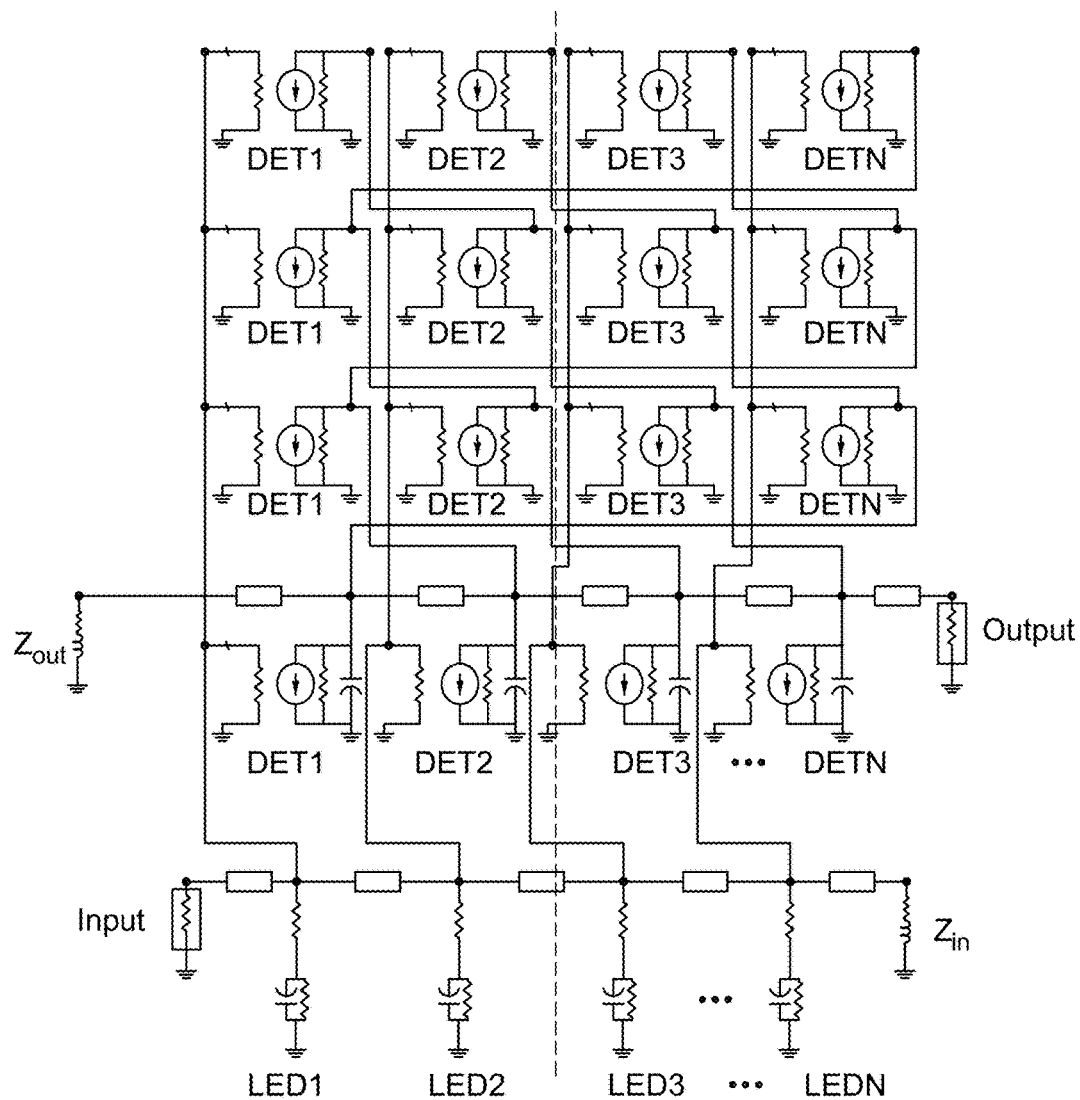
FIG. 7 depicts an electrical equivalent circuit model for the Travelling Wave Wireless Optical Transceiver of FIG. 5 and assuming N=4.

The input circuit represents the electrical model for the micro-LED diode. The output circuit shows the electrical model for the photo-detector including the photo-current source and its parasitic capacitances and resistances. The current source has a photo-current gain and an associate time-delay which represents the time it takes for the optical signal to travel from the LED to the detector. In order to simulate the performance of the Travelling Wave Wireless Optical transceiver of FIG. 5, there is a need to account for optical transmission from each LED to each one of the detectors as shown by the dashed arrows in FIG. 5. In effect, the travelling wave circuit of FIG. 5 represents a "Matrix Travelling Wave Optical Transceiver". FIG. 7 illustrates an overall circuit model 700 for the Travelling Wave transceiver of FIG. 5.

Figure 8:
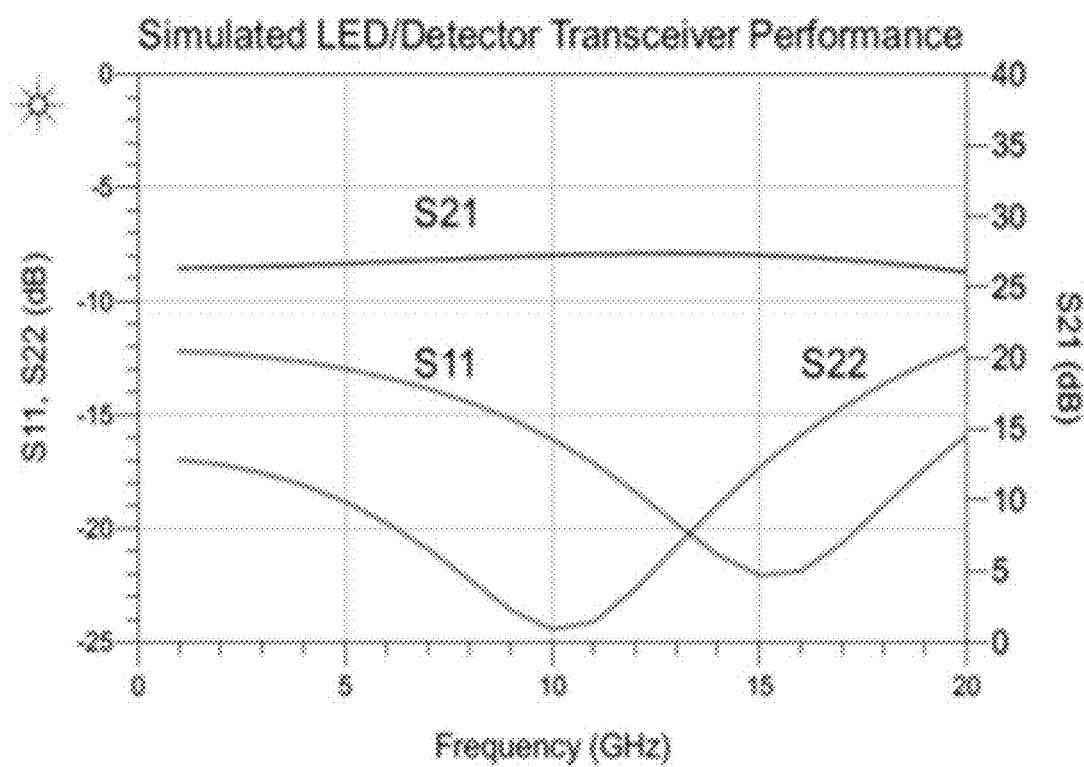
FIG. 8 depicts an electrical simulation of the disclosed optical wireless link.

As an example, the circuit of FIG. 5 has been simulated assuming a 1×4 LED array transmitting to a 1×4 detector array and using equivalent circuit models representing each micro-LED and micro-detector. The optical paths were simulated as delays due to the short distances involved. In this approach, in effect, the capacitances and parasitic resistances of the micro-LEDs and detectors are absorbed by the travelling wave circuits. FIG. 8 illustrates the simulated S-parameters of the two-port system. Preliminary simulations indicate that over 20 GHz broadband operation of the LED/detector transceiver. With additional micro-LED and micro-Detectors in FIG. 5, the operating bandwidth can be extended to 40 GHz and beyond. The graph 800 of FIG. 8 depicts an electrical simulation of the disclosed optical wireless link.

The electrical gain ($S_{21}$) in FIG. 8 is from the TIA which compensates for path losses. This gain was lumped with the gain of the photo-detector for this simulation. The important characteristics from this simulation are the gain flatness and minimum port reflections ($S_{22}$, $S_{22}$) over 20 GHz bandwidth. This approach may dramatically increase the operation bandwidth of LED/DETECTOR transceiver for wireless optical communications.

Ultra-High Speed LEDs for Wideband Wireless Optical Communication

This section describes material structures and device designs for ultra-high-speed LEDs suitable for wideband wireless optical communication. The material structures are designed to improve the intrinsic spontaneous emission and recombination rates such that the LED optical signal can respond and follow to ultra-high frequency electrical stimulations. Different single and multi-quantum well material structures based on GaAs, GaSb and GaN substrates are devised for operating wavelengths from infra-red to ultra-violet range. Multi-wavelength wireless optical transceivers based on these materials can be constructed as described earlier to achieve higher data rates and point-to-multipoint networking communication. Disclosed herein are both lattice-matched and strained-layer, super-lattice (SSL) structures. Quaternary SSL material structures based on GaAs and GaN substrates have successfully been developed for cascaded multi-junction solar cells, LEDs and photo-detectors operating in static DC conditions. Disclosed herein are material structures that enable ultra-high-speed operation of LEDs and detectors.

Ultra-High Speed LED with Carrier Confinement Layer

Figure 9:
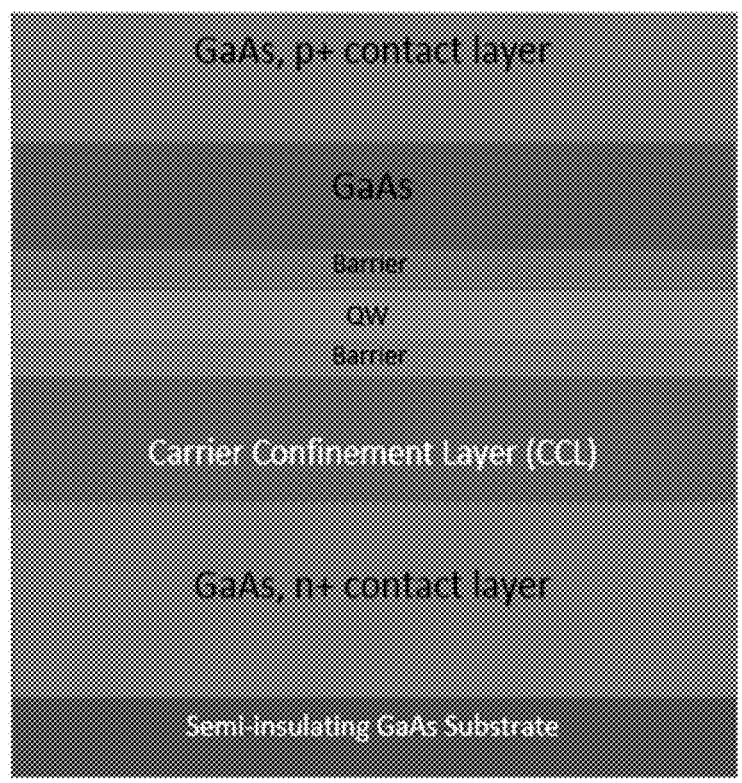
FIG. 9 depicts an ultra-high speed single/multi quantum well(s) GaAs based LED structure with Carrier Confinement Layer.

An ultra-high speed LED epitaxial structure 900 is shown in FIG. 9. The LED structure 900 includes an n+ doped (high n doped) GaAs contact layer, n doped GaAs layer, n doped carrier confinement layer (CCL), undoped n-side barrier, undoped quantum well (QW), undoped p-side barrier, p doped GaAs layer and p+ doped GaAs contact layer. The low band gap InGaAs QW sandwiched between two wide band gap GaAsP barriers is the active region of the device. The electrons are supplied from the n-doped layers and the holes are supplied from the p-doped layers to the QW. Due to the carrier confinement in the QW, radiative recombination occurs resulting in the emission of light. The recombination dynamics is one of the factors that limits the switching time of an LED. The carrier lifetime can be considerably reduced by having a high concentration of injected carriers in the active region. In a QW in which free carriers confine in a small active region is employed to obtain high carrier concentration and thus short carrier lifetimes. The spontaneous lifetime of a semiconductor is given by equation 1.

$$\tau_{spont} = \frac{1}{BN_{D,A}} \quad \text{equation 1}$$

Within equation 1, B is the bimolecular recombination coefficient and $N_{D,A}$ is the impurity concentration. The bimolecular recombination coefficient is related to the equilibrium recombination rate $R_0$ by equation 2.

$$B = \frac{R_0}{n_i^2} \quad \text{equation 2}$$

Within equation 2, $n_1$ is the intrinsic carrier concentration. For bulk GaAs, $R_0 = 7.9 \times 10^2$ cm$^{-3}$s$^{-1}$ and $B = 2.0 \times 10^{-10}$ cm$^3$s$^{-1}$. The value of spontaneous lifetime $\tau_{spont}$ is $5.1 \times 10^{-9}$ s for a majority carrier concentration of $10^{18}$ cm$^{-3}$. In a bulk semiconductor, the recombination occurs over a large region since the minority carriers are distributed over a large distance and the majority carrier concentration decreases as these carriers diffuse into the adjacent region. The large recombination region in bulk material increases the recombination lifetime of the carriers. The radiative recombination rate is not an intrinsic property of the material; with the increasing carrier concentration in the active region, the radiative recombination rate increases and the spontaneous lifetime decreases. In a quantum well structure, the carriers are confined to the active region by means of the barriers. As a result, the thickness of the region in which the carriers recombine is given by the thickness of the active region rather than the diffusion length. Due to the high carrier concentration in a quantum well structure, the radiative recombination time is reduced and the LED can be operated in the high frequency (~20 GHz) zone.

Figure 10:
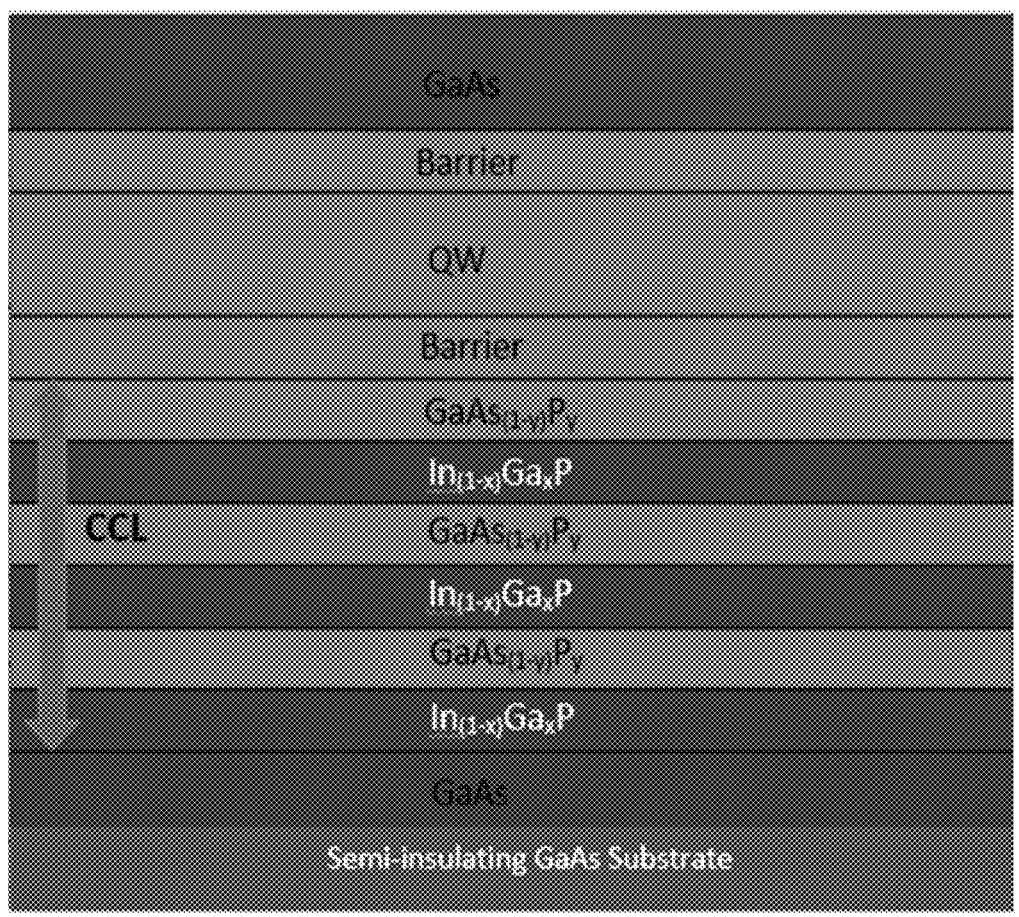
FIG. 10 depicts an ultra-high speed single QW LED structure with alternate six layers of GaAsP and InGaP acting as a carrier confinement layer (CCL).
Figure 11:
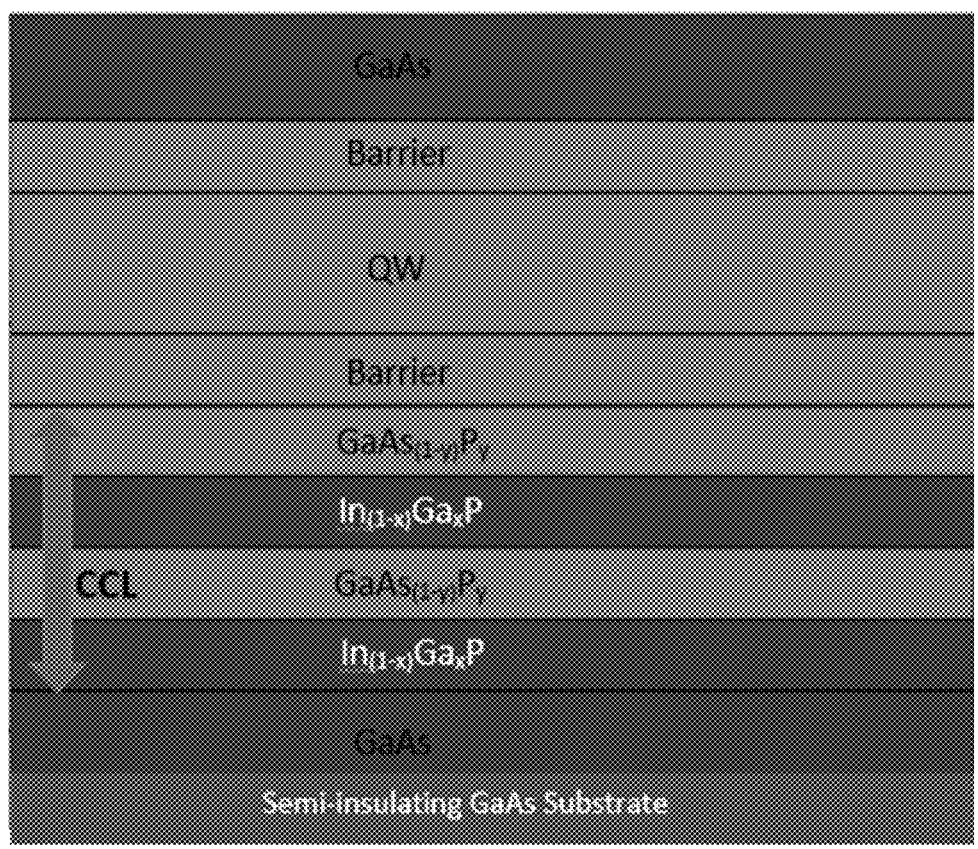
FIG. 11 depicts an ultra-high speed single QW LED structure with alternate four layers of GaAsP and InGaP acting as carrier confinement layer (CCL).
Figure 12:
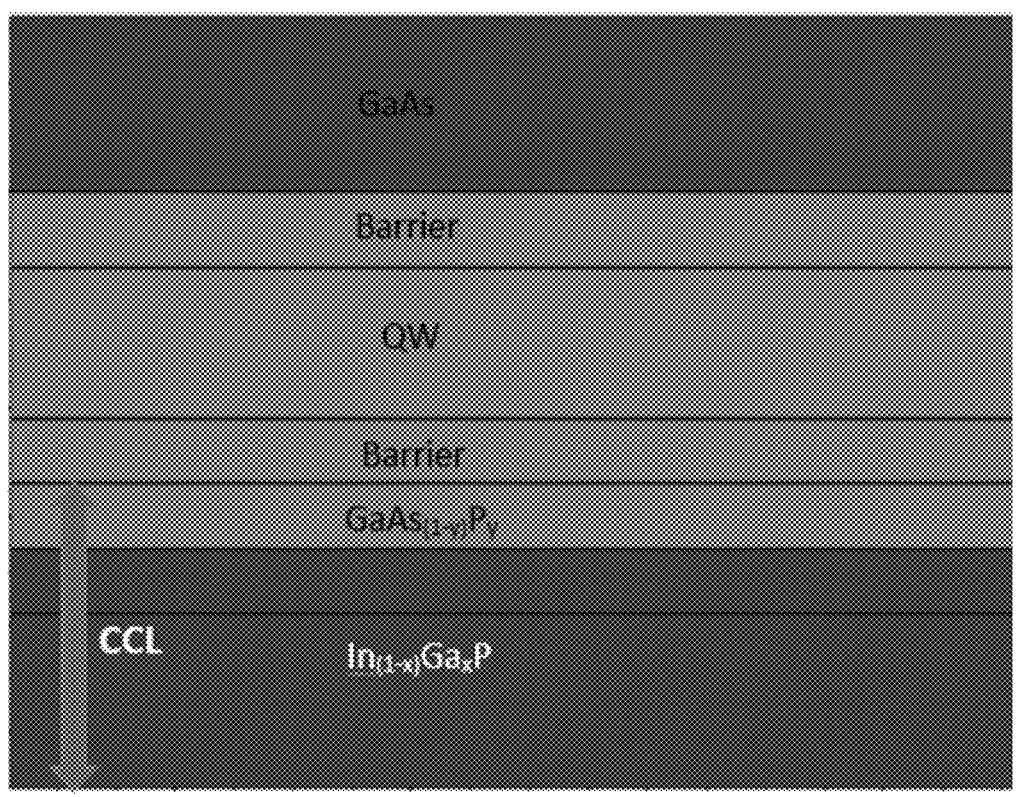
FIG. 12 depicts an ultra-high speed single QW LED structure with two layers of GaAsP and InGaP acting as a carrier confinement layer (CCL).

The percentage of Indium composition (In %) is significant in determining the peak emission wavelength. For achieving high efficiency of the LED device, the light emitted from the active region should be transparent to the substrate material. For 23% Indium, the peak emission wavelength is 998 nm which is transparent to the GaAs substrate. The atmospheric optical window in the infrared region of the spectrum is between 850 nm to 1200 nm. It is highly important for wireless optical communication that the peak emission wavelength of the emitter is within the atmospheric window. The indium percentage in the QW is selected to also meet the above criteria. The Indium composition is altered higher to 30% or lower than 20% depending on the requirement of the wavelength of the emitted light. The percentage of Phosphorus (P) composition is selected to obtain optimum barrier height for the QW region with the objective to achieve high carrier confinement in the QW and high operating speed. Carriers tend to escape from the active layer of an LED into the confinement layers. The electron/hole escape rate can be substantial in double heterostructures depending on the conduction/valence band offsets. For the $In_{0.23}GaAs/GaAsP_{0.45}$ material system, the conduction band offset is as high as 0.65 eV but it has a lower valance band offset of 0.23 eV. Therefore, the leakage of holes in the n-side of the barrier is significant. By incorporating a wide band gap layer at the n-side barrier the hole leakage is reduced which improves the carrier confinement in the active region. The wide band-gap carrier confinement layer (CCL) plays an important role in determining the efficiency, luminous power output and the speed of the LED. The n-doped CCL must supply electrons to the QW and at the same time act as a barrier layer to block the leakage of holes from the QW. A thick (>100 Å) GaAsP with 60% P can act as CCL. But GaAsP is lattice mismatched to GaAs, the maximum thickness of GaAsP layer with 60% P which can be grown before it relaxes is 82.5 Å. Therefore, a thick (>100 Å) GaAsP with 60% P CCL will result in deteriorating the reliability of the device. To alleviate this issue, alternate thin layers of wide band gap materials GaAsP and InGaP are used as CCL. FIG. 10 illustrates an LED epitaxial structure 1000 with three alternate layers of GaAsP (60% P) and InGaP (48.5% In) act as CCL (STR #1). The thickness of each layer is 35 Å. Therefore the thickness of GaAsP (60% P) is below its critical thickness of strain relaxation and InGaP with 48.5% Indium is lattice matched to GaAs. FIG. 11 illustrates another LED epitaxial structure 1100 with two alternate layers of GaAsP (60% P) and InGaP (48.5% In) acting as CCL (STR #2). FIG. 12 depicts a simpler epitaxial structure 1200, having a single layer of GaAsP (60% P) and InGaP as CCL (STR #3). The design parameters of the LED structures are summarized in TABLE 2, TABLE 3, and TABLE 4. TABLE 5 lists the design parameters of the LED with 23% In composition in the QW and 45% P in the barriers.

Figure 13:
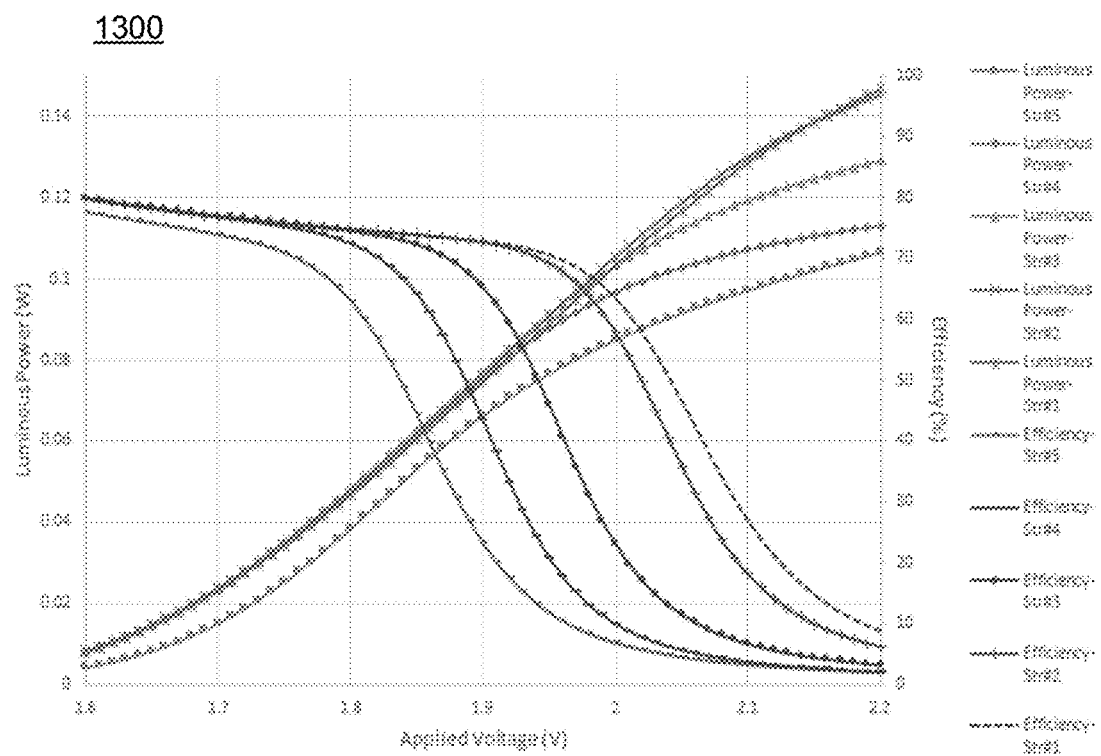
FIG. 13 depicts a comparison of the luminous output power and efficiency of the single QW InGaAs/GaAsP LEDs with different CCLs.
Figure 14:
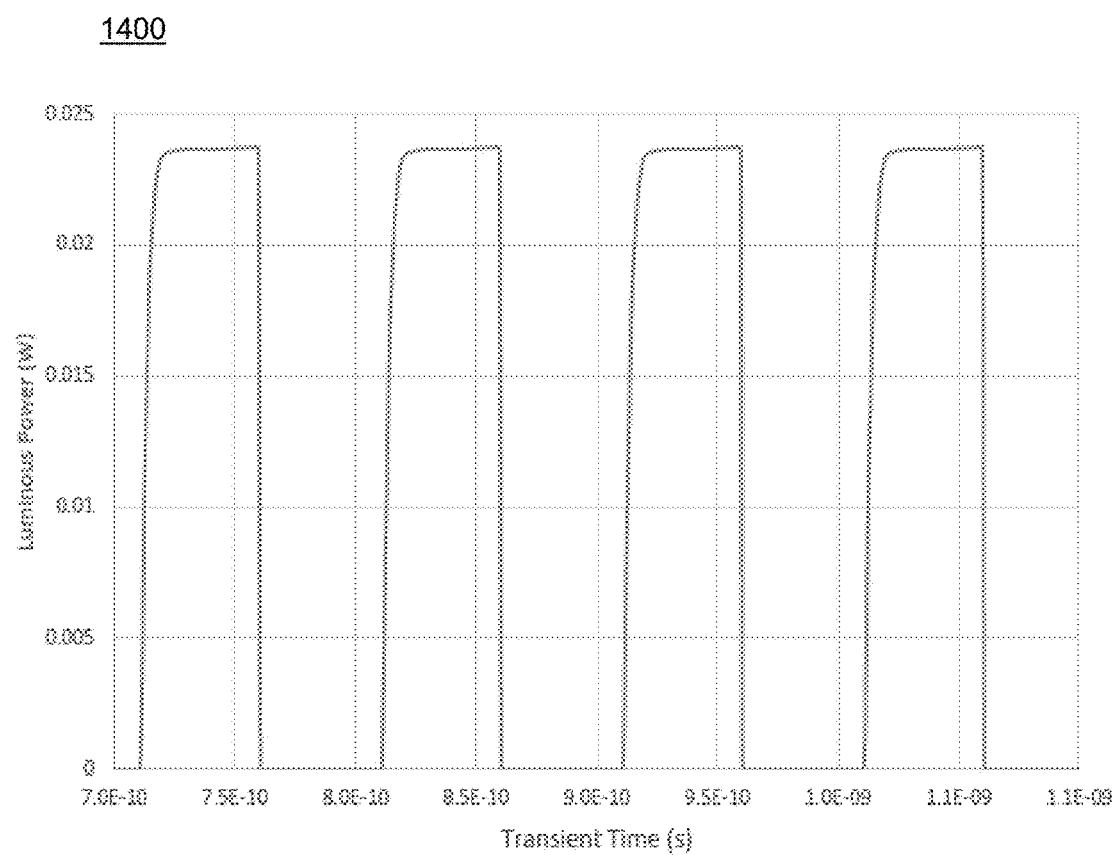
FIG. 14 depicts a 10 GHz transient response at 1.7 V of LED STR #3.
Figure 15:
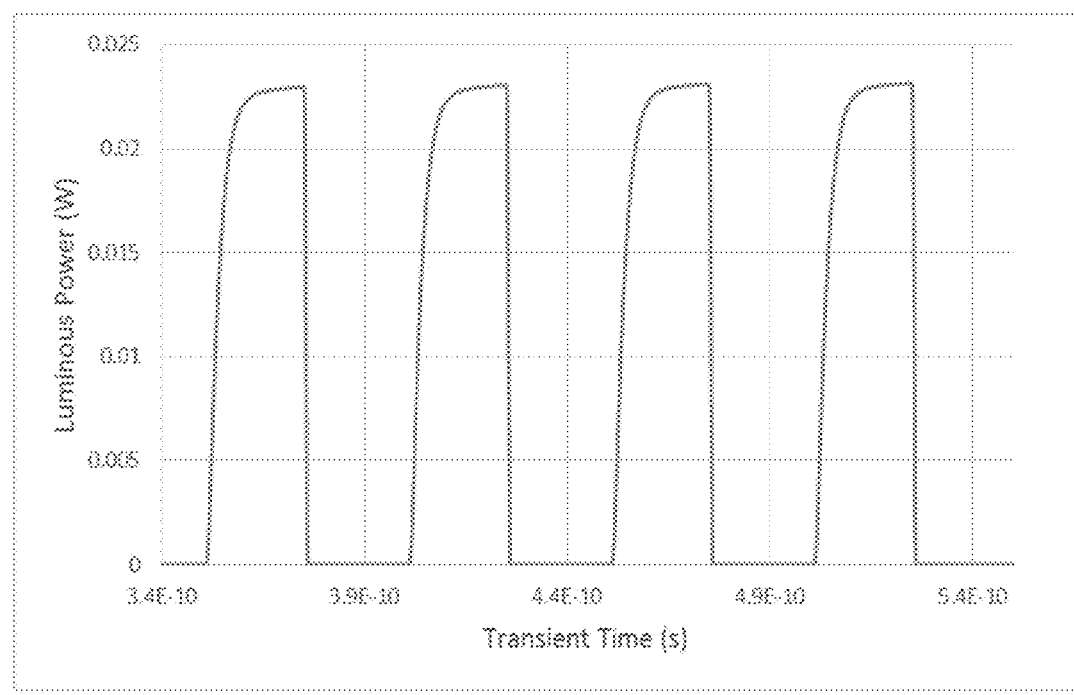
FIG. 15 depicts a 20 GHz transient response at 1.7 V of LED STR #3.
Figure 16:
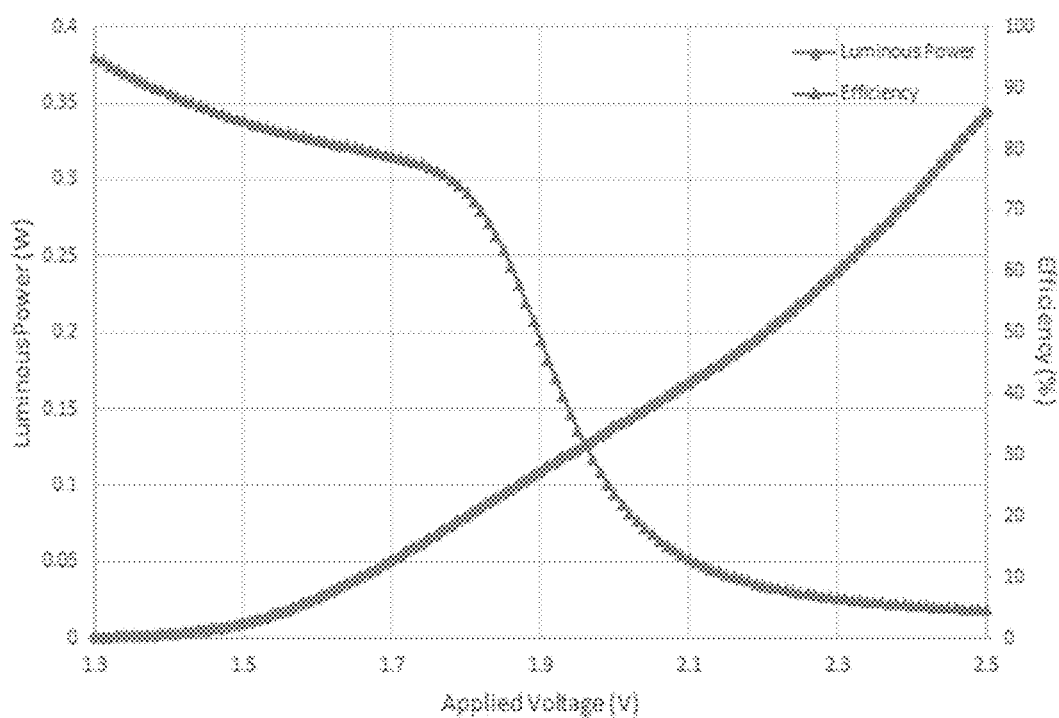
FIG. 16 depicts a DC luminous output power and efficiency of 1×1000 µ2 single QW InGaAs/GaAsP LED with 23% In composition in the QW and 45% P in the barriers.
Figure 17:
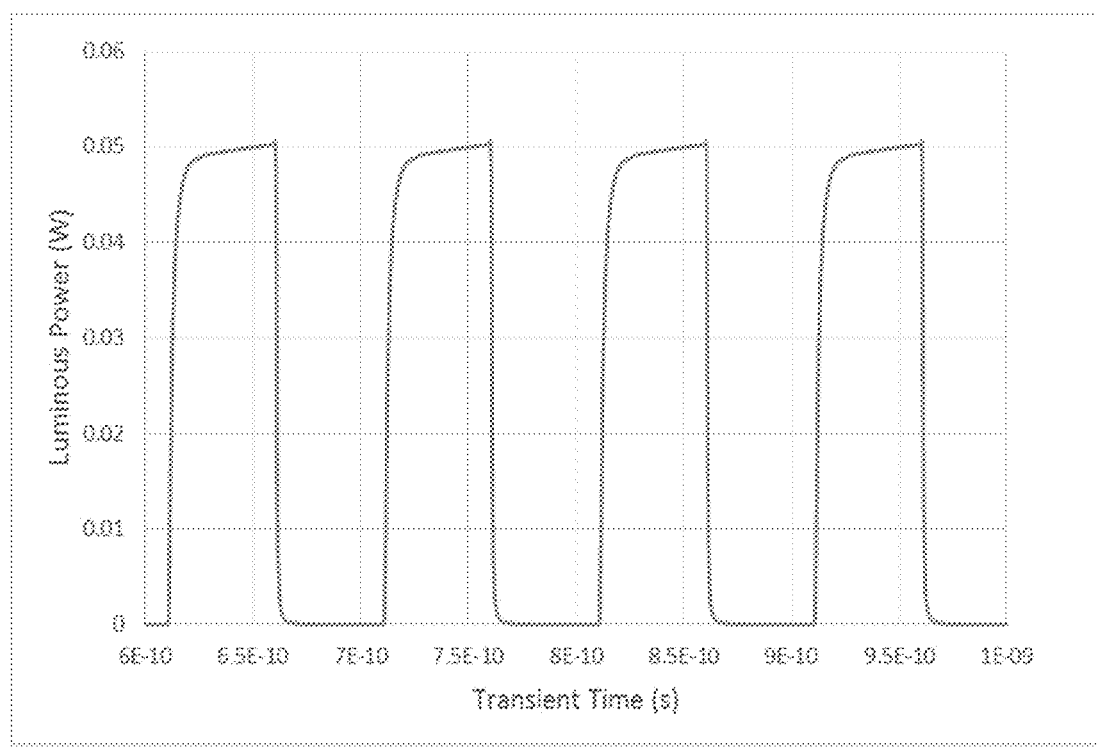
FIG. 17 depicts a 10 GHz transient response at 1.7 V of 1×1000 µ2 single QW InGaAs/GaAsP LED with 23% In composition in the QW and 45% P in the barriers.

A comparison of the efficiency and luminous power output of the LED of structure designs STR #1, STR #2, STR #3 and with CCL=100 Å GaAsP (P=60%) (STR #4), and CCL=1000 Å InGaP (In=48.5%) (STR #5) is shown in graph 1300 of FIG. 13. LED STR #1 gives high efficiency (>60%) at high (>2.0V) forward bias voltage. TABLE 6 shows the luminous power and efficiency for different anode voltages of STR #1, 2 & 3. FIG. 14 illustrates a graph 1400 of a 10 GHz transient response at 1.7 V of LED STR #3. FIG. 15 illustrates a graph 1500 of a 20 GHz transient response at 1.7 V of LED STR #3. The graphs 1600 and 1700 of FIG. 16 and FIG. 17, respectively show the DC characteristics and 10 GHz transient response at 1.7 V of the single QW InGaAs/GaAsP LED with 23% In composition in the QW and 45% P in the barriers.

Figure 18:
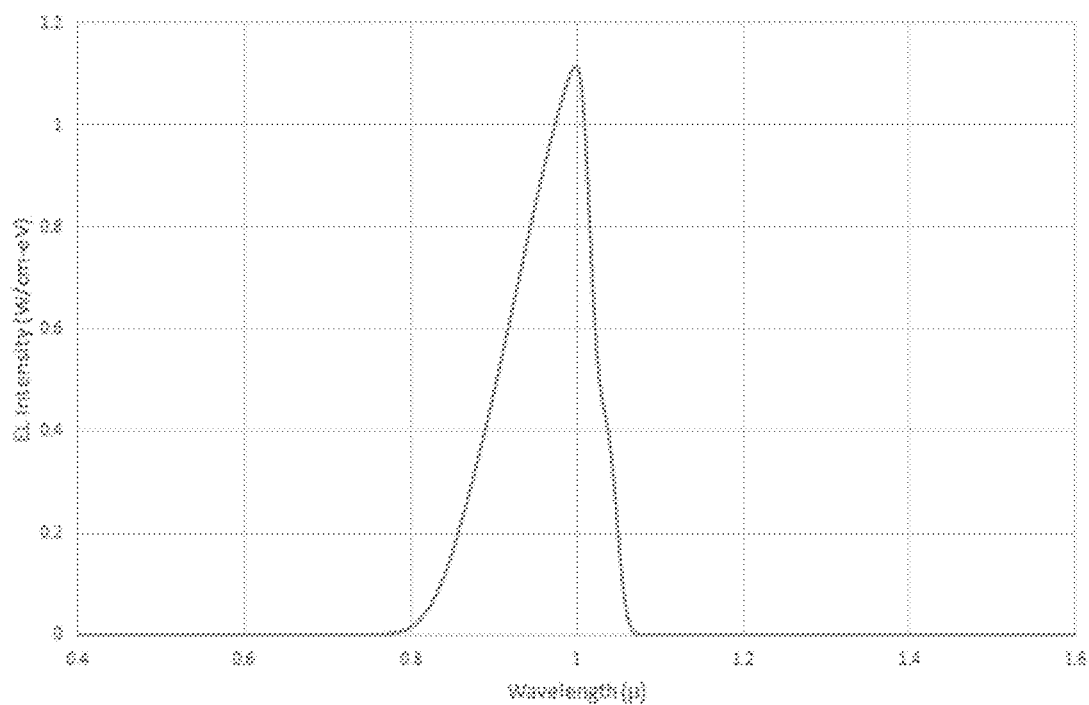
FIG. 18 depicts an emission spectrum of LED STR #3. Peak emission wavelength is 998 nm.

The composition of phosphorous can be reduced to 40% or further to 35% to improve the device transient response while maintaining strain compensation by altering the thickness of the QW and barrier layers. A spectral diagram 1800 of LED STR #3 is shown in FIG. 18, the peak emission wavelength is 998 nm. The electron leakage from the QW region to the p-layer can be reduced by incorporating a wide band gap AlGaAs or GaAsP electron blocking layer (EBL) above the p-side barrier. Since the InGaP with 48.5% Indium (latticed matched to GaAs) has a larger valance band offset when interfaced with InGaAs, it can be used as a hole blocking layer (HBL) which improves the efficiency of the LED at higher voltages drastically. The InGaP layer interfaces with the InGaAs QW and replaces the n-GaAsP barrier. GaAsP layer is used as the p-side barrier. Two and multiple quantum wells (MQW) InGaAs/GaAs LED designs can also be used as ultra-high speed emitters in wireless visual light communication.

Design parameters of LED structure #1 are shown in TABLE 2.

TABLE 2

| Layer | Material | Percentage Composition | Thickness (Å) | Doping Type | Doping Concentration (cm$^{-3}$) |
|---|---|---|---|---|---|
| p+ contact layer | GaAs | — | 1000 | p.type | $4 \times 10^{19}$ |

TABLE 2-continued

| Layer | Material | Percentage Composition | Thickness (Å) | Doping Type | Doping Concentration (cm$^{-3}$) |
|---|---|---|---|---|---|
| p layer | GaAs | — | 1000 | p.type | $2 \times 10^{19}$ |
| Barrier | GaAsP | 45% P | 35 | — | — |
| QW | InGaAs | 23% In | 70 | — | — |
| Barrier | GaAsP | 60% P | 30 | — | — |
| n layer | GaAsP | 60% P | 35 | n.type | $3 \times 10^{19}$ |
| n layer | InGaP | 48.5% In | 35 | n.type | $3 \times 10^{19}$ |
| n layer | GaAsP | 60% P | 35 | n.type | $3 \times 10^{19}$ |
| n layer | InGaP | 48.5% In | 35 | n.type | $3 \times 10^{19}$ |
| n layer | GaAsP | 60% P | 35 | n.type | $3 \times 10^{19}$ |
| n layer | InGaP | 48.5% In | 35 | n.type | $3 \times 10^{19}$ |
| n+ contact layer | GaAs | — | 10000 | n.type | $3 \times 10^{19}$ |

Example of design parameters of LED structure #2 are shown in TABLE 3.

TABLE 3

| Layer | Material | Percentage Composition | Thickness (Å) | Doping Type | Doping Concentration (cm$^{-3}$) |
|---|---|---|---|---|---|
| p+ contact layer | GaAs | — | 1000 | p.type | $4 \times 10^{19}$ |
| p layer | GaAs | — | 1000 | p.type | $2 \times 10^{19}$ |
| Barrier | GaAsP | 45% P | 35 | — | — |
| QW | InGaAs | 23% In | 70 | — | — |
| Barrier | GaAsP | 60% P | 30 | — | — |
| n layer | GaAsP | 60% P | 35 | n.type | $3 \times 10^{19}$ |
| n layer | InGaP | 48.5% In | 35 | n.type | $3 \times 10^{19}$ |
| n layer | GaAsP | 60% P | 35 | n.type | $3 \times 10^{19}$ |
| n layer | InGaP | 48.5% In | 35 | n.type | $3 \times 10^{19}$ |
| n+ contact layer | GaAs | — | 10000 | n.type | $3 \times 10^{19}$ |

Design parameters of LED structure #3 are shown in TABLE 4.

TABLE 4

| Layer | Material | Percentage Composition | Thickness (Å) | Doping Type | Doping Concentration (cm$^{-3}$) |
|---|---|---|---|---|---|
| p+ contact layer | GaAs | — | 1000 | p.type | $4 \times 10^{19}$ |
| p layer | GaAs | — | 1000 | p.type | $2 \times 10^{19}$ |
| Barrier | GaAsP | 45% P | 35 | — | — |
| QW | InGaAs | 23% In | 70 | — | — |
| Barrier | GaAsP | 60% P | 30 | — | — |
| n layer | GaAsP | 60% P | 30 | n.type | $3 \times 10^{19}$ |
| n layer | InGaP | 48.5% In | 1000 | n.type | $3 \times 10^{19}$ |
| n+ contact layer | GaAs | — | 10000 | n.type | $3 \times 10^{19}$ |

Design parameters of LED with 23% In composition in the QW and 45% P in the barriers are shown in TABLE 5.

TABLE 5

| Layer | Material | Percentage Composition | Thickness (Å) | Doping Type | Doping Concentration (cm$^{-3}$) |
|---|---|---|---|---|---|
| p+ contact layer | GaAs | — | 1000 | p.type | $4 \times 10^{19}$ |
| p layer | GaAs | — | 1000 | p.type | $2 \times 10^{19}$ |
| Barrier | GaAsP | 45% P | 35 | — | — |
| QW | InGaAs | 23% In | 70 | — | — |
| Barrier | GaAsP | 45% P | 30 | — | — |
| n layer | GaAsP | 45% P | 30 | n.type | $5 \times 10^{18}$ |

TABLE 5-continued

| Layer | Material | Percentage Composition | Thickness (Å) | Doping Type | Doping Concentration (cm$^{-3}$) |
|---|---|---|---|---|---|
| n layer | InGaP | 48.5% In | 500 | n.type | $5 \times 10^{18}$ |
| n+ contact layer | GaAs | — | 10000 | n.type | $5 \times 10^{18}$ |

A comparison of efficiency and luminous power output of the three LED structures is shown in TABLE 6.

TABLE 6

| | LED STR# 1 | | LED STR# 2 | | LED STR# 3 | |
|---|---|---|---|---|---|---|
| Voltage levels (V) | Efficiency | Luminous Power (mW) | Efficiency | Luminous Power (mW) | Efficiency | Luminous Power (mW) |
| 1.6 | 79.8% | 8.2 | 79.8% | 8.3 | 79.8% | 8.3 |
| 1.7 | 76.9% | 23.3 | 76.9% | 23.6 | 76.9% | 23.9 |
| 1.8 | 74.7 | 46.6 | 74.8% | 47.6 | 74.5% | 48.3 |
| 2.0 | 63% | 103.0 | 57.8% | 105.5 | 23% | 103.0 |

A comparison of DC efficiency and luminous output power of 1×1000 μ2 single QW InGaAs/GaAsP LED with 23% in composition in the QW and 45% P in the barriers is shown in TABLE 7.

TABLE 7

| Voltage levels (V) | Efficiency | Luminous Power (mW) |
|---|---|---|
| 1.6 | 81.5% | 26.2 |
| 1.7 | 79% | 50.9 |
| 1.8 | 72.8% | 79.3 |
| 1.9 | 50% | 108.8 |

Figure 19:
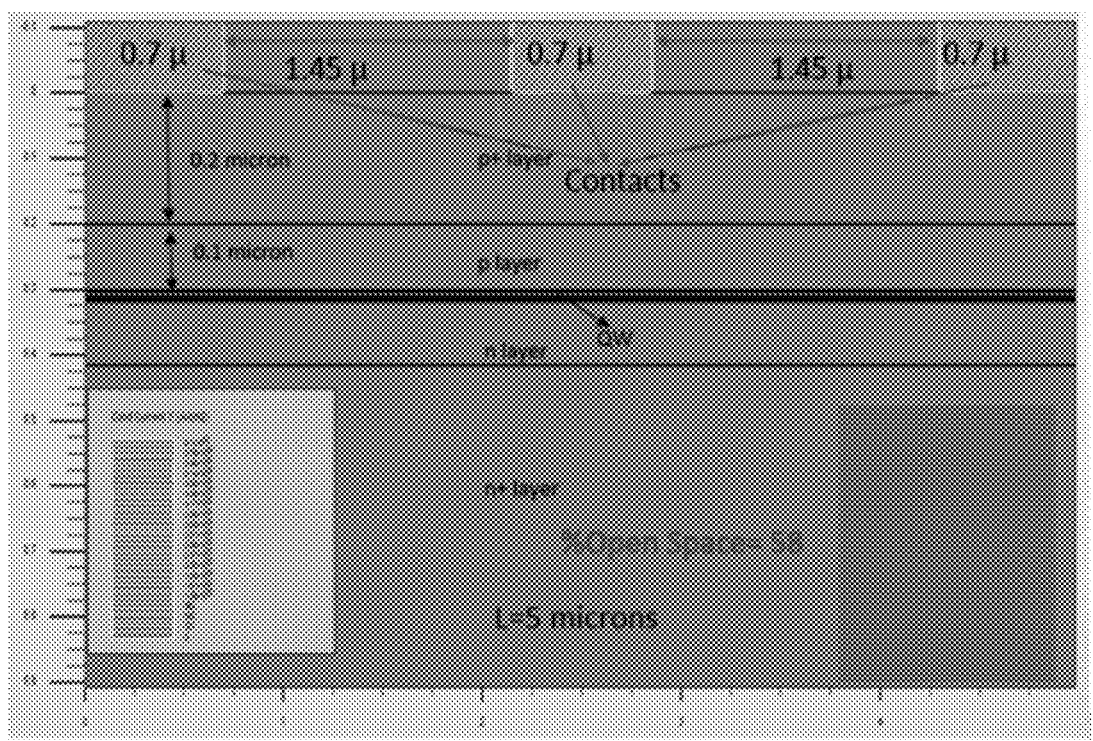
FIG. 19 depicts a Y-component current spreading of 5µ LED with three p+ electrode each of 0.7µ on top.
Figure 20:
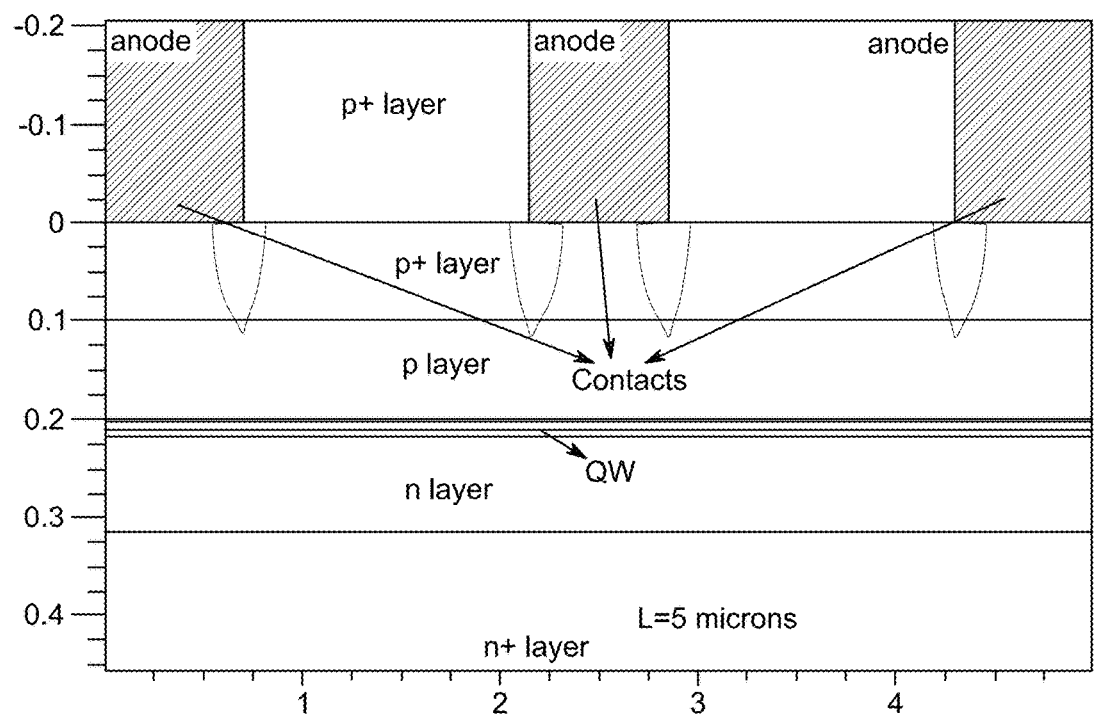
FIG. 20 depicts a Y-component current spreading of 5µ LED with three p+ electrode each of 0.7µ embedded in the p+ layer.
Figure 21:
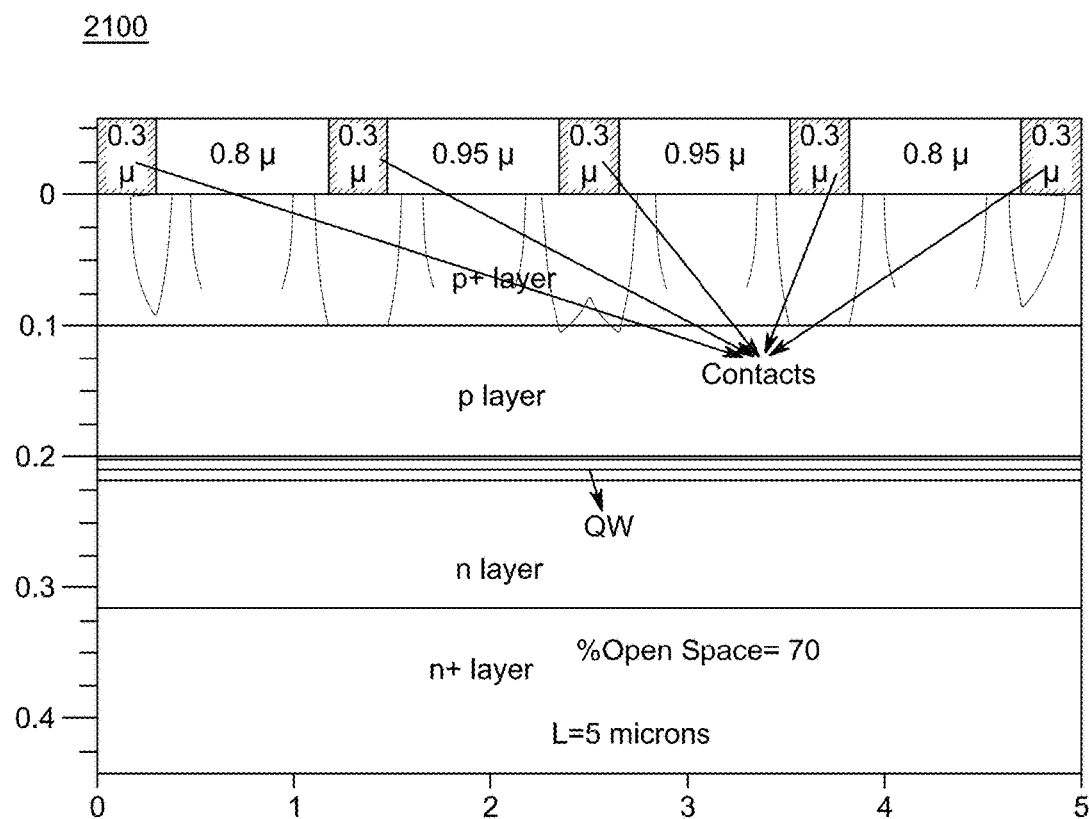
FIG. 21 depicts Y-component current spreading of 5µ LED with five p+ electrode each of 0.3µ on top.
Figure 22:
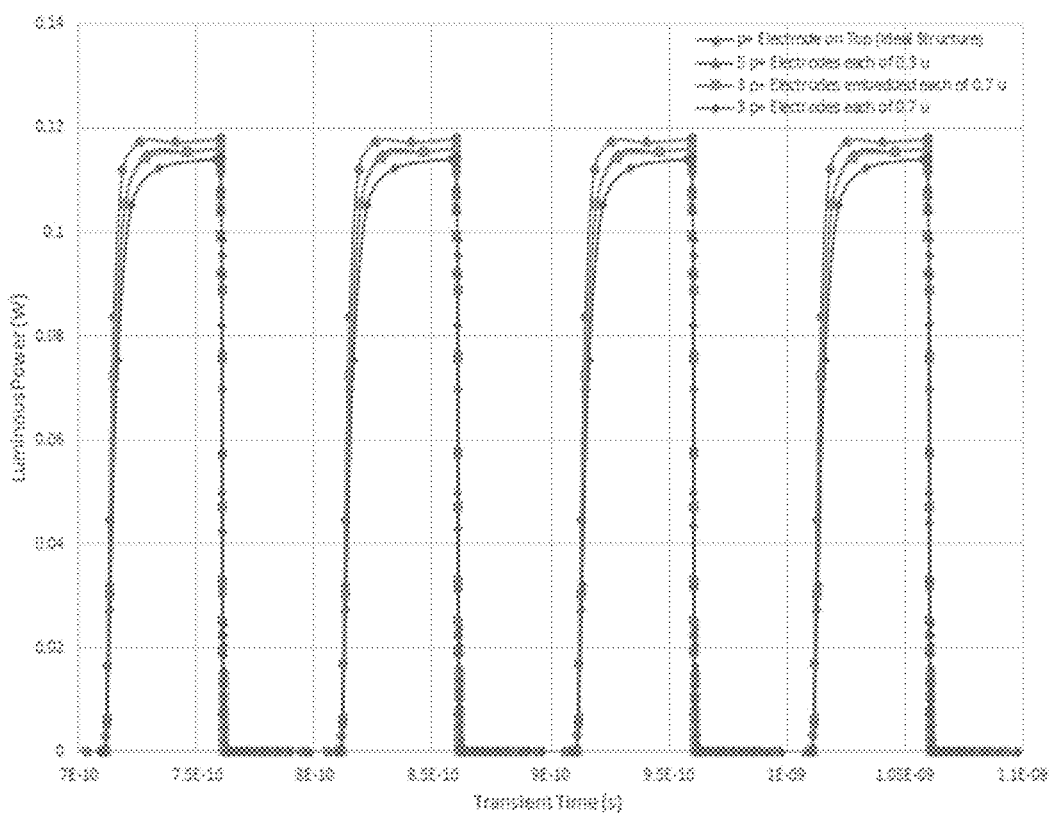
FIG. 22 depicts a comparison of 10 GHz transient response at 1.7 V for 5µ LEDs of different p+ electrode designs and the ideal structure (Ideal p+ electrode across the entire device length).

Light is extracted from the top surface of the LED. To increase the efficiency of the light extraction, the p+ electrode(s) are required to occupy minimum area on the top surface of the device. Under transient condition the performance of the LED highly depends on the current spreading from the p+ electrodes since the radiative recombination rate depends on the current spreading in the p+/p layers to the QW region. For efficient transient performance the current should spread across the entire active region. The number of p+ electrodes, the spacing between them, the thickness and the doping concentration of the p+ and the p layers play crucial role in determining the current spreading to the active region of the device. Increasing the number of p+ electrodes and decreasing the spacing between them will improve the transient performance of the LED but it will reduce the top surface open area and thus will degrade the light extraction efficiency. The trade-off between the extraction efficiency and the transient performance is investigated and the device performance of various p+ electrode designs is analyzed. A diagram 1900 of FIG. 19 illustrates the current (y-component) spreading of a 5μ LED with three p+ electrodes each of 0.7μ on top. The structure has a top open area of 58% and the spacing between the adjacent electrodes is 1.45μ. A diagram 2000 shown in FIG. 20 depicts the current spreading in the p+ layer is increased by embedding the p+ electrodes in the p+ layer. The current spreading is improved when the electrodes are embedded in the p+ layer because the current from the electrodes is injected across two dimensions—the bottom and the sides of the p+ electrodes. The length of the p+ electrodes and the open area percentage are 0.7μ and 58% respectively. The transient performance can be improved by reducing the spacing between the p+ electrodes and the light extraction efficient can be increased by increasing the percentage of open area. The new device design with more number of p+ electrodes of smaller dimension meets the above criteria. A diagram 2100, shown in FIG. 21, depicts the LED structure with five p+ electrodes each of 0.3μ length. The space between two adjacent electrodes is 0.95μ and the percentage of open area is 70%. A graph 2200 shown in FIG. 22 depicts a comparison of the 10 GHz transient response of the devices with different p+ electrode designs. TABLE 8 describes the design parameters of the different device designs. Light can also be extracted from the back-side of the device using flip-chip design.

TABLE 8

| Device Length (μ) | Number of p+ electrodes | P+ electrode length (μ) | Spacing between two adjacent p+ electrodes (μ) | P+ layer thickness (μ) | Percentage of open area |
|---|---|---|---|---|---|
| 5 | 3 | 1.0 | 1.00 | 0.1 | 40% |
| 5 | 3 | 0.7 | 1.45 | 0.1 | 58% |
| 5 | 3 | 0.7 | 1.45 | 0.2 | 58% |
| 5 | 3 (embedded) | 0.7 | 1.45 | 0.2 | 58% |
| 5 | 5 | 0.3 | 0.95 | 0.1 | 70% |
| 5 (flip-chip) | 1 | 5.0 | — | 0.1 | Light is extracted from back-side |
| 4 | 2 | 0.7 | 1.30 | 0.1 | 65% |
| 3 | 2 | 0.7 | 0.80 | 0.1 | 53% |
| 3 | 2 | 0.5 | 1.00 | 0.1 | 67% |
| 2 | 1 | 0.7 | — | 0.1 | 65% |

Figure 23:
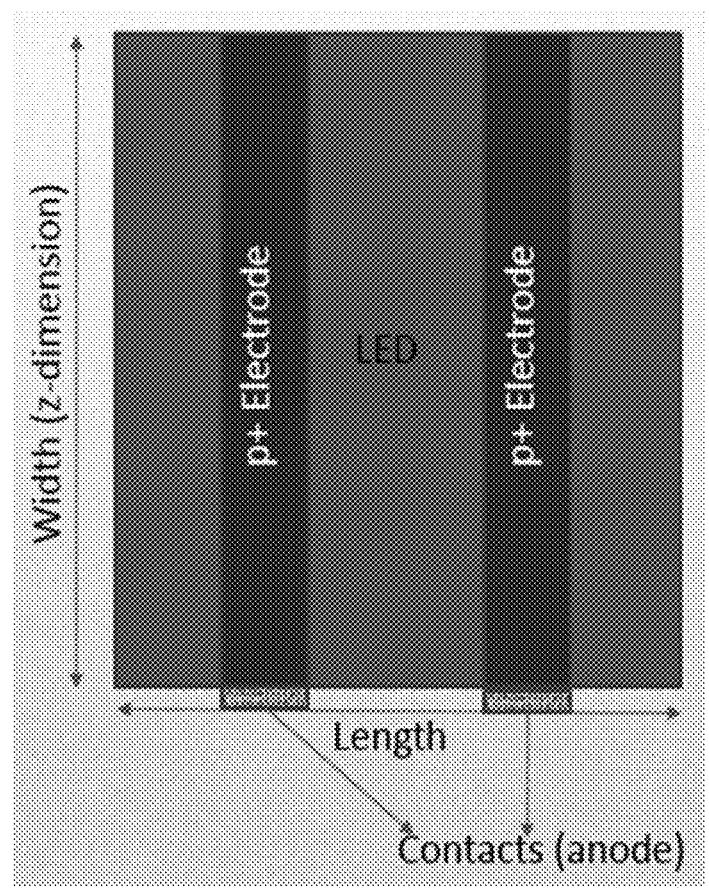
FIG. 23 depicts a top view of the LED.
Figure 24:
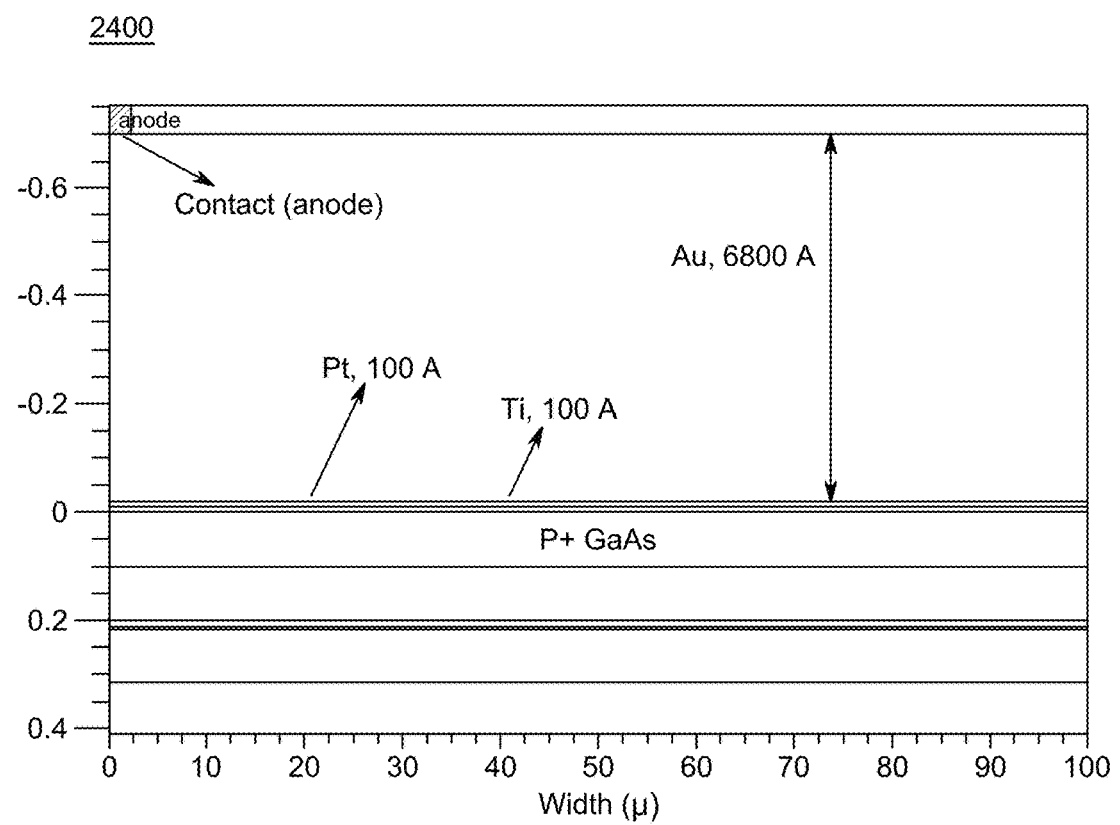
FIG. 24 depicts an example of thickness of the metal stacks of p+ electrode-100 Å thick Titanium, 100 Å Platinum and 6800 Å Gold.
Figure 25:
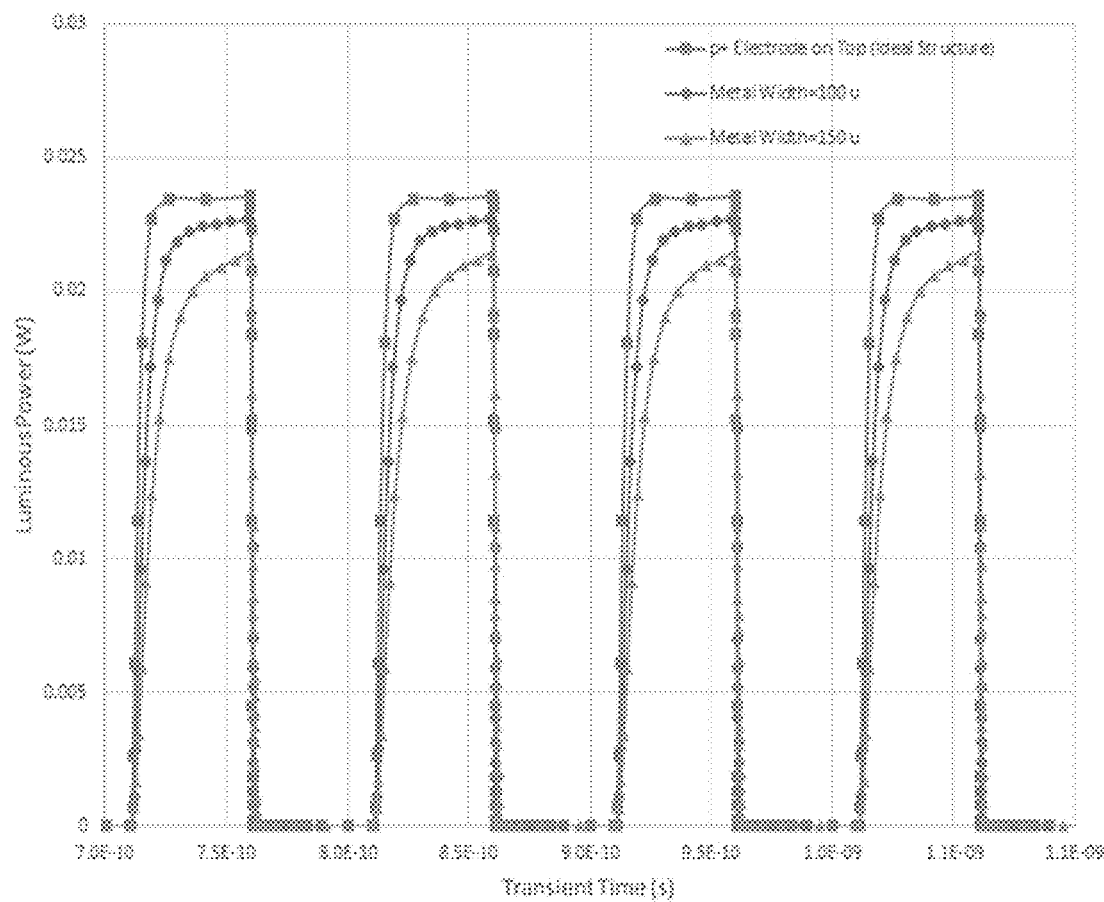
FIG. 25 depicts a comparison of the 10 GHz transient performance of devices of different widths and the ideal structure with a p+ electrode across the entire device width.
Figure 26:
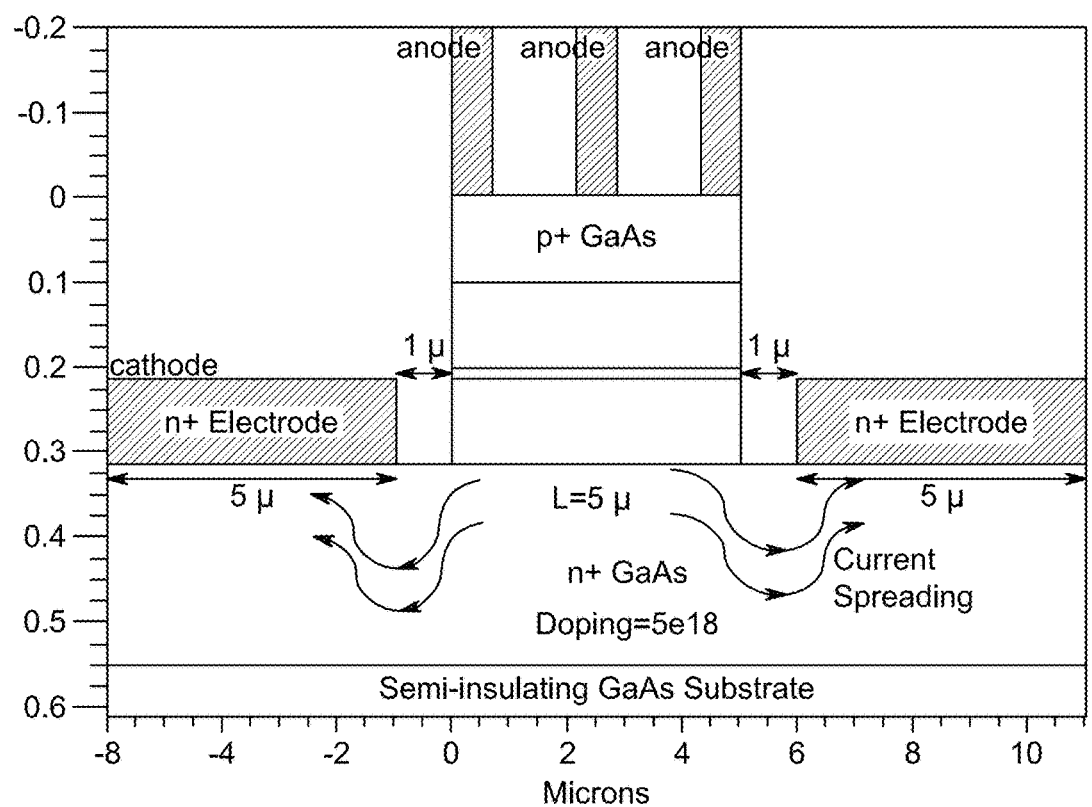
FIG. 26 depicts a planer LED structure two three p+ electrodes on top and two n+ electrodes.
Figure 27:
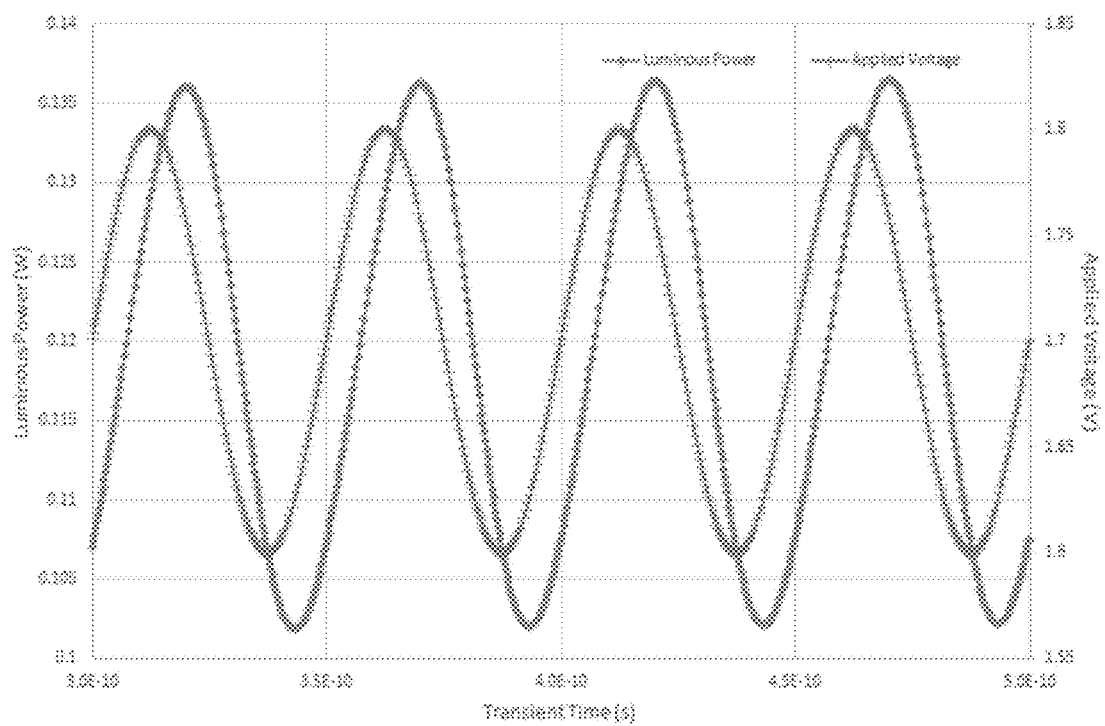
FIG. 27 depicts a 20 GHz sinusoidal response at 1.7 V of the LED structure shown in FIG. 26.

A diagram 2300 shown in FIG. 23. is a top view of the LED and depicts the current spreading across the z-dimension. This current spreading is critical in evaluating the transient performance of the LED. The anode contacts are connected to the metal strips (p+ electrodes). The length and width of the metal strips determine the current spreading across the z-dimension. The metal strip consists of a stack of 100 Å thick Titanium, 100 Å Platinum (or Palladium) and 6800 Å Gold as shown in diagram 2400 of FIG. 24. A comparison of the transient response of devices of width 100μ, 150μ, 200μ and the ideal structure is shown in graph 2500 of FIG. 25. The transient performance deteriorates when the LED width is increased beyond 100μ. TABLE 9 summarizes the design parameters of LED of different widths. The LED structure with two n+ electrodes each of 5μ with 1μ spacing from the active mesa is shown in diagram 2600 of FIG. 26. The 20 GHz optical response to sinusoidal voltage waveform of the LED structure is shown in graph 2700 of FIG. 27.

TABLE 9

| Device widths (μ) | Metals | Metal thicknesses (Å) | Transient Performance |
|---|---|---|---|
| 25 | Ti/Pt/Au | 100/100/6800 | Excellent |
| 50 | Ti/Pt/Au | 100/100/6800 | Excellent |
| 100 | Ti/Pt/Au | 100/100/6800 | Excellent |
| 150 | Ti/Pt/Au | 100/100/6800 | Good |

Ultra-High Speed AlGaAs/GaAs LED

Figure 28:
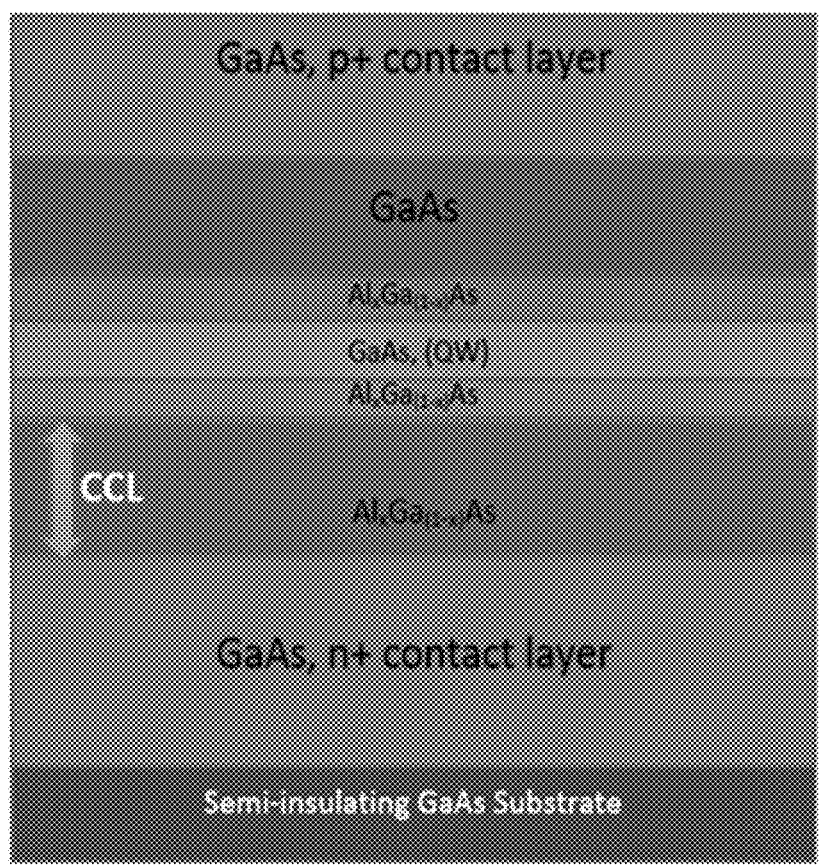
FIG. 28 depicts an ultra-high speed single QW AlGaAs/GaAs LED structure.
Figure 29:
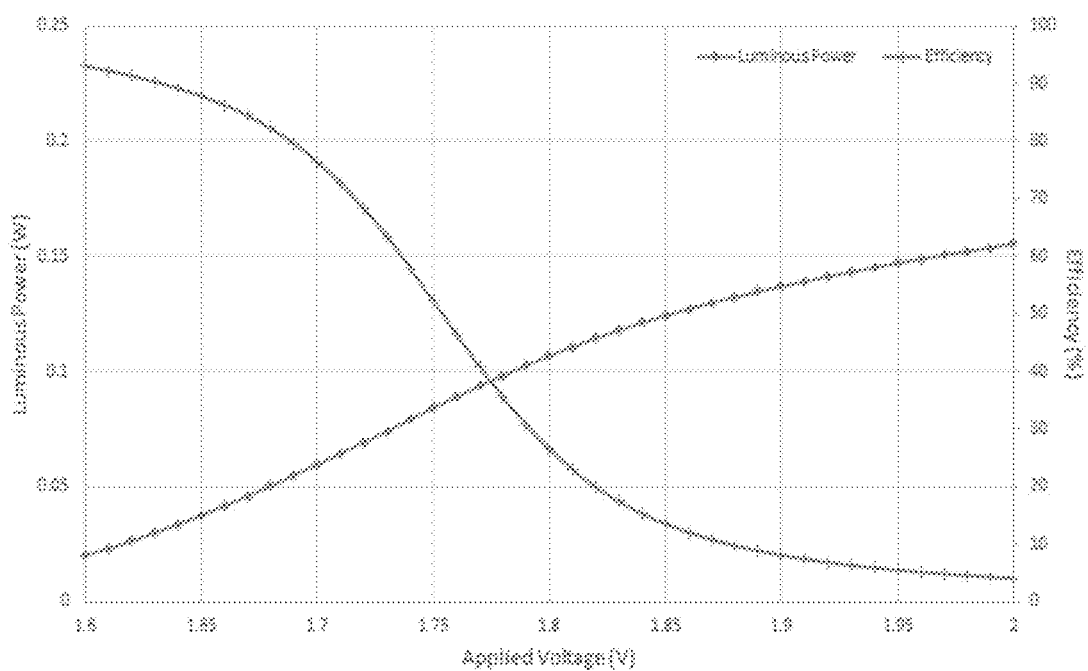
FIG. 29 depicts a luminous output power and efficiency of a single QW AlGaAs/GaAs LED.
Figure 30:
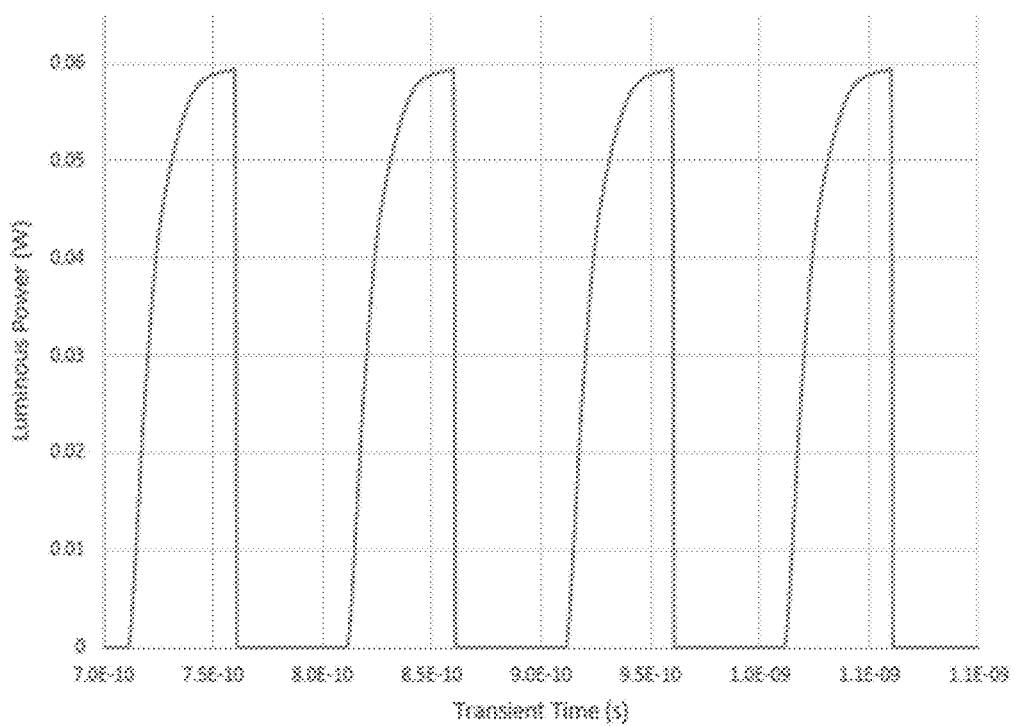
FIG. 30 depicts a 10 GHz transient response at 1.7 V of single QW AlGaAs/GaAs LED.
Figure 31:
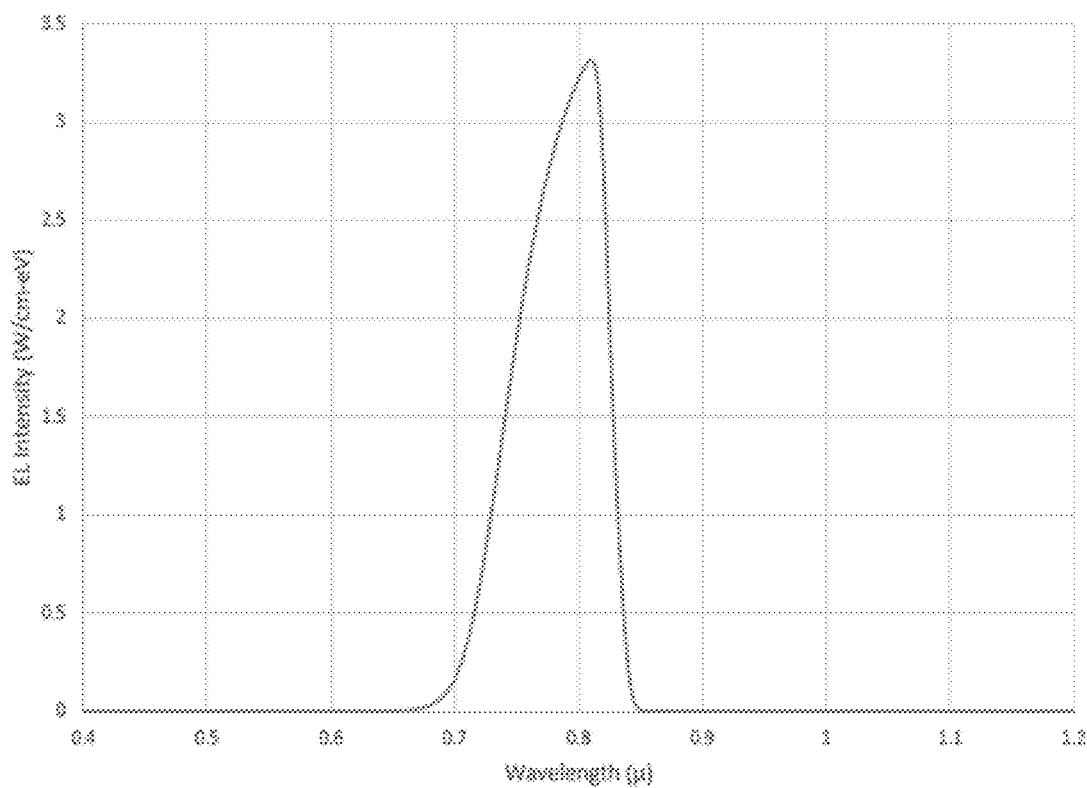
FIG. 31 depicts an emission spectra of single QW AlGaAS/GaAs LED.

AlGaAs/GaAs LED can be designed for ultra-high speed applications. FIG. 28 illustrates epitaxial stack diagram 2800 of an ultra-high speed single GaAs QW with AlGaAs barriers LED structure. TABLE 10 summarizes the design parameters of the AlGaAs/GaAs LED. The electron leakage from the QW into the confinement layers in the AlGaAs/GaAs structure is higher than the hole leakage due to the usually larger diffusion constant of electrons compared with holes in III-IV semiconductors. The carrier confinement in the GaAs QW can be improved by incorporating a p-doped wide band gap (AlGaAs) electron blocking layer (EBL) at the p-side barrier. The design parameters of the single QW AlGaAs/GaAs LED with EBL are illustrated in TABLE 11. Although the growth process of AlGaAs/GaAs material systems is simple, the disadvantage of using GaAs QW is that the light emitted from the active region is absorbed in the GaAs substrate which reduces the output optical efficiency of the AlGaAs/GaAs LED. FIG. 29 illustrates a graph 2900 of the luminous power and the (internal) efficiency of the single QW AlGaAs/GaAs LED. At 1.7 V the output luminous power is 60 mW and the efficiency is 76.4%. A 10 GHz transient response at 1.7 V of the single QW AlGaAs/GaAs LED is shown in graph 3000 of FIG. 30. The peak emission wavelength of the AlGaAs/GaAs LED is 810 nm which is shown in graph 3100 of FIG. 31.

Design parameters of single QW AlGaAs/GaAs LED are shown in TABLE 10.

TABLE 10

| Layer | Material | Percentage Composition | Thickness (Å) | Doping Type | Doping Concentration (cm$^{-3}$) |
|---|---|---|---|---|---|
| p+ contact layer | GaAs | — | 1000 | p.type | 4 × 10$^{19}$ |
| p layer | GaAs | — | 1000 | p.type | 2 × 10$^{19}$ |
| Barrier | AlGaAs | 45% Al | 30 | — | — |
| QW | GaAs | — | 70 | — | — |
| Barrier | AlGaAs | 35% Al | 30 | — | — |
| n layer | AlGaAs | 25% Al | 30 | n.type | 5 × 10$^{18}$ |
| n layer | AlGaAs | 25% Al | 1000 | n.type | 5 × 10$^{18}$ |
| n+ contact layer | GaAs | — | 10000 | n.type | 5 × 10$^{18}$ |

Design parameters of single QW AlGaAs/GaAs LED with EBL are shown in TABLE 10.

TABLE 11

| Layer | Material | Percentage Composition | Thickness (Å) | Doping Type | Doping Concentration (cm$^{-3}$) |
|---|---|---|---|---|---|
| p+ contact layer | GaAs | — | 1000 | p.type | 4 × 10$^{19}$ |
| p layer | AlGaAs | 45% Al | 1000 | p.type | 2 × 10$^{19}$ |
| Barrier | AlGaAs | 45% Al | 30 | — | — |
| QW | GaAs | — | 70 | — | — |
| Barrier | AlGaAs | 35% Al | 30 | — | — |
| n layer | AlGaAs | 25% Al | 30 | n.type | 5 × 10$^{18}$ |
| n layer | AlGaAs | 25% Al | 1000 | n.type | 5 × 10$^{18}$ |
| n+ contact layer | GaAs | — | 10000 | n.type | 5 × 10$^{18}$ |

Ultra-High Speed InGaN/GaN LED

Figure 32:
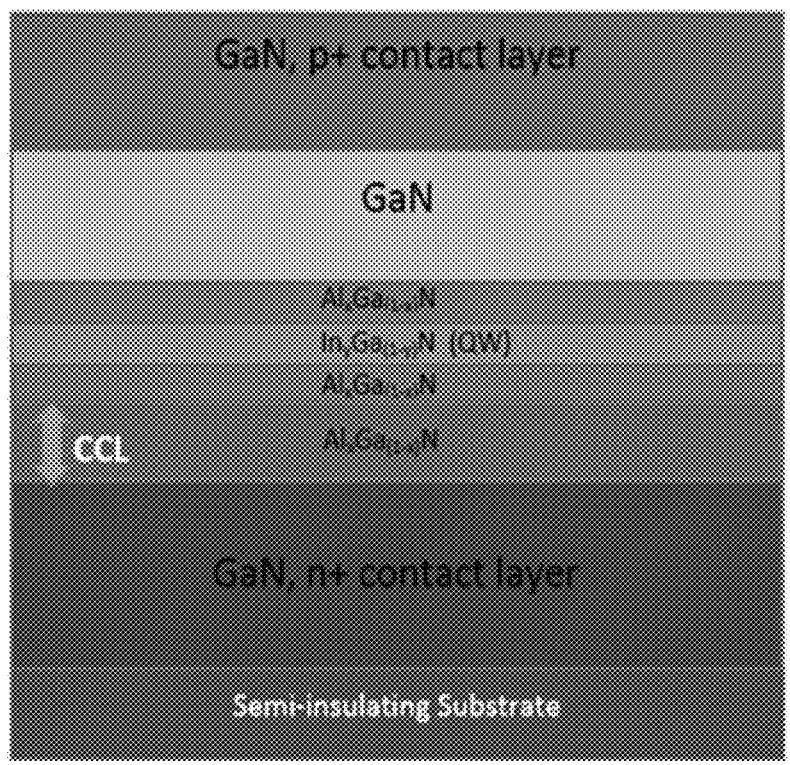
FIG. 32 depicts a single QW InGaN/AlGaN ultra-high speed LED.
Figure 33:
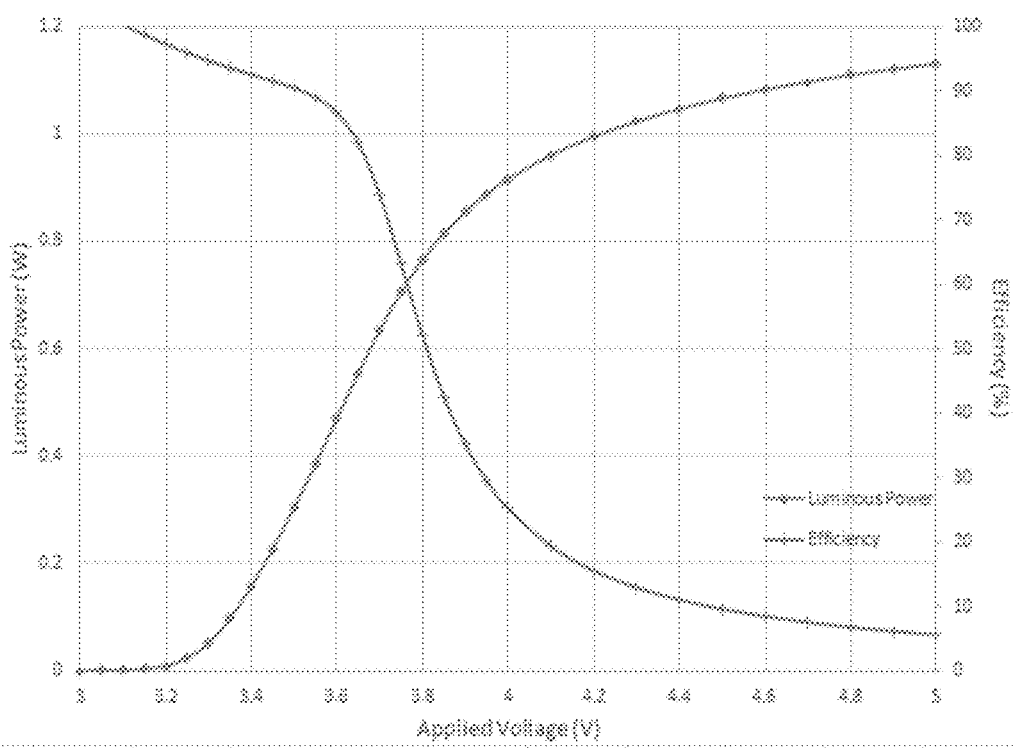
FIG. 33 depicts a luminous output power and efficiency of single QW InGaN/AlGaN LED.
Figure 34:
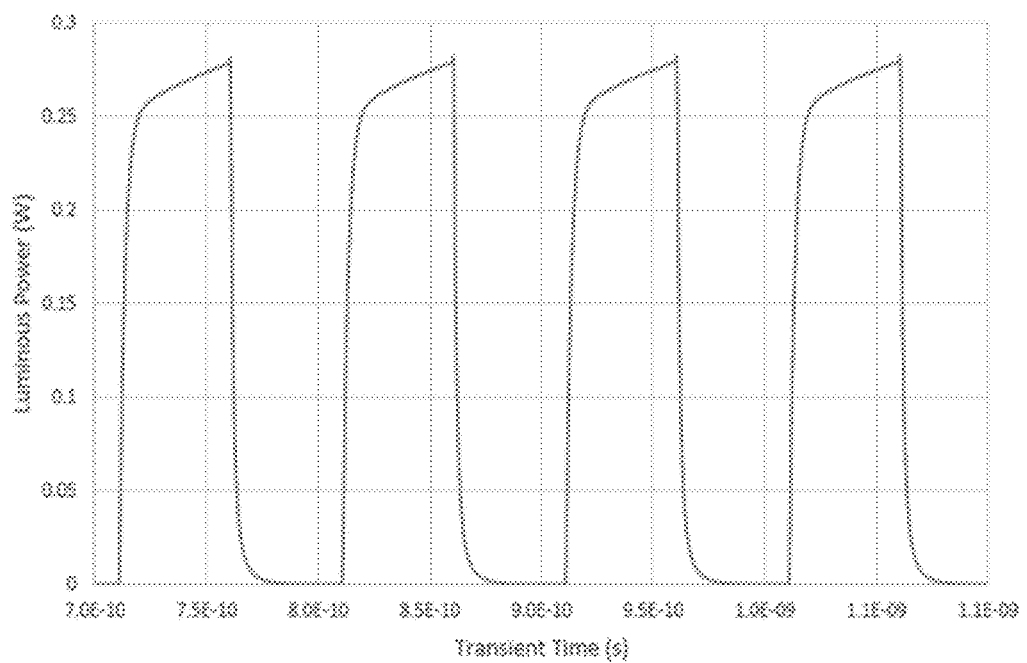
FIG. 34 depicts a 10 GHz transient response at 3.5 V of single QW InGaN/AlGaN LED.
Figure 35:
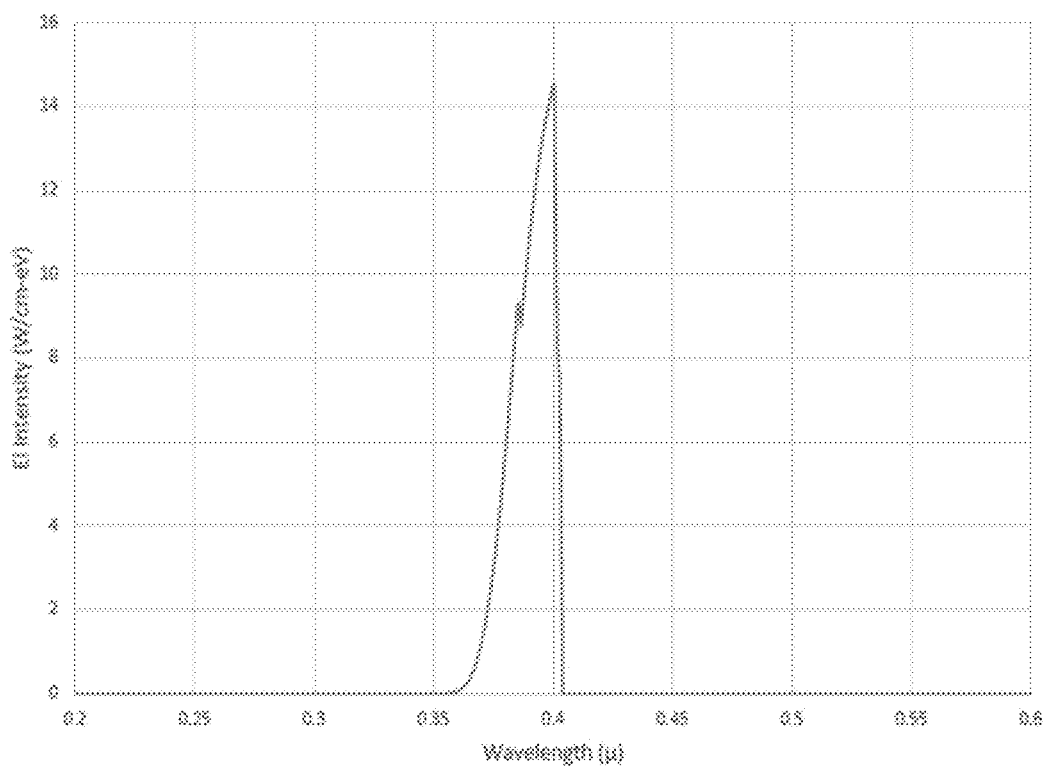
FIG. 35 depicts an emission spectra of single QW InGaN/AlGaN LED with 11% Indium composition in the InGaN QW. The peak emission wavelength is 0.4µ.
Figure 36:
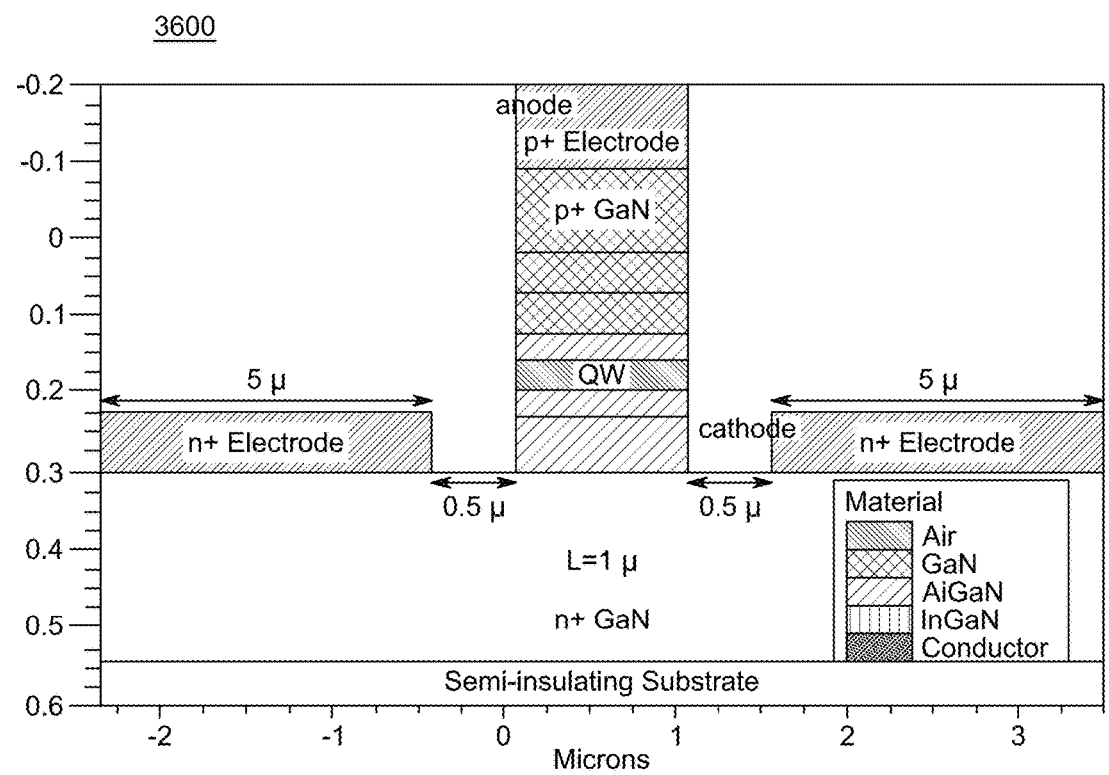
FIG. 36 depicts an example of single QW InGaN/AlGaN LED with 11% Indium composition in the InGaN QW. The distance between the n+ electrodes from the mesa is 0.5µ.
Figure 37:
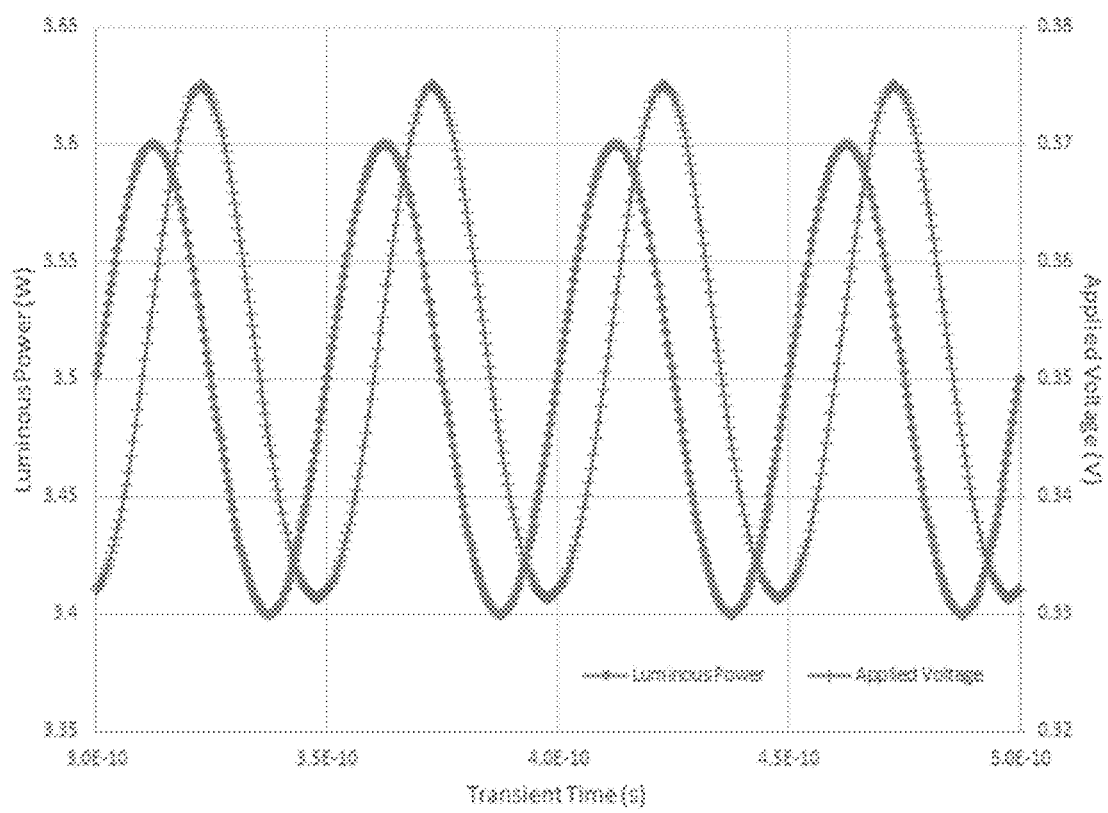
FIG. 37 depicts a 20 GHz sinusoidal response at 3.5 V of single QW InGaN/AlGaN LED shown in FIG. 36.
Figure 38:
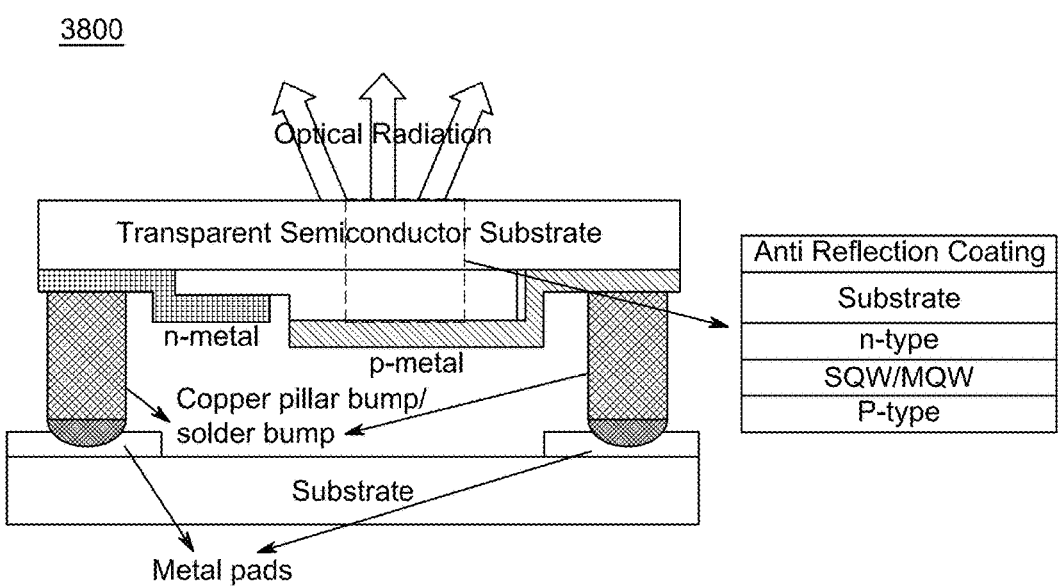
FIG. 38 depicts an illustration of a flip-chip GaN LED.

InGaN is the primary material for high brightness blue and green LEDs. Due to the large band offset in the InGaN/GaN material system a high radiative efficiency is observed despite the presence of a high concentration of threading dislocations in InGaN/GaN epitaxial films. These threading dislocations are due to the lattice mismatch between the commonly used sapphire and SiC substrates and the GaN and InGaN epitaxial films. Typical densities of the threading dislocations are in the range of 10$^7$-10$^9$ cm$^{-2}$. InGaN/GaN QW LEDs cover the wide range from the visible light to deep ultraviolet. For 11% Indium composition in InGaN QW, the peak emission wavelength is 450 nm which is in the visible range of the spectrum. The percentage of the Indium composition in the InGaN QW is significant in determining the speed of the InGaN/GaN LED. Less Indium composition (<10%) results in poor carrier confinement in the well region which decreases the radiative recombination rate and higher Indium composition (>15%) results in poor transient response due to increased band offset between the QW and barrier. Due to the inherent low mobilities of GaN material systems (400 cm$^2$V$^{-1}$s$^{-1}$ for electrons and 100 cm$^2$V$^{-1}$s$^{-1}$ for holes) the thickness of the layers is reduced for improving the transient response of the InGaN/GaN LED. An epitaxial structure 3200 of InGaN/GaN LED designed for ultra-high speed operation is shown in FIG. 32. The percentage of Indium composition in the InGaN QW is 11% with AlGaN (20% Al) barriers. The luminous output power and efficiency versus the anode voltage of the single QW InGaN/GaN LED is shown in graph 3300 of FIG. 33. The luminous output power and efficiency of the device at 3.5 V are 304 mW and 90% respectively. TABLE 12 lists the values of luminous output power and efficiency of the single QW InGaN/GaN LED for different voltage levels. The luminous output power and efficiency of the InGaN/GaN devices are higher than that of the GaAs based LEDs. A graph 3400 of the 10 GHz transient response at 3.5 V and a graph 3500 of the emission spectrum of the InGaN/GaN LED with 11% Indium in the InGaN QW are shown in FIG. 34 and FIG. 35 respectively. The peak emission wavelength for 11% Indium in the InGaN QW is 400 nm. The peak emission wavelength can be stretched to the blue region of the spectrum by increasing the Indium composition in the InGaN QW. But increasing the Indium composition in the InGaN QW results in larger band offsets thus deteriorating the transient performance of the LED. For higher Indium percentage (20% In) in the QW, the speed of the LED can be improved by replacing the wide band-gap p-side AlGaN barrier with GaN. The peak emission wavelength for this structure is 435 nm. TABLE 13 and 11 summarize the design parameters of the ultra-high speed InGaN/GaN LEDs. Wide band gap InAlN layer with 17% Indium can be incorporated at both the "p" and "n" side barriers as EBL/CCL to improve the carrier confinement in the QW region. At 17% Indium composition InAlN is lattice matched to GaN. The transient performance of the InGaN/GaN LED with 11% Indium composition in the InGaN QW is improved by reducing the distance between the n+ electrode and the mesa from 1μ to 0.5μ as shown in epitaxial diagram 3600 of FIG. 36. The 20 GHz optical response to sinusoidal voltage waveform of the LED structure is shown in graph 3700 of FIG. 37. It is difficult to obtain high p+ doping in GaN. Due this constraint, the p+ electrode is spread across the entire p+ contact layer for better current spreading and light is extracted from the backside of the device using flip-chip technology as shown in diagram 3800 of FIG. 38.

A comparison of luminous power and efficiency of InGaN/AlGaN LED with 11% Indium in the InGaN QW is shown in TABLE 12.

TABLE 12

| Voltage level (V) | Luminous Power (mW) | Efficiency |
|---|---|---|
| 3.3 | 51.5 | 94.7% |
| 3.5 | 304 | 90.5% |
| 3.7 | 635 | 74% |
| 3.8 | 760 | 52% |
| 4.0 | 915 | 25% |

Design parameters of InGaN/AlGaN LED with 11% Indium composition in the InGaN QW are shown in TABLE 13.

TABLE 13

| Layer | Material | Percentage Composition | Thickness (Å) | Doping Type | Doping Concentration ($cm^{-3}$) |
|---|---|---|---|---|---|
| p+ contact layer | GaN | — | 100 | p.type | $5 \times 10^{18}$ |
| p layer | GaN | — | 100 | p.type | $1 \times 10^{18}$ |
| Barrier | AlGaN | 20% Al | 35 | — | — |
| QW | InGaN | 11% In | 70 | — | — |
| Barrier | AlGaN | 20% Al | 30 | — | — |
| n layer | AlGaN | 30% Al | 30 | n.type | $2 \times 10^{19}$ |
| n+ contact layer | GaN | — | 10000 | n.type | $2 \times 10^{19}$ |

Design parameters of InGaN/AlGaN LED with 20% Indium composition in the InGaN QW are shown in TABLE 14.

TABLE 14

| Layer | Material | Percentage Composition | Thickness (Å) | Doping Type | Doping Concentration ($cm^{-3}$) |
|---|---|---|---|---|---|
| p+ contact layer | GaN | — | 100 | p.type | $5 \times 10^{18}$ |
| p layer | GaN | — | 100 | p.type | $1 \times 10^{18}$ |
| Barrier | GaN | — | 35 | — | — |
| QW | InGaN | 20% In | 70 | — | — |
| Barrier | GaN | — | 30 | — | — |
| n layer | AlGaN | 20% Al | 30 | n.type | $2 \times 10^{19}$ |
| n+ contact layer | GaN | — | 10000 | n.type | $2 \times 10^{19}$ |

Ultra-High Speed InGaSb/AlGaSb LED

Figure 39:
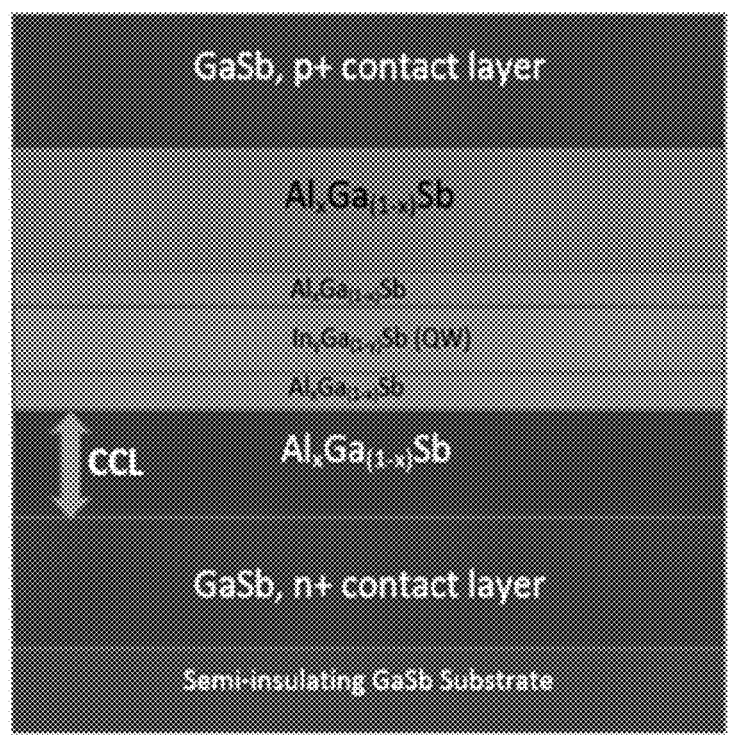
FIG. 39 depicts an ultra-high bandwidth InGaSb/AlGaSb LED structure.

Most of the infrared light is absorbed by water vapor and carbon dioxide of earth's atmosphere. The earth's atmosphere causes another problem in the infrared transmission, the atmosphere itself radiates strongly in the infrared, often putting out more infrared light that the emitter. In the infrared window of 0.8μ-1.2μ wavelength, the atmospheric absorption is less and emission is low and in the range of 1.5μ-2.4μ wavelength the atmospheric absorption is less and emission is very low. Therefore, for long distance wireless backhaul, using carrier wavelength in the range of 1.5μ-2.4μ will be more advantageous. The peak emission wavelength of InGaSb/AlGaSb LEDs is in the range of 1.4μ-2.0μ. By selecting the proper Indium composition in the InGaSb QW, the peak emission wavelength is optimized. The carriers are confined in the narrow band gap (~0.65 eV) InGaSb QW by sandwiching it between wide band gap (~1.3 eV) AlGaSb barriers. The LED device is grown on GaSb substrate. An epitaxial structure 3900 of the ultra-high speed InGaSb/AlGaSb LED is shown in FIG. 39. TABLE 15 lists the design parameters of the InGaSb/AlGaSb LED.

Figure 40:
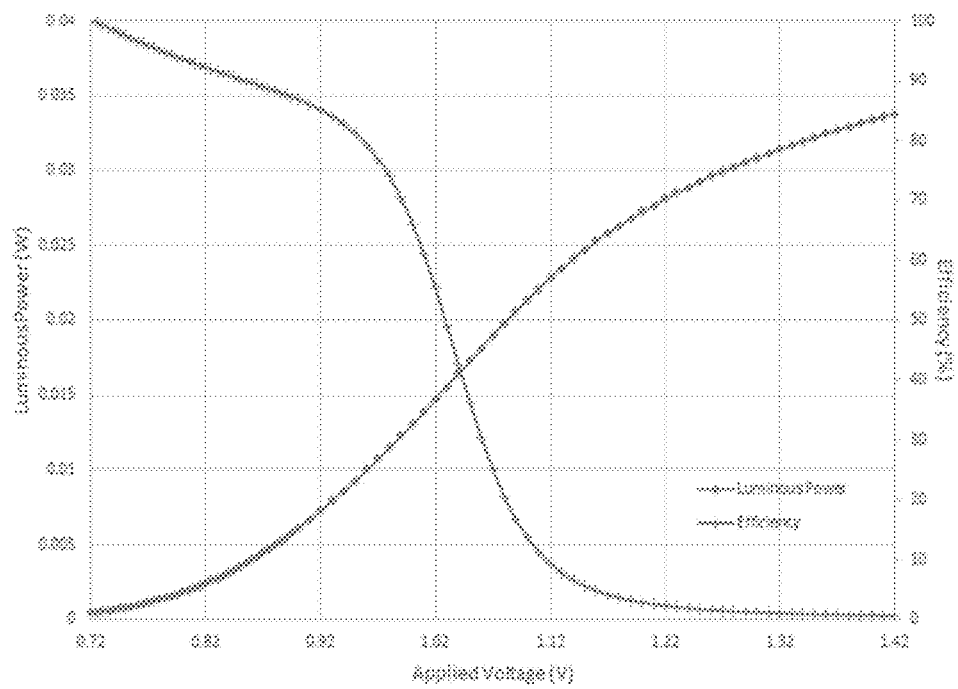
FIG. 40 depicts a luminous output power and efficiency of single QW InGaSb/AlGaSb LED.
Figure 41:
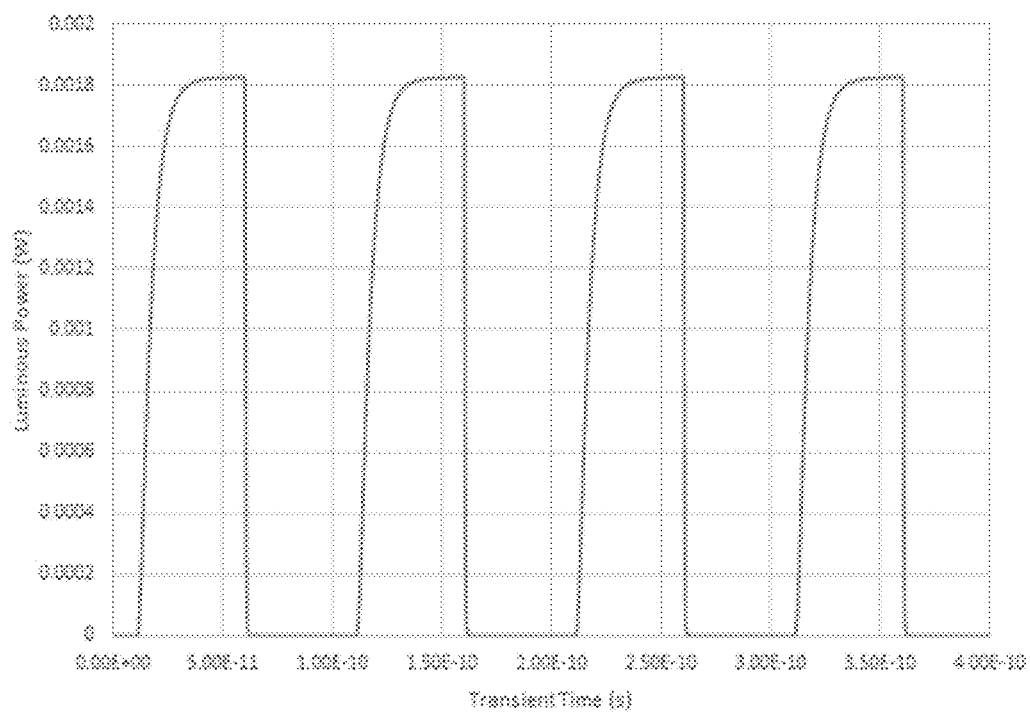
FIG. 41 depicts a 10 GHz transient response at 0.8 V of single QW InGaSb/AlGaSb LED.
Figure 42:
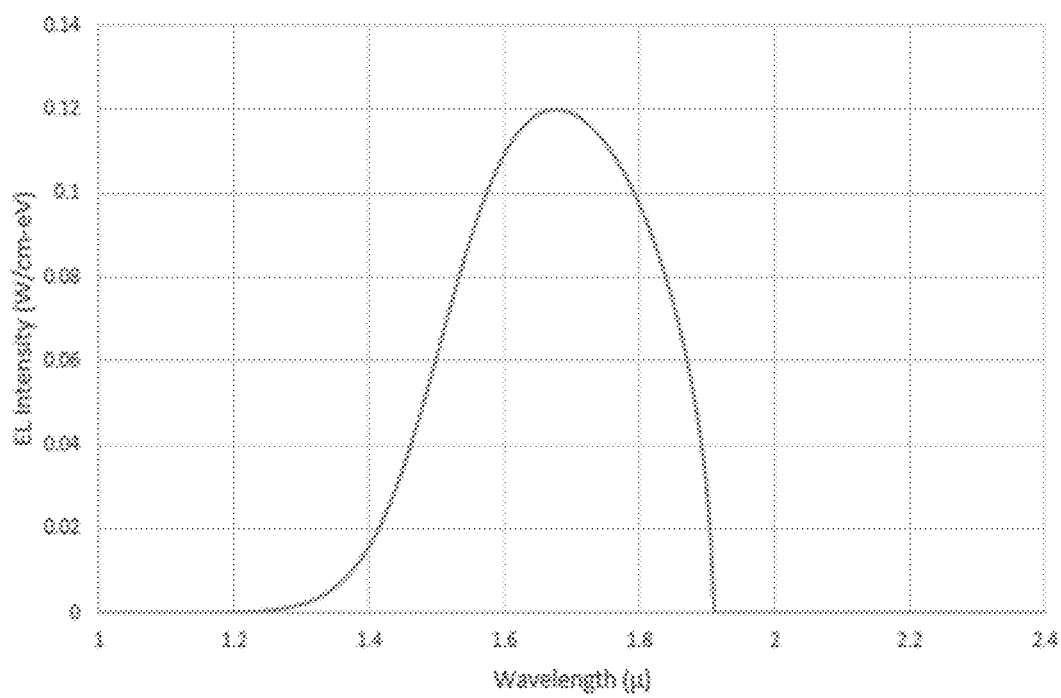
FIG. 42 depicts an emission spectra of single QW InGaSb/AlGaSb LED with 25% Indium composition in the InGaSb QW. The peak emission wavelength is 1.68µ.

The luminous output power and efficiency versus the applied voltage of the single QW InGaSb/AlGaSb LED is shown in graph 4000 of FIG. 40. The luminous output power and efficiency of the device at 0.8 V are 1.8 mW and 93.6% respectively. TABLE 16 lists the values of luminous output power and efficiency of the single QW InGaSb/AlGaSb LED for different voltage levels. The 10 GHz transient response at 0.8 V of InGaSb/AlGaSb LED is shown in graph 4100 of FIG. 41. The InGaSb/GaSb emission spectrum is shown in graph 4200 of FIG. 42. The peak emission wavelength is 1.68μ. This wavelength falls in the sweet spot of the infrared atmospheric window where the atmospheric absorption and emission are minimal. Design parameters of ultra-high speed InGaSb/AlGaSb LED are shown in TABLE 15.

TABLE 15

| Layer | Material | Percentage Composition | Thickness (Å) | Doping Type | Doping Concentration ($cm^{-3}$) |
|---|---|---|---|---|---|
| p+ contact layer | GaSb | — | 500 | p.type | $4 \times 10^{19}$ |
| p layer | AlGaSb | 35% Al | 500 | p.type | $3 \times 10^{19}$ |
| Barrier | AlGaSb | 35% Al | 35 | — | — |
| QW | InGaSb | 25% In | 70 | — | — |
| Barrier | AlGaSb | 45% Al | 35 | — | — |
| n layer | AlGaSb | 45% Al | 600 | n.type | $3 \times 10^{19}$ |
| n+ contact layer | GaSb | — | 5000 | n.type | $3 \times 10^{19}$ |

A comparison of luminous power and efficiency of InGaSb/AlGaSb LED with 25% Indium composition in the InGaSb QW is shown in TABLE 16.

TABLE 16

| Voltage level (V) | Luminous Power (mW) | Efficiency |
|---|---|---|
| 0.8 | 1.80 | 93.6% |
| 0.9 | 6.06 | 86.9% |
| 1.0 | 13.1 | 66.0% |

Ultra-High Speed Photodetector
Ultra-High Speed MQW Photodetector

Photodetectors convert optical signals into electrical signals. When light is incident on a semiconductor excess electrons and holes are generated which increases the conductivity of the material. This change in the conductivity upon light incidence is the basis of the photodetector. A photodetector is a p-i-n junction diode operated in the reverse bias mode. If the electrons and holes are generated within the space charge depletion region of the p-i-n diode, then they will be separated by the electric field and a current will be produced. But if the carriers are generated in the diffusion region, they will be recombined with the majority carriers in the region resulting in poor efficiency of the photodetector. The photo-generation in the diffusion region will also degrade the transient performance of the device due to the slow time-constant related to the minority carrier recombination. In the case of MQW structure, it is very important that the QW regions are completely depleted. The QW layers are undoped and act as i-layer, so at zero bias all the QW layers are depleted. But when light is shone on the device due to the generation of carriers the QWs close to the side of light incidence become undepleted. The applied reverse bias voltage should be such that the entire active region of the device is depleted.

Figure 43:
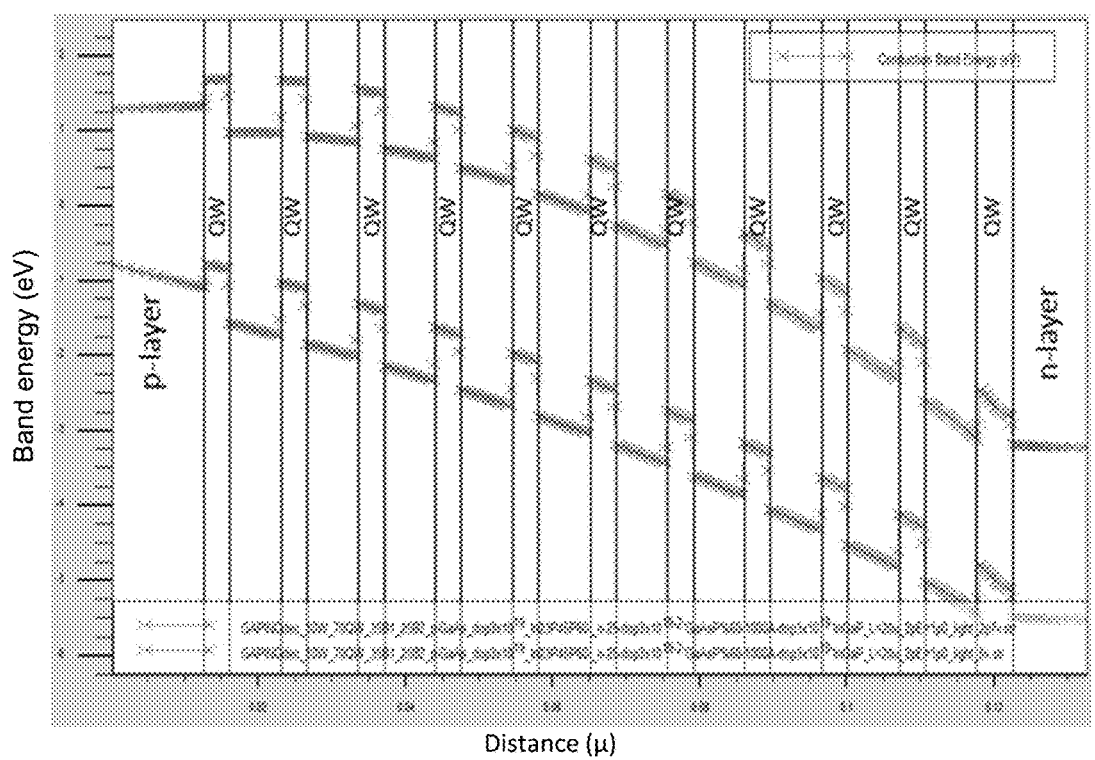
FIG. 43 depicts a conduction band diagram of 10 QW InGaAs/GaAsP photodetector at 2.7 V and 5 V reverse bias.
Figure 44:
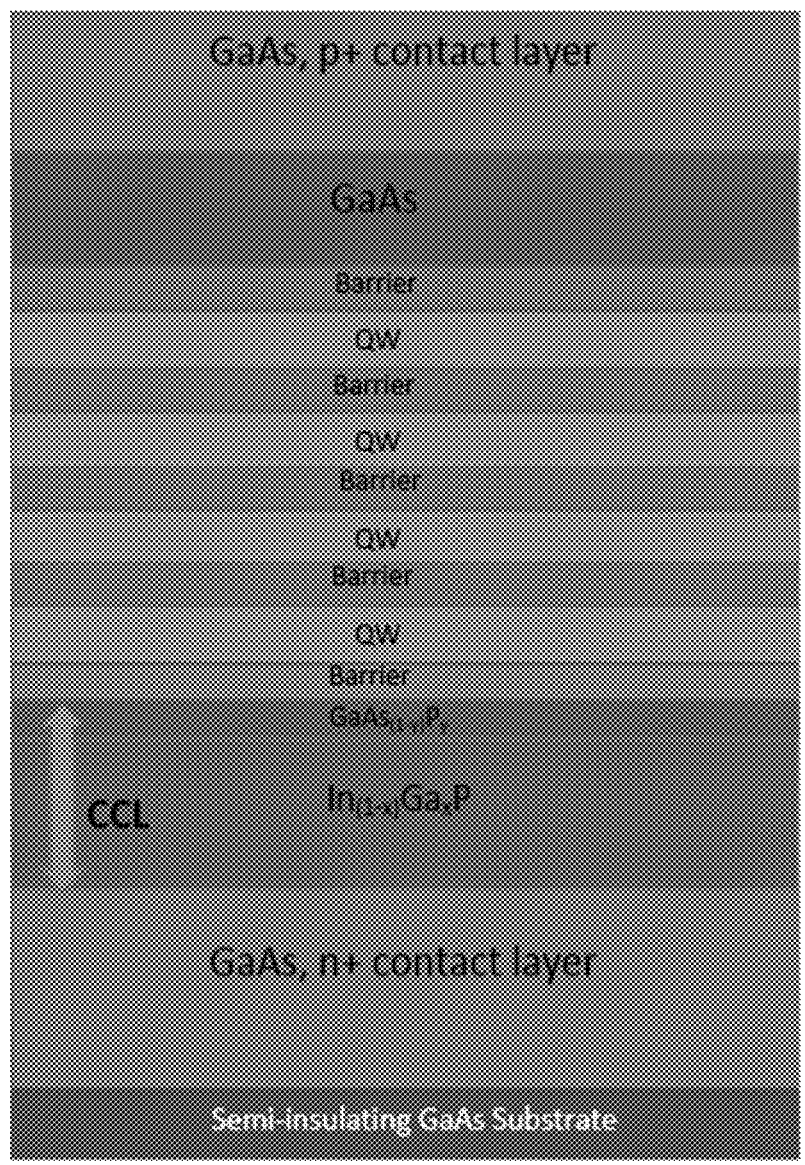
FIG. 44 depicts an ultra-high speed 4 QW GaAs based photodetector structure.
Figure 45:
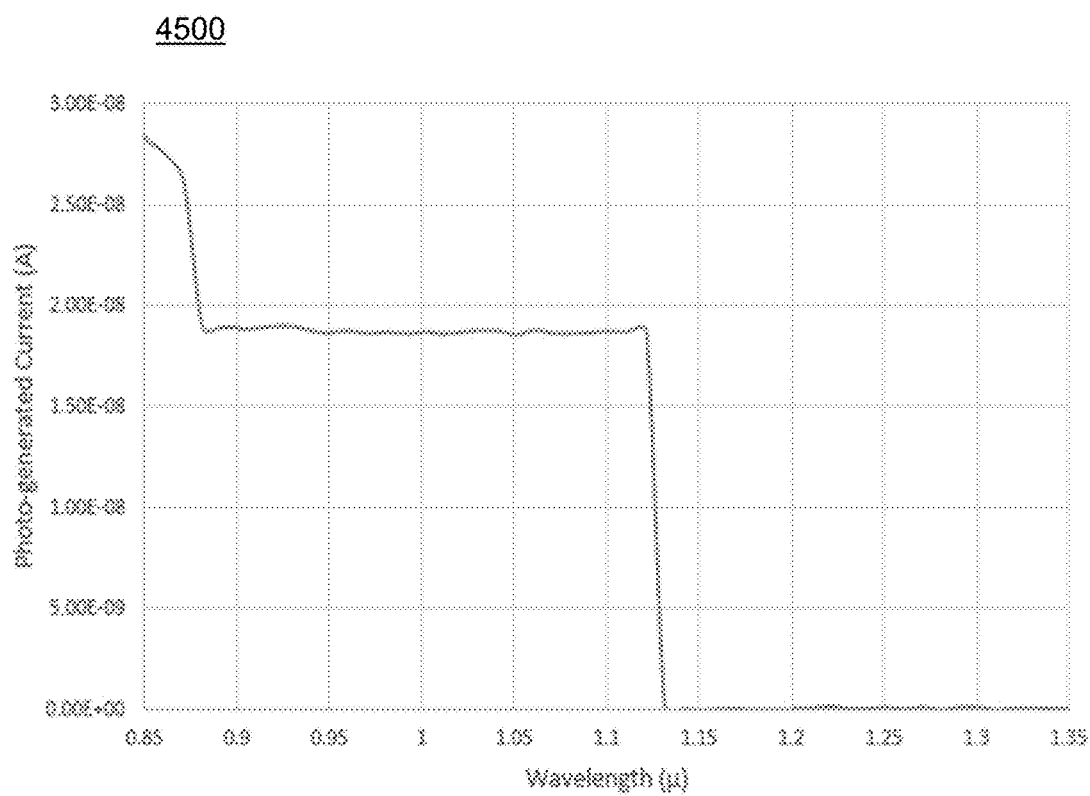
FIG. 45 depicts generated current versus wavelength of 4 QW InGaAs/GaAsP detector of L=20µ at 2.7 V. The cutoff wavelength is 1.12 µm.

Ultra-high speed photodetectors are designed using multiple quantum wells (MQW) GaAs based structures. The concentration of the photo-generated carriers can be increased by increasing the number of quantum wells. The typical operating voltage for most ultra-high speed applications is ~2.7 V (USB 3.0 specification). FIG. 43 illustrates a conduction band diagram 4300 of a ten QW layer structure at 2.7 and 5 volts reverse bias. For the given structure at 2.7 V, 450 Å of i-layer is depleted. 4 QWs each of 70 Å and 5 barriers each of 35 Å can be included in a region of 450 Å. Photodetector structures with more than 4 QWs must be operated at higher than 2.7V reverse bias to obtain higher speed and efficiency of the device. FIG. 44 illustrates a diagram of a four QW layer InGaAs/GaAs photodetector epitaxial structure 4400. The photodetector design parameters are summarized in TABLE 17. For 23% Indium composition in the InGaAs QW, the photodetector cutoff wavelength is 1.12µ as shown in graph 4500 of FIG. 45. The light of wavelength 998 nm emitted from the LED with 23% Indium composition in the QW will be absorbed to generate electrons and holes.

An example of the four QW InGaAs/GaAs ultra-high speed photodetector design is shown in TABLE 17.

TABLE 17

| Layer | Material | Percentage Composition | Thickness (Å) | Doping Type | Doping Concentration (cm$^{-3}$) |
|---|---|---|---|---|---|
| p+ contact layer | GaAs | — | 1000 | p.type | $4 \times 10^{19}$ |
| p layer | GaAs | — | 1000 | p.type | $2 \times 10^{19}$ |
| Barrier | GaAsP | 45% P | 35 | — | — |
| QW | InGaAs | 23% In | 70 | — | — |
| Barrier | GaAsP | 45% P | 35 | — | — |
| QW | InGaAs | 23% In | 70 | — | — |
| Barrier | InGaP | 45% P | 35 | — | — |
| QW | InGaAs | 23% In | 70 | — | — |
| Barrier | InGaP | 45% P | 35 | — | — |
| QW | InGaAs | 23% In | 70 | — | — |
| Barrier | GaAsP | 60% P | 30 | — | — |
| n layer | GaAsP | 60% P | 30 | n.type | $5 \times 10^{18}$ |
| n layer | InGaP | 48.5% In | 1000 | n.type | $5 \times 10^{18}$ |
| n+ contact layer | GaAs | — | 10000 | n.type | $5 \times 10^{18}$ |

For the 4 QWs InGaAs/GaAsP photodetector, the photo-generated current is in the range of $2 \times 10^{-4}$ Acm$^{-2}$. The photo-generated current is increased to higher levels by increasing the device area and also by using multiple fingers. A single QW and 10 QWs InGaAs/GaAsP photodetector are also designed. The single QW photodetector will give excellent transient performance The 10 QW photodetector is operated at higher reverse bias voltage (>5 V) to deplete the entire active region of the device. TABLE 18 shows the photo-generated current under 10 GHz transient response for 1, 4, 10 and 20 QW structures.

TABLE 18

| Number of QWs | Photo-generated current (Acm$^{-2}$) | Operating Voltage (V) |
|---|---|---|
| 1 | $5 \times 10^{-5}$ | 2.7 (or lesser) |
| 4 | $2 \times 10^{-4}$ | 2.7 |
| 10 | $5 \times 10^{-4}$ | 5 |
| 20 | $1 \times 10^{-3}$ | 10 |

Figure 46:
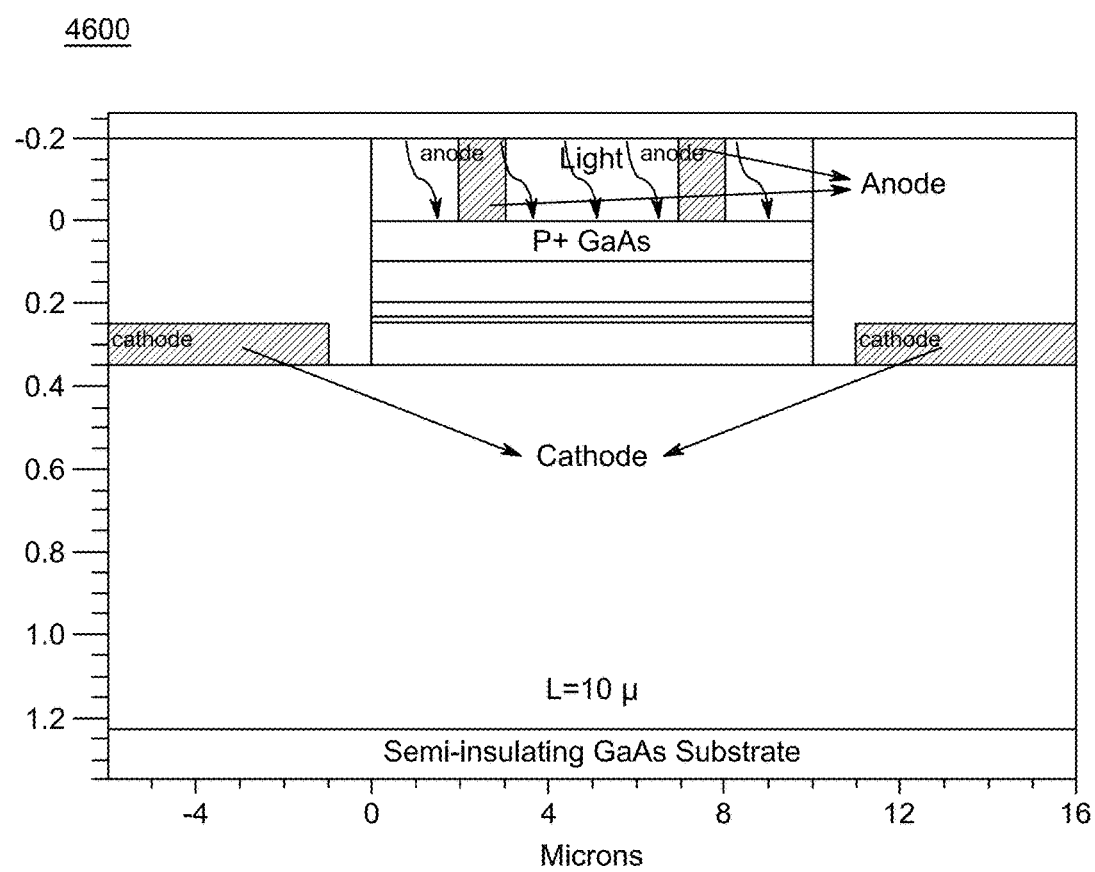
FIG. 46 depicts an ultra-high speed 4 QW InGaAs/GaAsP photodetector of 10 length with two p+ electrodes on top each of 1 µm.
Figure 47:
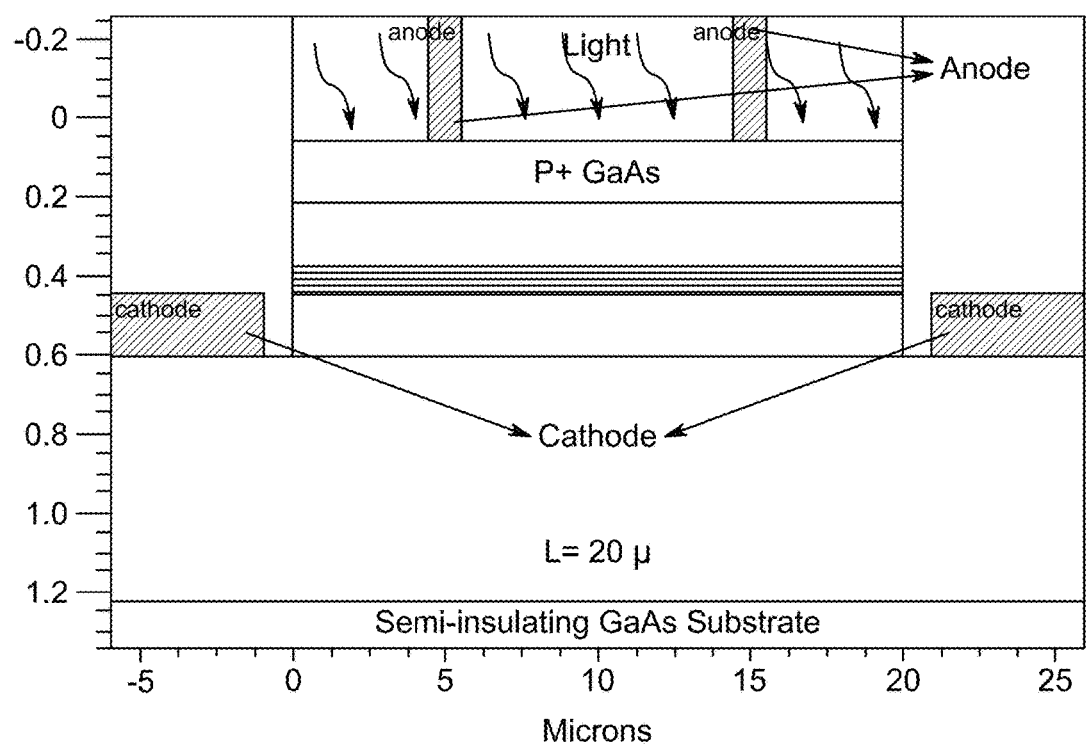
FIG. 47 depicts an ultra-high speed 4 QW InGaAs/GaAsP photodetector of 20µ length with two p+ electrodes on top each of 1 µm.
Figure 48:
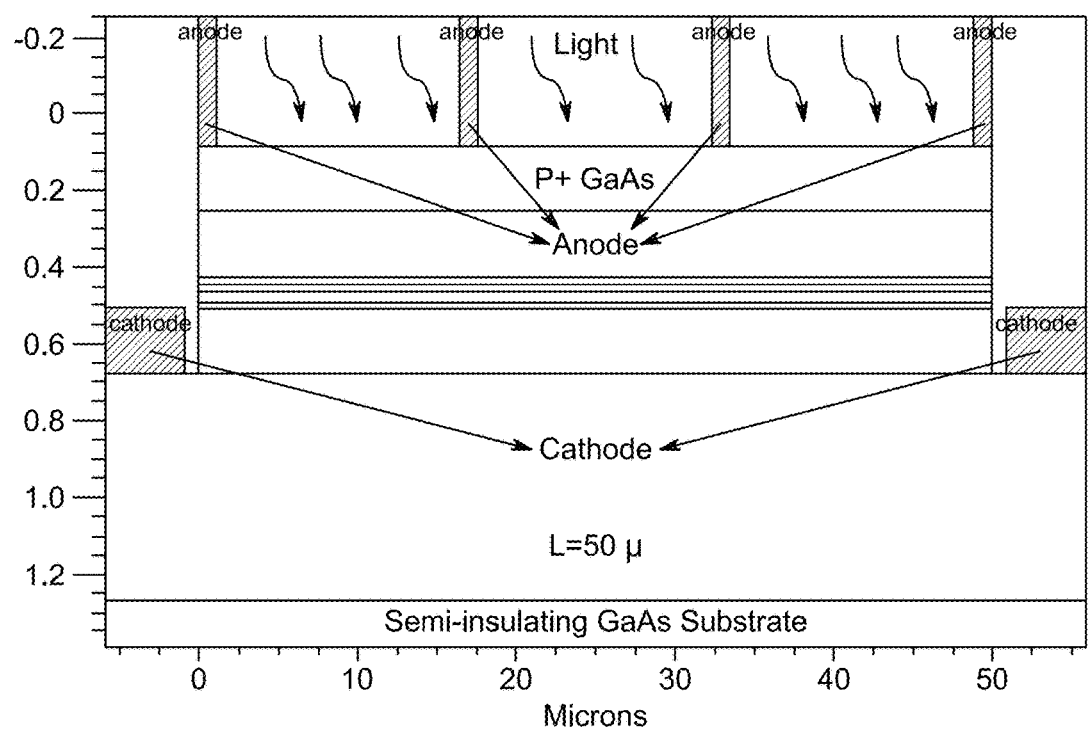
FIG. 48 depicts an ultra-high speed 4 QW InGaAs/GaAsP photodetector of 50µ length with four p+ electrodes on top each of 1 µm.
Figure 49:
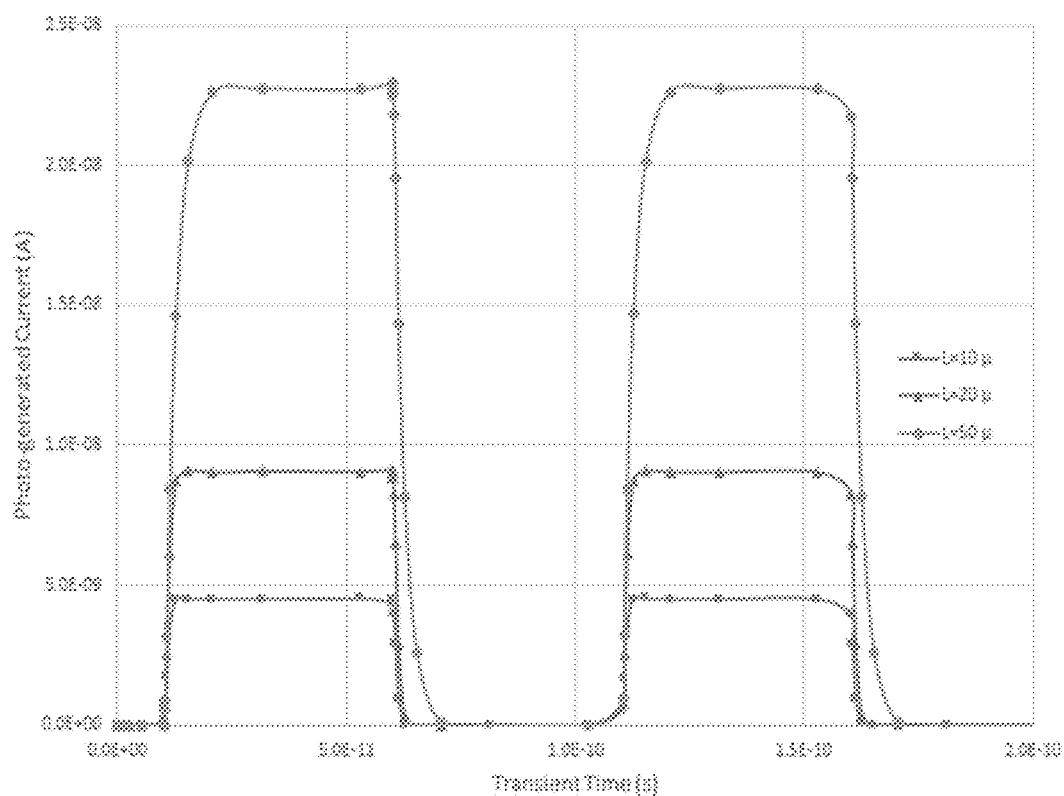
FIG. 49 depicts a generated photo-current at 10 GHz transient response at 2.7 V for single QW InGaAs/GaAsP photodetector of lengths 10µ, 20µ and 50µ.

Due to the low photo-generated current density in the device, the current spreading in the p+ layer which depends on the number of p+ electrodes and the spacing between them does not degrade the transient performance of the photodetector unlike the LED. A photodetector of length 10µ is shown in epitaxial structure 4600 of FIG. 46. A photodetector of length 20µ is shown in epitaxial structure 4700 of FIG. 47 and a photodetector of length 50µ is shown in epitaxial 4800 of FIG. 48. For the 10µ and 20µ devices, two p+ electrodes each of 1µ length are connected on the top surface of the device and for the 50µ device four p+ electrodes each of 1µ are connected to the p+ layer. In one design 3 p+ electrodes are incorporated for (L=) 20µ device. Two n+ electrodes each of 5µ length are connected to the n+ layer with 1µ spacing from the mesa. TABLE 19 shows the electrode design parameters of different device lengths of InGaAs/GaAsP photodetector. A comparison of the generated photo-current at 10 GHz transient responses at 2.7 V for single QW InGaAs/GaAsP photodetector of lengths 10µ, 20µ and 50µ is shown in graph 4900 of FIG. 49.

TABLE 19

| Device length (µ) | Number of p+ electrodes | Length of p+ electrodes (µ) | Number of n+ electrodes | Length of n+ electrodes (µ) |
|---|---|---|---|---|
| 10 | 2 | 1 | 2 | 5 |
| 20 | 2 | 1 | 2 | 5 |
| 50 | 4 | 1 | 2 | 5 |

Ultra-High Speed GaN Based Photodetector

Figure 50:
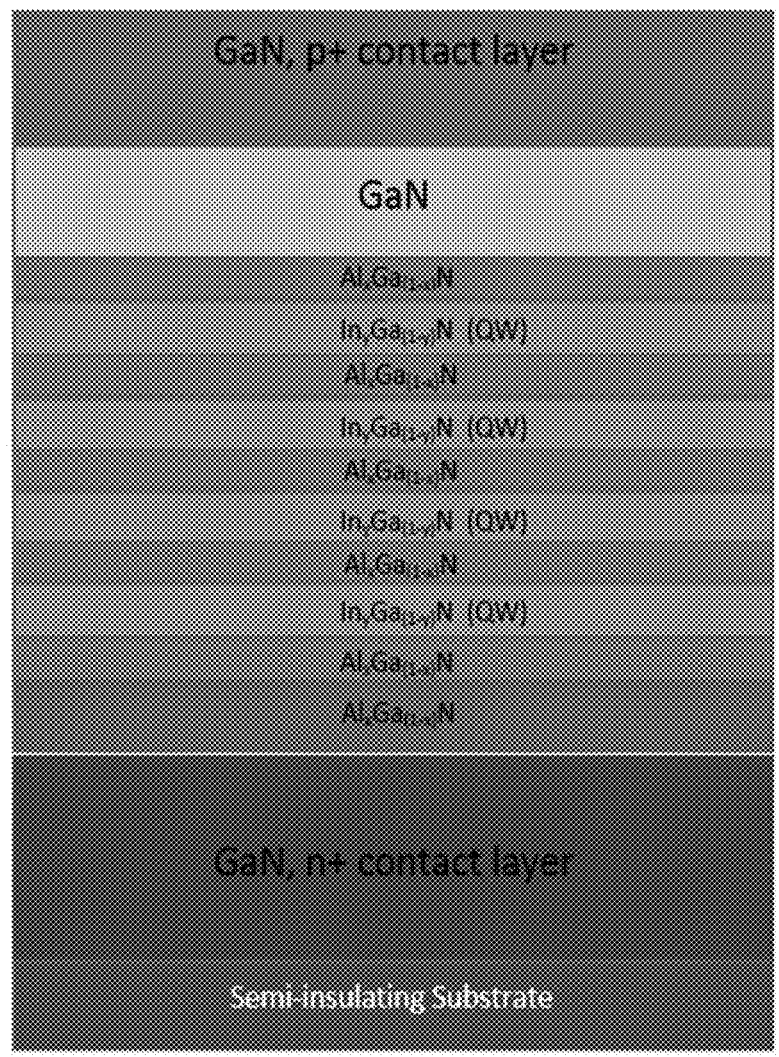
FIG. 50 depicts an ultra-high speed MQW InGaN/AlGaN photodetector.

MQW GaN based photodetector can be used in ultra-high speed telecommunication. An epitaxial structure 5000 of the ultra-high speed InGaN/AlGaN photodetector design is shown in FIG. 50. The number of QWs can be increased to increase the photo-generated current. The percentage Indium composition is increased to 30% and the AlGaN barriers are replaced to GaN to detect the signal emitted from the InGaN/GaN LED with 20% Indium composition in the QW.

Ultra-High Speed InGaSb/GaSb Photodetector

Figure 51:
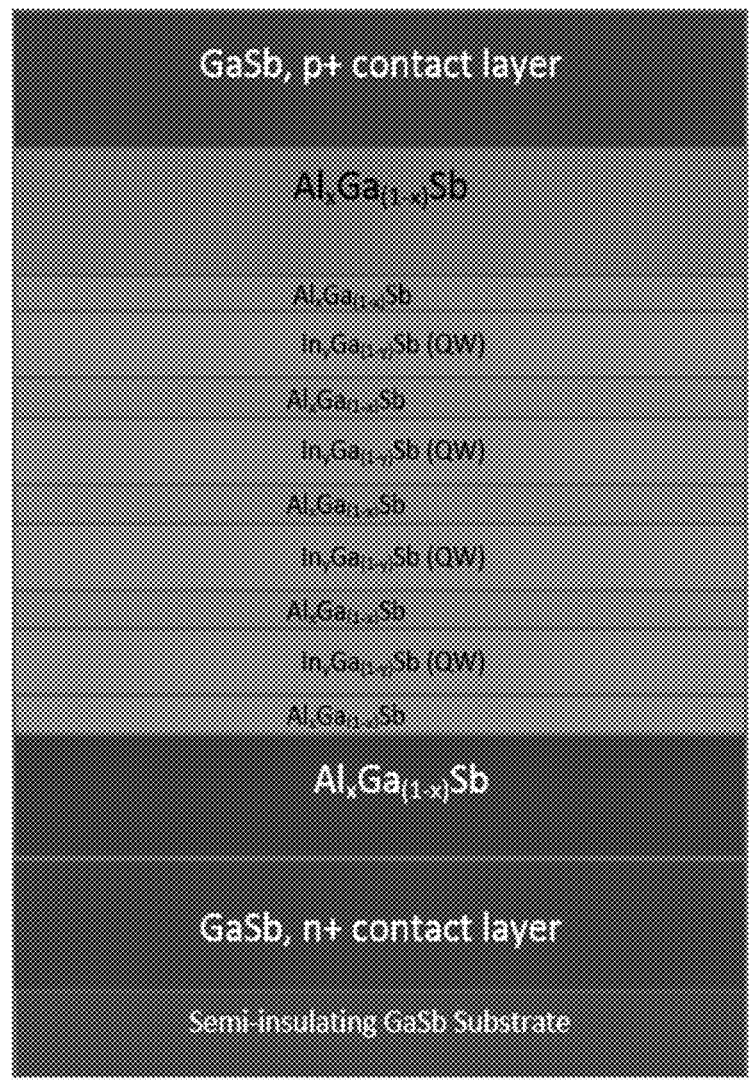
FIG. 51 depicts an ultra-high speed MQW InGaSb/AlGaSb photodetector.

MQW InGaSb/GaSb photodetector can detect infrared signals in the wavelength range of 1.4µ to 2.0µ. An epitaxial structure 5100 of the ultra-high bandwidth InGaSb/GaSb photodetector is shown in FIG. 51. The number of QWs can be increased to increase the photo-generated current.

Ultra-High Speed Integrated LED and Photodetector

Figure 52:
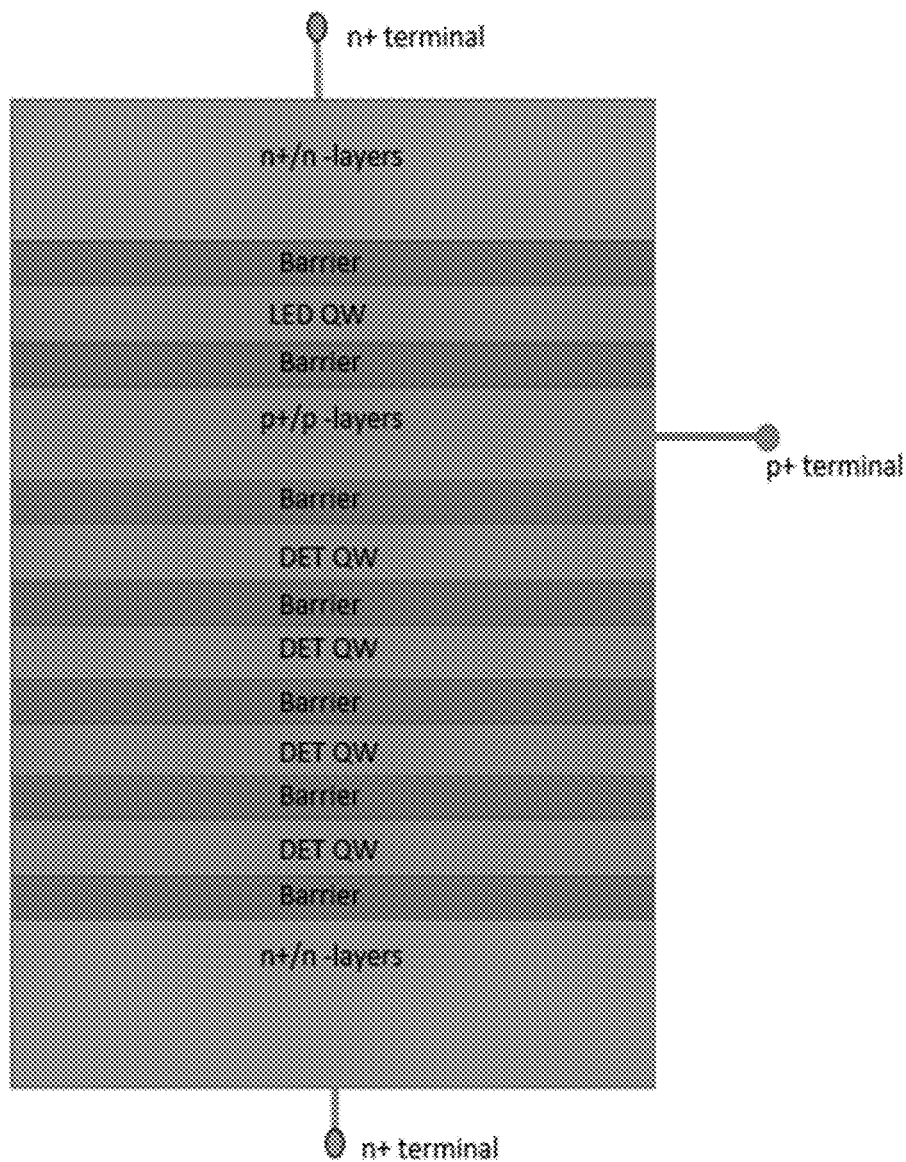
FIG. 52 depicts an LED and photodetector integrated in one device. P+ terminal is common to both LED and detector.
Figure 53:
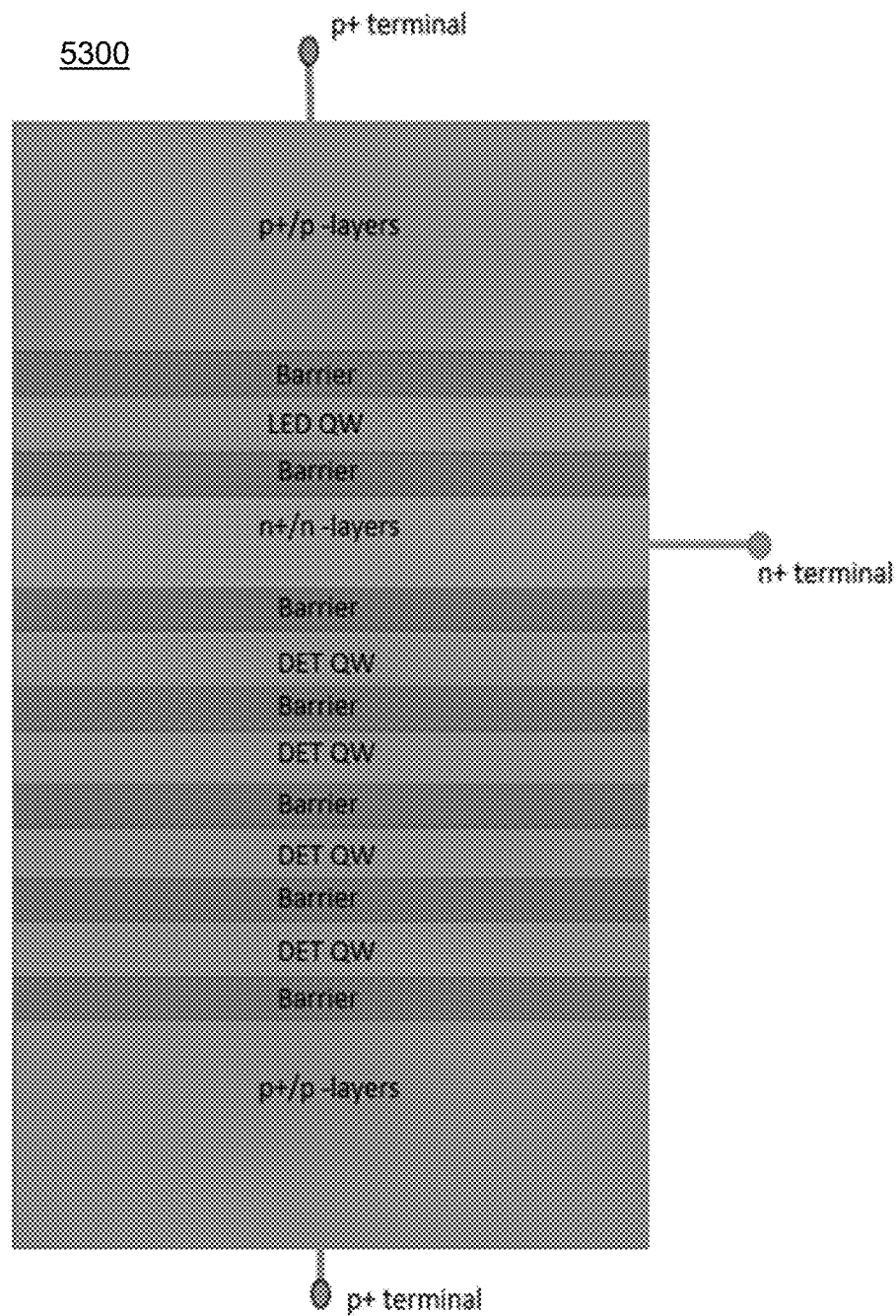
FIG. 53 depicts an LED and photodetector integrated in one device. n+ terminal is common to both LED and detector.

The LED and the photodetector have similar structures. MQW device structures can be used as LED in the forward bias mode and as a photodetector in the revise bias mode. The LED can be integrated into a single three terminal device 5200 as shown in FIG. 52. The photodetector can be integrated into single three terminal device 5300 as shown in FIG. 53. The single QW LED sits on top of the MQW detector. Since the signal to be detected is emitted from the smaller band gap materials (InGaAs/InGaN) compared to the substrate materials (GaAs/GaN), it is transparent to the 'n' and 'p' layers of the LED and very minimum absorption takes place in the single QW of the LED. The light to be detected is shone on the top surface of the device and the absorption takes place in the QWs of the detector which generates (photo) current in the device.

Novel Ultra-High Speed Wireless Communication Using LED Wavelength Modulation Technique To achieve higher sensitivity of detection than by using amplitude modulation, wavelength modulation technique is applied using InGaAs/GaAsP, InGaSb/AlGaSb and InGaN/AlGaN LEDs and photodetectors. The wavelength of single QW LED can be modulated by biasing the device at different voltages. At low bias the carriers fill up the low energy levels and the peak emission wavelength corresponds to the band gap energy. With increasing bias the injection of the carriers increases in the QW and the carriers occupy the higher energy levels. The peak emission spectra at higher biases shifts to lower wavelengths. Therefore, by changing bias the wavelength of the emitted light can be altered.

Figure 54:
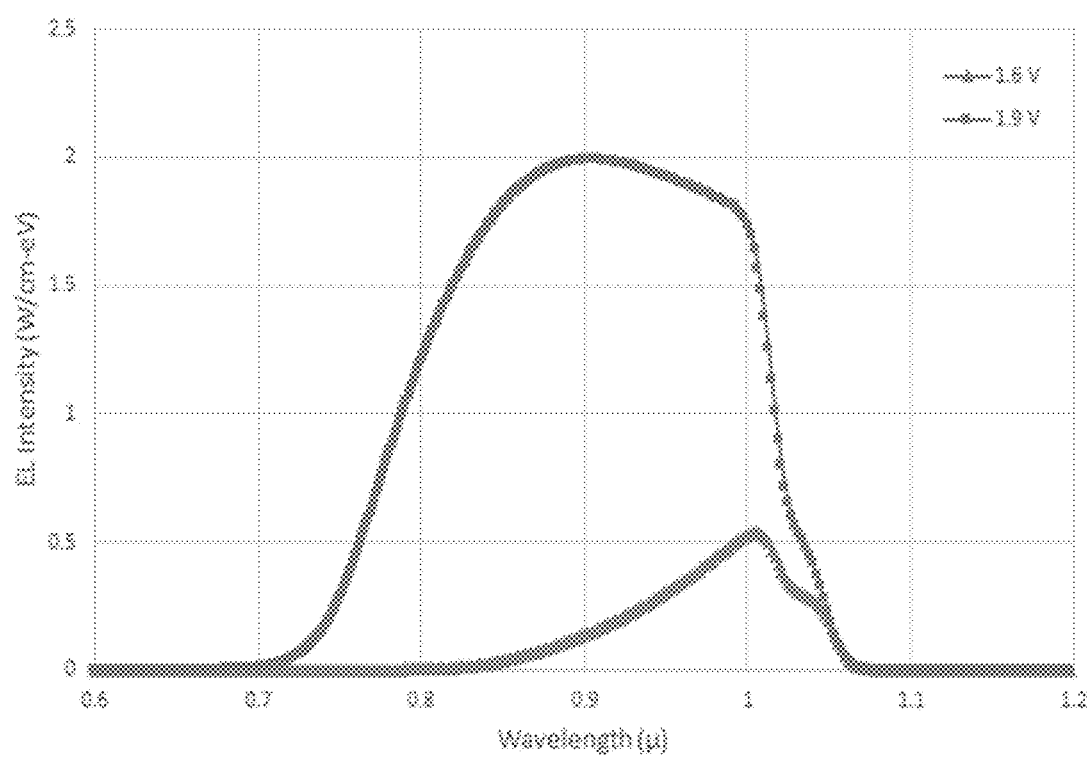
FIG. 54 depicts an emission spectrum of single QW InGaAs/GaAsP LED (23% In, 45% P in p-side barrier and 60% P in n-side barrier) at 1.6 V and 1.9 V. The peak emission wavelength at 1.6 V is 1000 nm and at 1.9 V is 903 nm.
Figure 55:
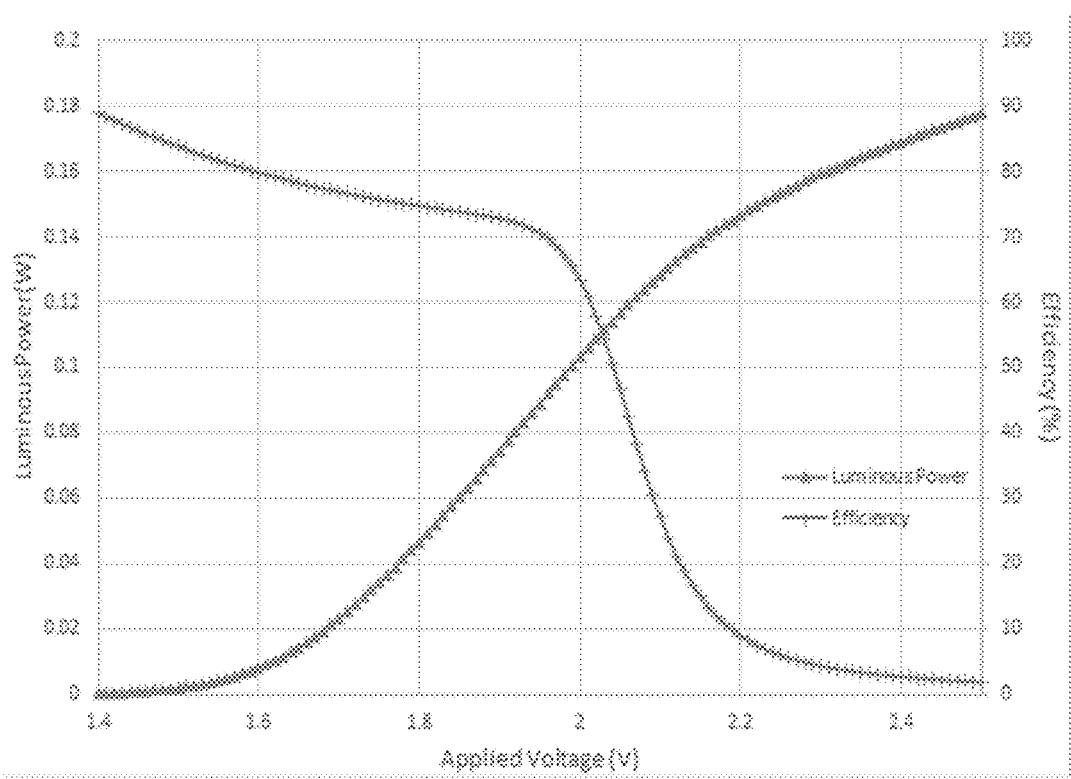
FIG. 55 depicts a luminous power and efficiency of 5×1000 µ2 single QW InGaAs/GaAsP LED (23% In, 45% P in p-side barrier and 60% P in n-side barrier). The output luminous power is 40 mW @ 1.6 V and 373 mW @1.9 V. The efficiency of the device is 79.8% @ 1.6 V and 72.8% @ 1.9 V.
Figure 56:
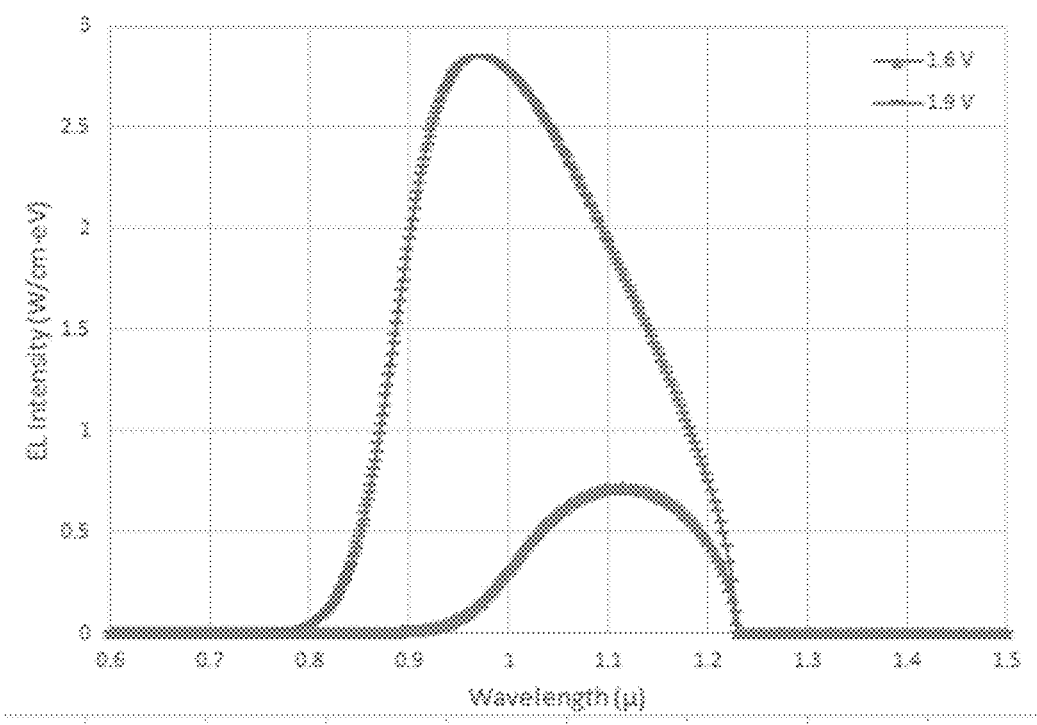
FIG. 56 depicts an emission spectrum of single QW InGaAs/GaAsP LED (30% In, 60% P in p-side barrier and n-side barrier) at 1.6 V and 1.9 V. The peak emission wavelength at 1.6 V is 1112 nm and at 1.9 V is 968 nm.
Figure 57:
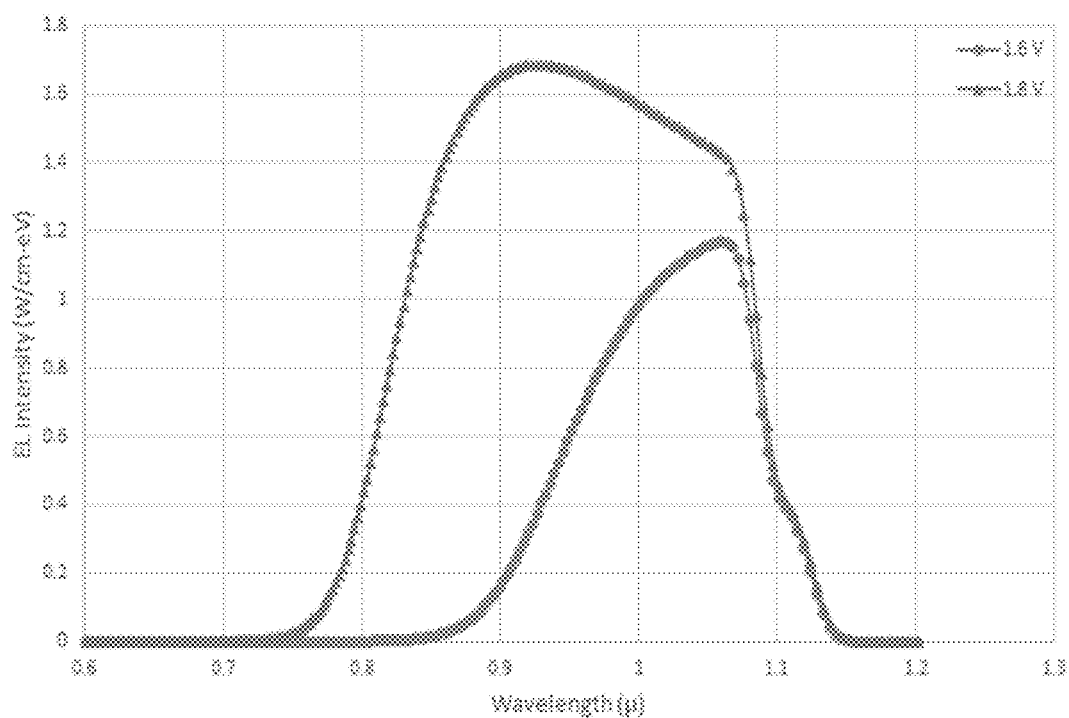
FIG. 57 depicts a mission spectrum of single QW InGaAs/GaAsP LED (30% In, 45% P in the barriers) at 1.6 V and 1.8 V. The peak emission wavelength at 1.6 V is 1070 nm and at 1.9 V is 917 nm.
Figure 58:
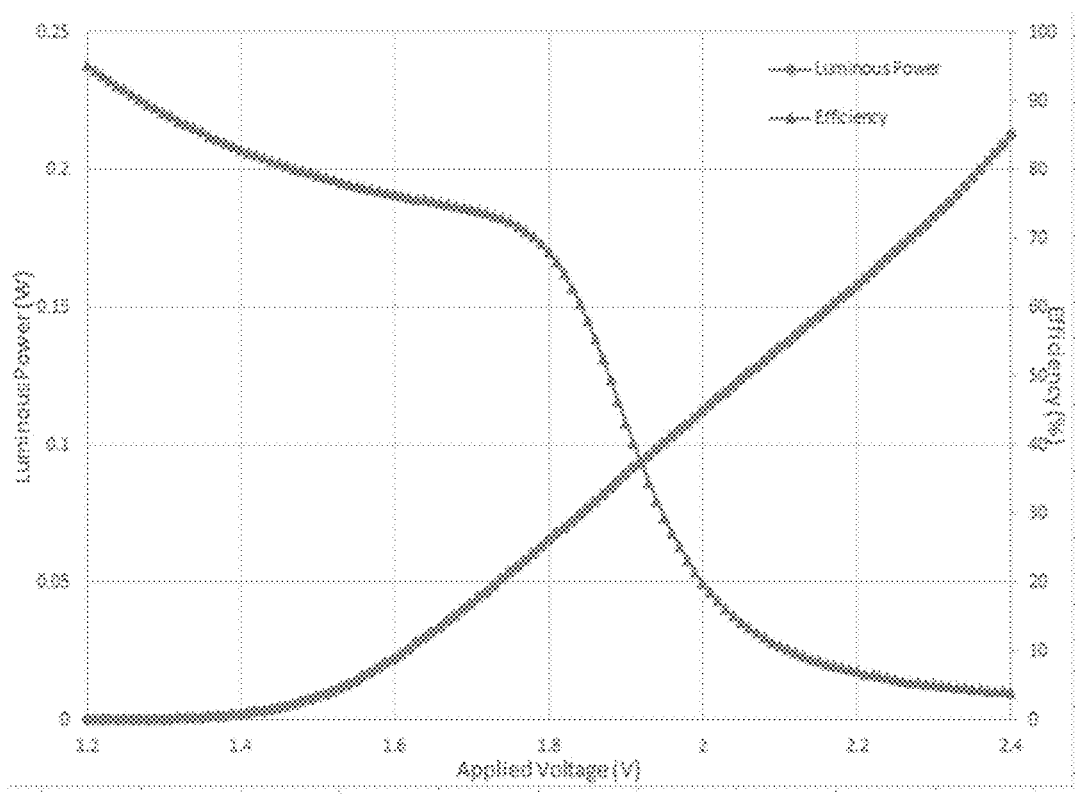
FIG. 58 depicts a luminous power and efficiency of 1×1000 µ2 single QW InGaAs/GaAsP LED (30% In in the QW, 45% P in the barriers). The output luminous power is 22 mW @ 1.6 V and 65 mW @ 1.8 V. The efficiency of the device is 76.5% @ 1.6 V and 68.1% @ 1.8 V.
Figure 59:
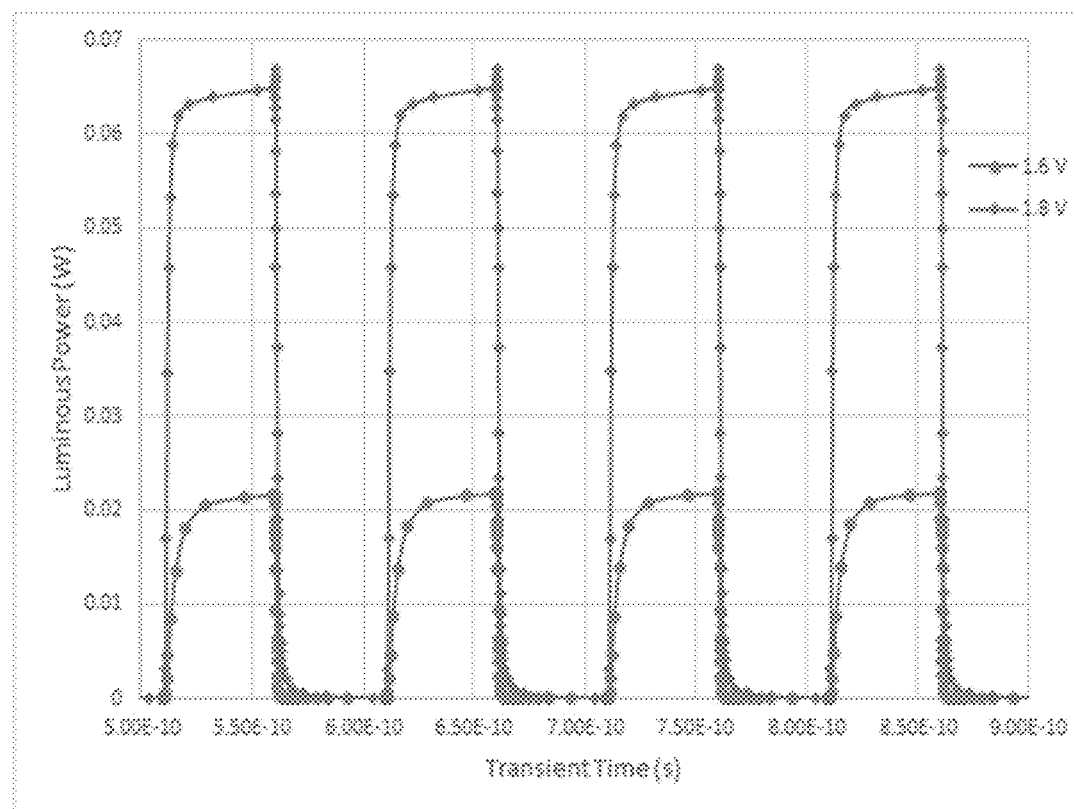
FIG. 59 depicts a 10 GHz transient response at 1.6 V and 1.8 V of single QW InGaAs/GaAsP LED with 30% Indium in the QW and 45% P in the barriers.

In the wavelength modulation scheme using single LED, the device must be always "ON". FIG. 54 illustrates a graph 5400 of the emission spectra at 1.6 V and 1.9 V of single QW InGaAs/GaAs LED. The percentage composition of Indium (In) in the QW of the LED is 23% and the percentage composition of phosphorous (P) in the p-side and n-side barriers are 45% and 60% respectively. As shown in FIG. 54, a 97 nm shift in the wavelength is observed for the InGaAs/GaAs LED when the applied bias is changed from 1.6 V to 1.9 V. The output luminous power and efficiency of the LED is shown in graph 5500 of FIG. 55. The design parameters of the LED are given in TABLE 20. The separation between the peak emission spectra wavelengths at two different biases can be increased by increasing the depth of the QW. By increasing the percentage composition of Indium in the QW and the percentage composition of phosphorous in the barriers, the depth of the QW is increased. The design parameters of single QW LED with 30% In in the well and 60% P in the barriers are given in TABLE 21. The emission spectra at 1.6 V and 1.9 V of single QW InGaAs/GaAsP LED with 30% In and 60% P is shown in graph 5600 of FIG. 56. A 144 nm shift in the wavelength is observed when the applied bias is changed from 1.6 V to 1.9 V. The design parameters of single QW LED with 30% Indium in the well and 45% P in the barriers is given in TABLE 22. The emission spectra at 1.6 V and 1.9 V of the LED is shown in graph 5700 of FIG. 57. A 153 nm shift in the wavelength is observed when the applied bias is changed from 1.6 V to 1.8 V. The output luminous power and efficiency of the LED is shown in graph 5800 of FIG. 58. The 10 GHz transient response of the LED at 1.6 V and 1.8 V is shown in graph 5900 of FIG. 59.

Design parameters of single QW InGaAs/GaAs LED with 23% In, 45% P in p-side barrier and 60% P in n-side barrier are shown in TABLE 20,

TABLE 20

| Layer | Material | Percentage Composition | Thickness (Å) | Doping Type | Doping Concentration (cm$^{-3}$) |
|---|---|---|---|---|---|
| p+ contact layer | GaAs | — | 1000 | p.type | $4 \times 10^{19}$ |
| p layer | GaAs | — | 1000 | p.type | $2 \times 10^{19}$ |
| Barrier | GaAsP | 45% P | 35 | — | — |
| QW | InGaAs | 23% In | 70 | — | — |
| Barrier | GaAsP | 60% P | 30 | — | — |
| n layer | GaAsP | 60% P | 35 | n.type | $3 \times 10^{19}$ |
| n layer | InGaP | 48.5% In | 35 | n.type | $3 \times 10^{19}$ |

TABLE 20-continued

| Layer | Material | Percentage Composition | Thickness (Å) | Doping Type | Doping Concentration (cm$^{-3}$) |
|---|---|---|---|---|---|
| n layer | GaAsP | 60% P | 35 | n.type | $3 \times 10^{19}$ |
| n layer | InGaP | 48.5% In | 35 | n.type | $3 \times 10^{19}$ |
| n layer | GaAsP | 60% P | 35 | n.type | $3 \times 10^{19}$ |
| n layer | InGaP | 48.5% In | 35 | n.type | $3 \times 10^{19}$ |
| n+ contact layer | GaAs | — | 10000 | n.type | $3 \times 10^{19}$ |

Design parameters of single QW InGaAs/GaAs LED with 30% In in the well, 60% P in p-side barrier and n-side barrier are shown in TABLE 21.

TABLE 21

| Layer | Material | Percentage Composition | Thickness (Å) | Doping Type | Doping Concentration (cm$^{-3}$) |
|---|---|---|---|---|---|
| p+ contact layer | GaAs | — | 1000 | p.type | $4 \times 10^{19}$ |
| p layer | GaAs | — | 1000 | p.type | $2 \times 10^{19}$ |
| Barrier | GaAsP | 60% P | 35 | — | — |
| QW | InGaAs | 30% In | 70 | — | — |
| Barrier | GaAsP | 60% P | 30 | — | — |
| n layer | GaAsP | 60% P | 35 | n.type | $3 \times 10^{19}$ |
| n layer | InGaP | 48.5% In | 35 | n.type | $3 \times 10^{19}$ |
| n layer | GaAsP | 60% P | 35 | n.type | $3 \times 10^{19}$ |
| n layer | InGaP | 48.5% In | 35 | n.type | $3 \times 10^{19}$ |
| n layer | GaAsP | 60% P | 35 | n.type | $3 \times 10^{19}$ |
| n layer | InGaP | 48.5% In | 35 | n.type | $3 \times 10^{19}$ |
| n+ contact layer | GaAs | — | 10000 | n.type | $3 \times 10^{19}$ |

Design parameters of single QW InGaAs/GaAs LED with 30% In in the well, 45% P in the barriers are shown in TABLE 22.

TABLE 22

| Layer | Material | Percentage Composition | Thickness (Å) | Doping Type | Doping Concentration (cm$^{-3}$) |
|---|---|---|---|---|---|
| p+ contact layer | GaAs | — | 1000 | p.type | $4 \times 10^{19}$ |
| p layer | GaAs | — | 1000 | p.type | $2 \times 10^{19}$ |
| Barrier | GaAsP | 45% P | 35 | — | — |
| QW | InGaAs | 30% In | 70 | — | — |
| Barrier | GaAsP | 45% P | 30 | — | — |
| n layer | GaAsP | 45% P | 30 | n.type | $5 \times 10^{18}$ |
| n layer | InGaP | 48.5% In | 1000 | n.type | $5 \times 10^{18}$ |
| n+ contact layer | GaAs | — | 10000 | n.type | $5 \times 10^{18}$ |

Wavelength Division Multiplexing Using Ultra-High Speed LEDs and Photodetectors

Figure 60:
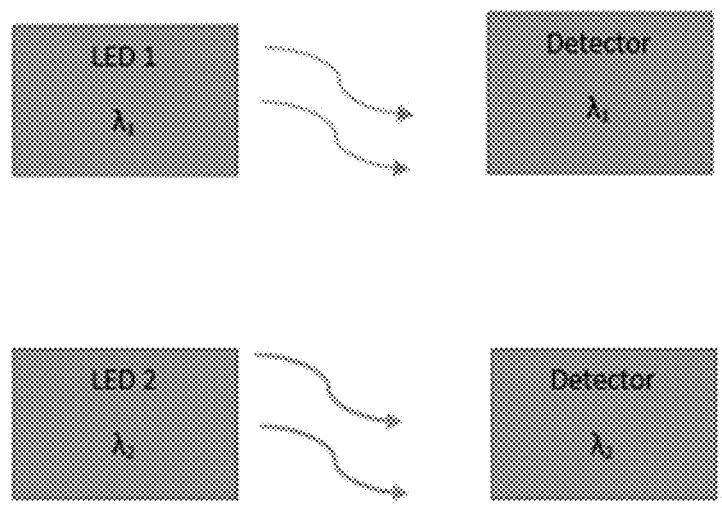
FIG. 60 depicts a wavelength division multiplexing (WDM) system using two LEDs and two photodetectors.

By using two LEDs operating at two different wavelengths, multiple wavelength communication or wavelength division multiplexing (WDM) technique is achieved. In this technique, the LEDs are switched ON and OFF as in on-off keying scheme. As shown in block diagram 6000 of FIG. 60, LED 1 and LED2 emit light at different wavelengths '$\lambda_1$' & '$\lambda_2$' respectively. The detector 1 is designed to pick the signal from LED 1 of wavelength $\lambda_1$ and the detector 2 is designed to detect the emitted light of LED2 of wavelength $\lambda_2$.

Single QW InGaAs/GaAsP LED1 and LED2 have different percentage of Indium in the QW and they emit light of different wavelengths. The InGaAs/GaAsP detectors are designed so that for the detector 1 the cutoff wavelength is greater than (or equal to) $\lambda_1$ and for the detector 2 the cutoff wavelength is greater than (or equal to) $\lambda_2$. Different material system can also be implemented for the LEDs and detectors. For example, InGaAs/GaAsP material system can be implemented for LED1 and detector 1 which will emit light and absorb in the infrared region of the spectrum respectively and InGaN/AlGaN material system can be used for LED2 and detector 2 which will emit and absorb light in the violet/blue region respectively. Due to the large separation of emitted wavelengths from the two LEDs, the detection of the signals will be more efficient.

Full Duplex Ultra-High Speed Telecommunication Using LEDs and Photodetectors

Figure 61:
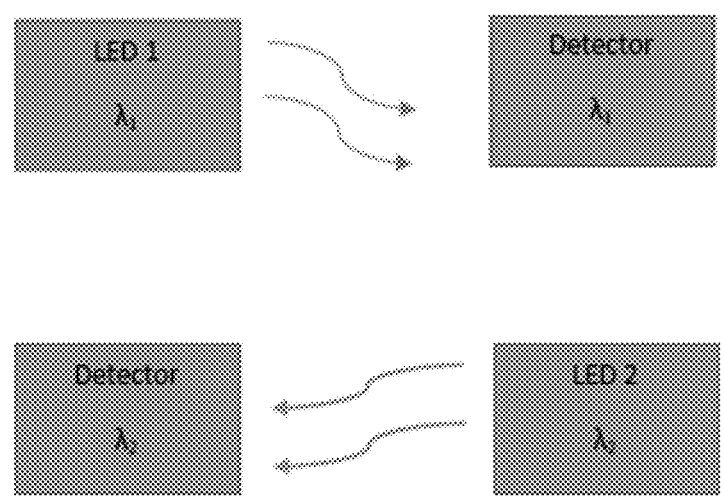
FIG. 61 depicts a full duplex (bi-directional) communication system using two LEDs and two photodetectors.

A full-duplex communication system where two connected devices that can communicate simultaneously can be designed by using two LEDs and two detectors emitting and absorbing light at different wavelengths. The bi-directional communication set-up using two LEDs and two detectors is shown in block diagram 6100 of FIG. 61.

Figure 62:
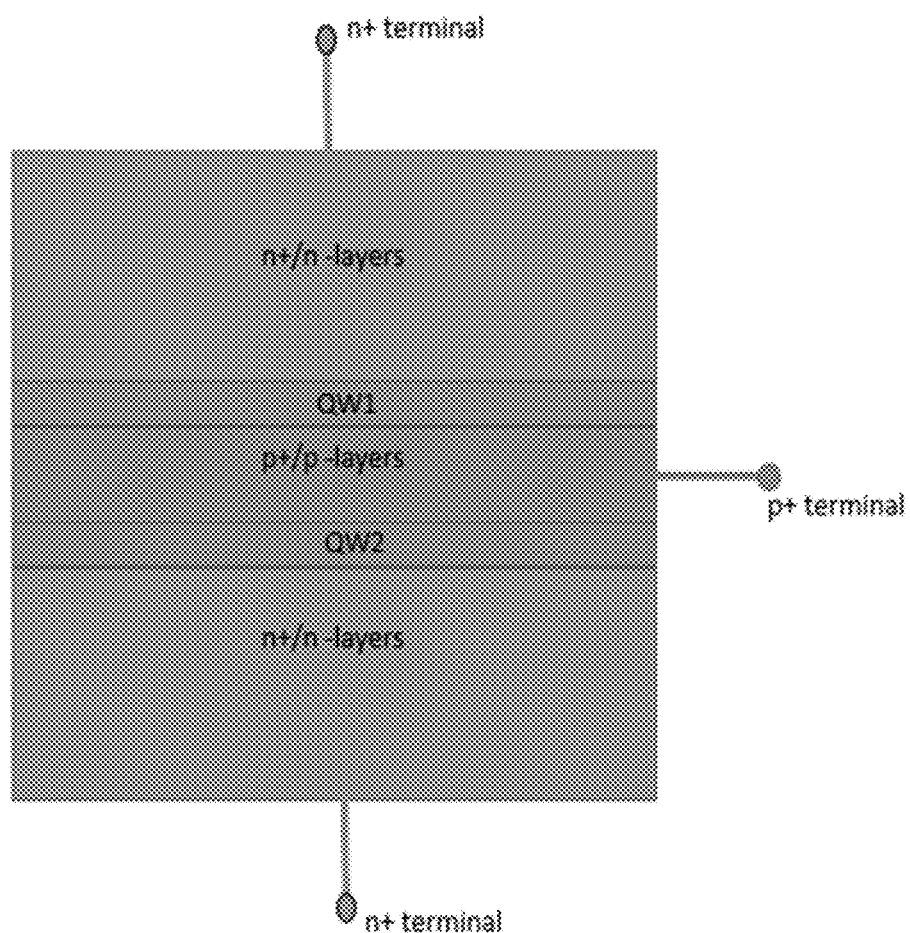
FIG. 62 depicts two LEDs emitting light at different frequencies integrated into one device. P+/P layers are common to both the LEDs. QW1 and QW2 denote the active regions of the device.
Figure 63:
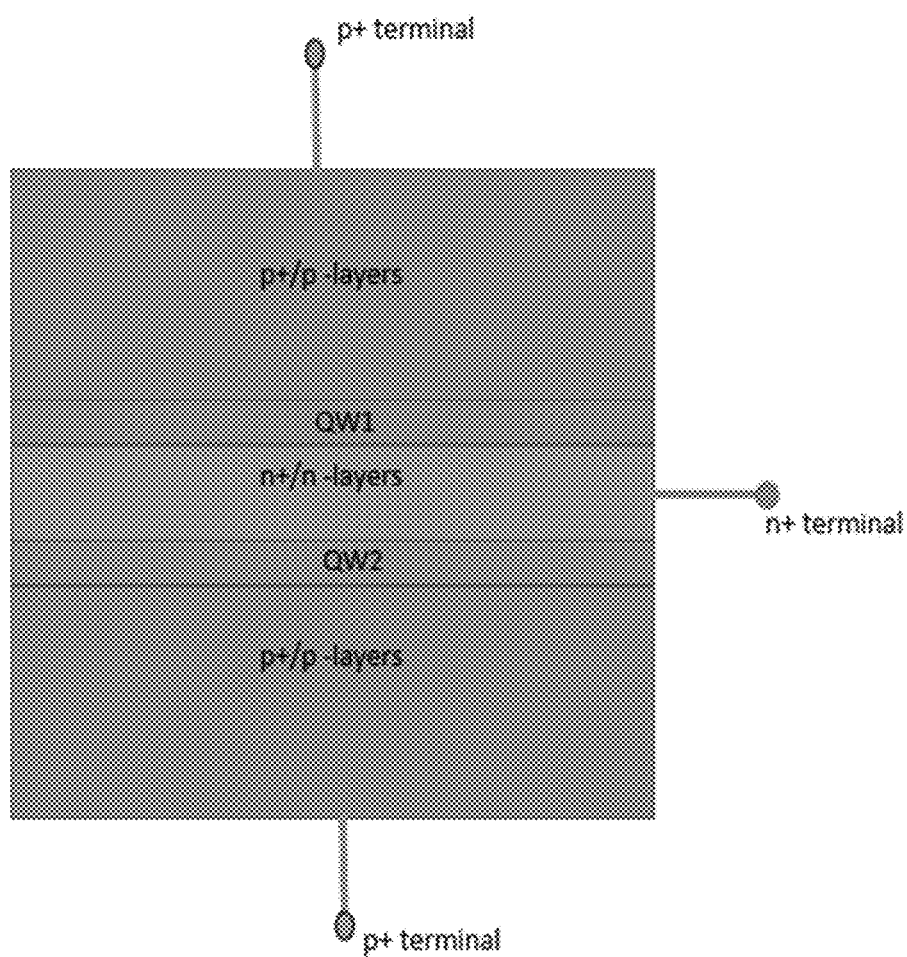
FIG. 63 depicts two LEDs emitting light at different frequencies integrated into one device. n+/n layers are common to both the LEDs. QW1 and QW2 denote the active regions of the device.

The wavelength modulation technique can be also implemented using two LEDs emitting light at different wavelengths integrated into one three-terminal device. The n+/n layers are at the top and bottom in the structure and are connected to the n+ electrodes and the p+/p layers are common to both the LEDs in one design as shown in epitaxial stack 6200 FIG. 62. In another design, the p+/p-layers are at the top and bottom in the structure and are connected to the n+ electrodes and the n+/n layers are common to both the LEDs as shown in epitaxial stack 6300 of FIG. 63. QW1 emits light of wavelength '$\lambda_1$' and QW2 emits light of wavelength '$\lambda_2$'. The p-layer is common to both the LEDs which is connected to the p+ electrode (third terminal).

Figure 64:
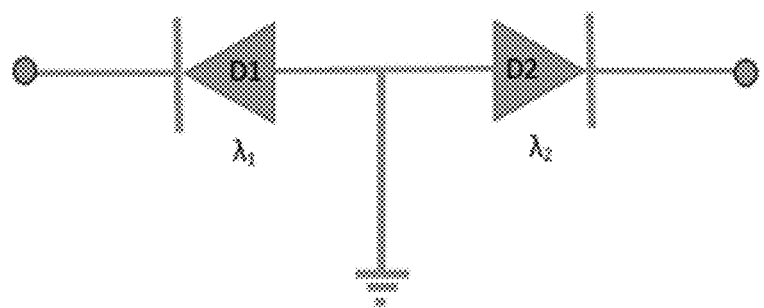
FIG. 64 depicts a photodetectors design scheme to detect signals of two different wavelengths—'λ1' & 'λ2'.
Figure 65:
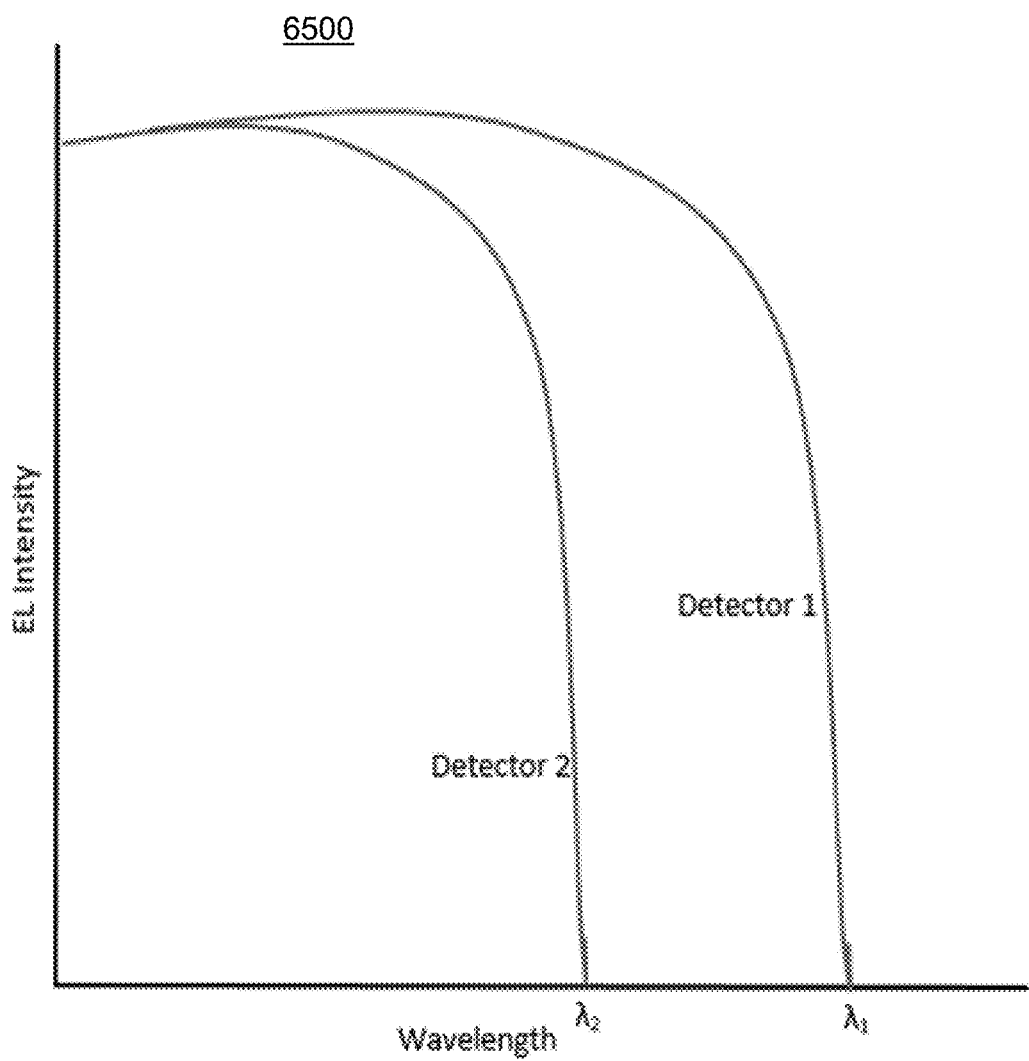
FIG. 65 depicts an absorption spectra of the photodetectors D1 and D2. Cutoff wavelengths of detector 1 and detector 2 are 'λ1' & 'λ2' respectively.

Ultra-High Speed Photodetector Design to Detect Signals of Different Wavelengths The photodetector design to detect signal of two different wavelengths is shown in schematic 6400 of FIG. 64. The cutoff wavelength of detector 1 is $\lambda_1$ and that of detector 2 is $\lambda_2$ ($<\lambda_1$) as shown in graph 6500 of FIG. 65. In the wavelength modulation scheme using single LED, at low biases the peak emission wavelength of the emitted signal is $\lambda_1$ and at higher biases the peak emission wavelength $\lambda_2$ (shorter than $\lambda_1$) which will also encompass wavelength $\lambda_2$. At lower bias detector D1 will pick up the signal of wavelength $\lambda_1$ and at higher bias both the detectors D1 and D2 will detect the signal of wavelengths—$\lambda_1$ & $\lambda_2$. In the wavelength modulation scheme using two LEDs integrated in one device, when LED1 is turned ON detector 1 will pick up the signal of wavelength $\lambda_1$ and when LED2 is turned ON detector 2 will pick up the signal of wavelength $\lambda_2$.

The dual-wavelength LED and detector designs can be extended to multiple wavelengths $\lambda_1, \lambda_2, \ldots, \lambda_N$. In this approach, the LED and corresponding detectors of FIG. 62 and FIG. 63. will have multiple quantum wells $QW_1$, $QW_2, \ldots, QW_N$ each tuned to the individual wavelengths $\lambda_1, \lambda_2, \ldots, \lambda_N$.

Figure 66:
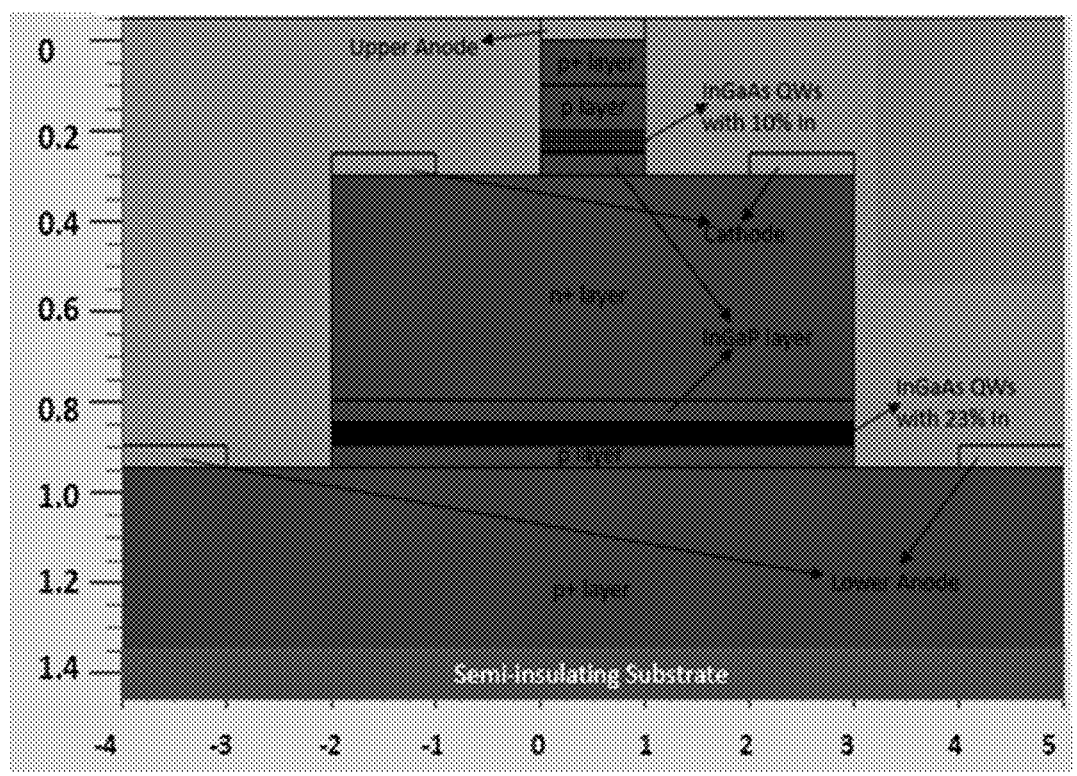
FIG. 66 depicts three terminal photodetector with two sets of InGaAs QWs of different Indium composition.

The TCAD simulated structure of two wavelength InGaAs/GaAsP photodetector is shown in epitaxial stack diagram 6600 of FIG. 66. The photodetector is a three terminal device. Two devices with two sets of InGaAs QWs of different Indium composition are stacked on top of each other. The n+ contact is shared by the two devices. The photodetector with InGaAs QWs of lower Indium percentage is stacked on top of the photodetector with InGaAs QWs of higher Indium composition. This allows the (higher wavelength) light to be detected by the lower QWs to pass through the upper QW layers. The p+ contact layer of the photodetector with InGaAs QWs of lower Indium composition is at the top of the structure, the InGaAs QWs are stacked below the p layers, the InGaAs QWs with higher Indium composition are stacked below the n+ contact layer which is shared by the two devices. The p+ contact layer for the photodetector with InGaAs QWs of higher Indium composition is at the bottom of the device as shown in the FIG. 66. Light is incident at the top device surface. The light of higher wavelength will pass through the upper QWs and will generate photo-carriers in the lower QWs, and current will be detected at the bottom (anode) electrode. Both the upper and lower QWs will generate carriers when light of lower wavelength is shone on the device, and current will be detected at both the upper and lower (anode) electrodes.

Figure 67:
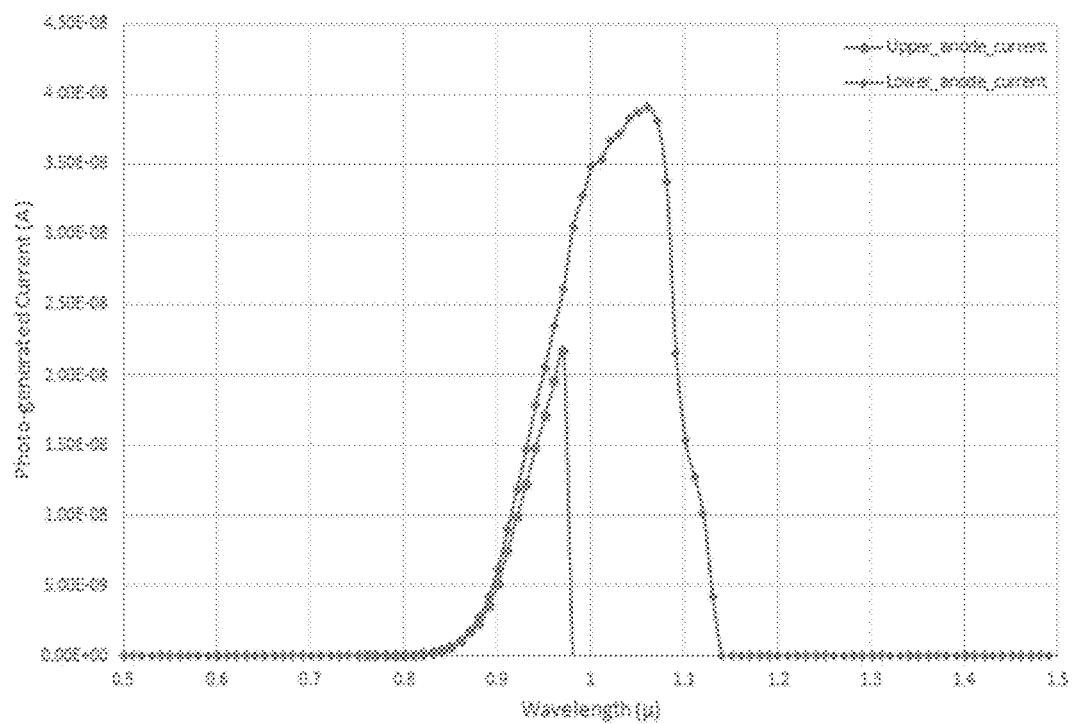
FIG. 67 depicts an absorption spectrum of the three terminal photodetector for incident light with peak emission wavelength of 1070 nm. Maximum absorption occurs in the lower QWs with 23% Indium composition.
Figure 68:
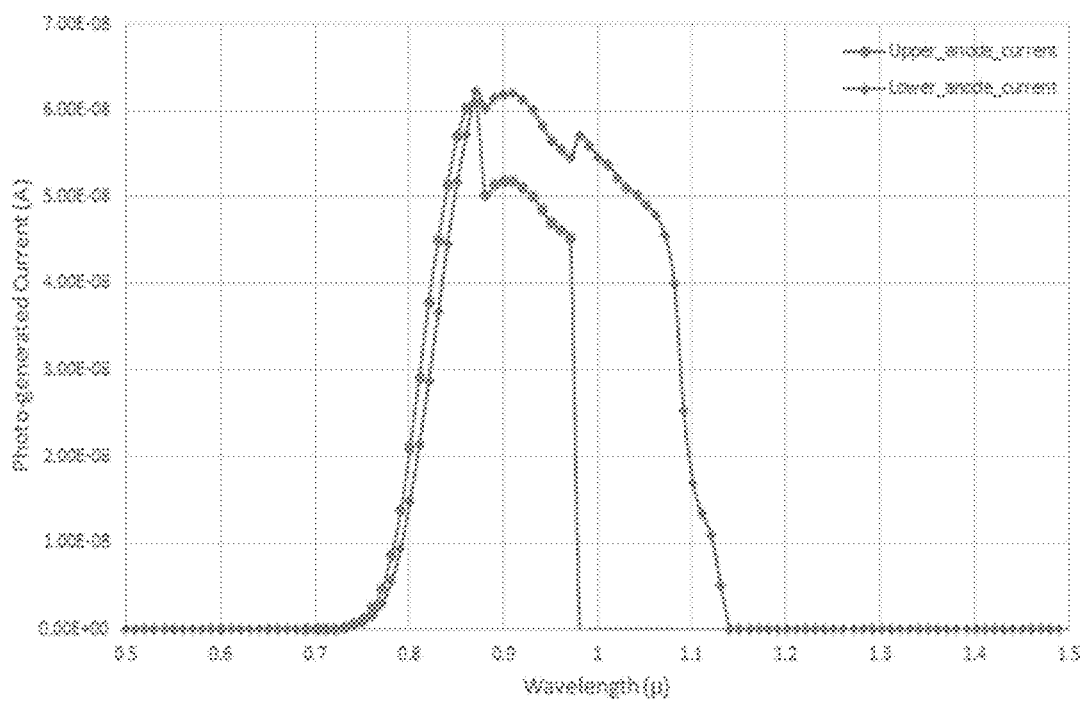
FIG. 68 depicts an absorption spectrum of the three terminal photodetector for incident light with peak emission wavelength of 917 nm. Light absorption occurs in both the upper (10% Indium) and lower (23% Indium) QWs.
Figure 69:
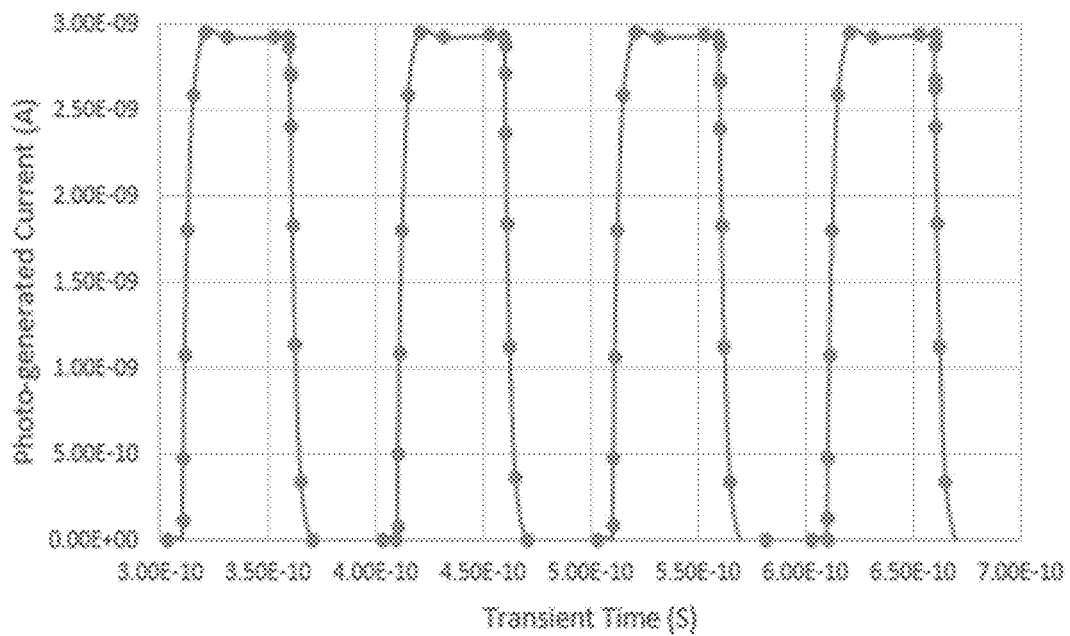
FIG. 69 depicts a transient response of the three terminal photodetector for incident light with peak emission wavelength of 1070 nm.

Graph 6700 of FIG. 67 illustrates the absorption spectrum of the photodetector when the light with the emission spectrum at 1.6 V of the single QW InGaAs/GaAsP LED with 30% Indium and 45% P is incident on the photodetector. At 1.6 V, the peak emission wavelength is 1070 nm Minimum absorption will take place in the upper QW layers with 10% Indium composition and most of the light (spectrum at 1.6 V) will be absorbed to generate photo current in the lower QWs with 23% Indium composition as indicated in graph 5800 of FIG. 58. The peak emission wavelength at 1.8 V of the single QW InGaAs/GaAsP LED with 30% Indium and 45% P is 917 nm. The spectrum of light at 1.8 V will be absorbed by both the upper and lower QWs and photo current will be detected in both the upper and lower (anode) electrodes as shown in graph 6900 of FIG. 69. The transient response of the photodetector for incident light with peak emission wavelength of 1070 nm is also shown in FIG. 69.

In certain embodiments, the previously disclosed epitaxial structures may have stated material compositions having a variance of +/−10% and stated dimensions having a variance of +/−10%. In other embodiments, the previously disclosed structures may have stated material compositions having a variance of +/−5% and stated dimensions having a variance of +/−5%

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." As used herein, the terms "connected," "coupled," or any variant thereof, means any connection or coupling, either direct or indirect, between two or more elements; the coupling of connection between the elements can be physical, logical, or a combination thereof. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or," in reference to a list of two or more items, covers all of the following interpretations of the word: any of the items in the list, all of the items in the list, and any combination of the items in the list.

The above detailed description of embodiments of the disclosure is not intended to be exhaustive or to limit the teachings to the precise form disclosed above. While specific embodiments of, and examples for, the disclosure are described above for illustrative purposes, various equivalent modifications are possible within the scope of the disclosure, as those skilled in the relevant art will recognize. For example, while processes or blocks are presented in a given order, alternative embodiments may perform routines having steps, or employ systems having blocks, in a different order, and some processes or blocks may be deleted, moved, added, subdivided, combined, and/or modified to provide alternative or sub-combinations. Each of these processes or blocks may be implemented in a variety of different ways. Also, while processes or blocks are at times shown as being performed in series, these processes or blocks may instead be performed in parallel, or may be performed at different times. Further any specific numbers noted herein are only examples: alternative implementations may employ differing values or ranges.

The teachings of the disclosure provided herein can be applied to other systems, not necessarily the system described above. The elements and acts of the various embodiments described above can be combined to provide further embodiments.

Any patents and applications and other references noted above, including any that may be listed in accompanying filing papers, are incorporated herein by reference. Aspects of the disclosure can be modified, if necessary, to employ the systems, functions, and concepts of the various references described above to provide yet further embodiments of the disclosure.

These and other changes can be made to the disclosure in light of the above Detailed Description. While the above description describes certain embodiments of the disclosure, and describes the best mode contemplated, no matter how detailed the above appears in text, the teachings can be practiced in many ways. Details of the system may vary considerably in its implementation details, while still being encompassed by the subject matter disclosed herein. As noted above, particular terminology used when describing certain features or aspects of the disclosure should not be taken to imply that the terminology is being redefined herein to be restricted to any specific characteristics, features, or aspects of the disclosure with which that terminology is associated. In general, the terms used in the following claims should not be construed to limit the disclosure to the specific embodiments disclosed in the specification, unless the above Detailed Description section explicitly defines such terms. Accordingly, the actual scope of the disclosure encompasses not only the disclosed embodiments, but also all equivalent ways of practicing or implementing the disclosure under the claims.

The invention claimed is:

1. A free space optical (FSO) communication apparatus, comprising:
    a digital data port;
    an array of light-emitting diodes (LEDs) each configured to have a transient response time of less than 500 picoseconds (ps); and
    current drive circuitry coupled between the digital data port and the array of LEDs wherein each LED comprises:
        a substrate; and
        a carrier confinement (CC) region positioned over the substrate, the CC region defining:
            a first CC layer comprising at least one of indium gallium phosphide, aluminum gallium arsenide, aluminum gallium nitride, or aluminum gallium antimonide; and
            a second CC layer positioned over the first CC layer, the second CC layer comprising at least one of gallium arsenide phosphide, aluminum gallium arsenide, aluminum gallium nitride, or aluminum gallium antimonide.

2. The FSO communication apparatus of claim 1, wherein the digital data port comprises an audio/video interface.

3. The FSO communication apparatus of claim 1, wherein the digital data port comprises an uncompressed audio/video interface.

4. The FSO communication apparatus of claim 3, wherein the digital data port is at least one of a High-Definition Multimedia Interface (HDMI) port, a DisplayPort interface port, and a Digital Visual Interface (DVI) port.

5. The FSO communication apparatus of claim 1, wherein the digital data port is at least one of a Universal Serial Bus (USB) port, Serial ATA (SATA) interface port, and an Ethernet port.

6. The FSO communication apparatus of claim 1, wherein the digital data port is an optical data port.

7. The FSO communication apparatus of claim 1, wherein the digital data port is at least one of a gigabit interface converter (GB IC) interfact port, a small form-factor pluggable (SFP) interface port and a 10 Gigabit Small Form Factor Pluggable (XFP) interface port.

8. The FSO communication apparatus of claim 1, further comprising a Wilkinson power divider coupled between the digital data port and the array of LEDs.

9. The FSO communication apparatus of claim 1, further comprising a plurality of electrical line segments which together with the array of LEDs form a traveling wave optical transmitter.

10. The FSO communication apparatus of claim 1, further comprising
    an array of optical detectors, wherein each optical detector is configured to have a bandwidth of a least 10 gigahertz (GHz); and
    transimpedance amplifier circuitry coupled between the digital data port and the array of optical detectors.

11. The FSO communication apparatus of claim 10, further comprising a Wilkinson power combiner coupled between the digital data port and the array of optical detectors.

12. The FSO communication apparatus of claim 10, further comprising a plurality of electrical line segments which together with the array of optical detectors form a traveling wave optical receiver.

13. The FSO communication apparatus of claim 10, wherein the FSO communication apparatus is implemented in at least one of a smart watch, a smart phone, a tablet, a laptop, a digital camera, a digital camcorder, a computer monitor, a TV, a projector, and a wireless access point.

14. The FSO communication apparatus of claim 10, wherein:
    a first LED within the array of LEDs is configured to transmit at a first wavelength;
    a second LED within the array of LEDs is configured to transmit at a second wavelength;
    a first optical detector within the array of optical detectors is configured to receive at the first wavelength; and
    a second optical detector within the array of optical detectors is configured to receive at the second wavelength.

15. The FSO communication apparatus of claim 10, wherein the FSO communication apparatus is implemented within at least one of an Unmanned Air System (UAS) and an automotive system.

16. The FSO communication apparatus of claim 10, wherein the FSO communication apparatus is implemented within a high definition video interface.

17. The FSO communication apparatus of claim 10, wherein the FSO communication apparatus is implemented within a high speed computer interface.

18. The FSO communication apparatus of claim 1, wherein the FSO communication apparatus is implemented in at least one of a smart watch, a smart phone, a tablet, a laptop, a digital camera, a digital camcorder, a computer monitor, a TV, a projector, and a wireless access point.

19. The FSO communication apparatus of claim 1, wherein at least one LED within the array of LEDs is implemented in a flip-chip package.

20. The FSO communication apparatus of claim 1, wherein a first LED within the array of LEDs is configured to transmit at a first wavelength and a second LED within the array of LEDs is configured to transmit at a second wavelength.

21. The FSO communication apparatus of claim 1, wherein a first LED within the array of LEDs is configured for wavelength modulation.

22. The FSO communication apparatus of claim 1, wherein the FSO communication apparatus is implemented within at least one of an Unmanned Air System (UAS) and an automotive system.

23. The FSO communication apparatus of claim 1, wherein the FSO communication apparatus is implemented within a high definition video interface.

24. The FSO communication apparatus of claim 1, wherein the FSO communication apparatus is implemented within a high speed computer interface.

* * * * *